United States Patent
Rogers et al.

(10) Patent No.: US 7,195,733 B2
(45) Date of Patent: Mar. 27, 2007

(54) COMPOSITE PATTERNING DEVICES FOR SOFT LITHOGRAPHY

(75) Inventors: John A. Rogers, Champaign, IL (US); Etienne Menard, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 192 days.

(21) Appl. No.: 11/115,954

(22) Filed: Apr. 27, 2005

(65) Prior Publication Data

US 2005/0238967 A1   Oct. 27, 2005

Related U.S. Application Data

(60) Provisional application No. 60/565,604, filed on Apr. 27, 2004.

(51) Int. Cl.
B29C 67/00 (2006.01)
B29C 35/08 (2006.01)

(52) U.S. Cl. .................... 264/496; 430/322
(58) Field of Classification Search ............ 264/496; 430/322
See application file for complete search history.

(56) References Cited

U.S. PATENT DOCUMENTS

| | | | |
|---|---|---|---|
| 5,545,291 A | 8/1996 | Smith et al. | |
| 5,772,905 A | 6/1998 | Chou | |
| 5,783,856 A | 7/1998 | Smith et al. | |
| 5,817,242 A | 10/1998 | Biebuyck et al. | |
| 5,824,186 A | 10/1998 | Smith et al. | |
| 5,904,545 A | 5/1999 | Smith et al. | |
| 6,225,149 B1 | 5/2001 | Gan et al. | |
| 6,274,508 B1 | 8/2001 | Jacobsen et al. | |
| 6,281,038 B1 | 8/2001 | Jacobsen et al. | |
| 6,291,896 B1 | 9/2001 | Smith | |
| 6,316,278 B1 | 11/2001 | Jacobsen et al. | |
| 6,334,960 B1 * | 1/2002 | Willson et al. ............ 216/52 |

(Continued)

FOREIGN PATENT DOCUMENTS

JP   2002092984   3/2002

(Continued)

OTHER PUBLICATIONS

Chang et al. (1994) "Process Techniques," "Lithography," and "Device-Related Physics and Principles,"In; *GaAs High-Speed Devices: Physics, Technology and Circuit Application*, John Wiley and Sons, New York, pp. 115-278.

(Continued)

*Primary Examiner*—Evan Pert
(74) *Attorney, Agent, or Firm*—Greenlee, Winner and Sullivan, P.C.

(57) ABSTRACT

The present invention provides methods, devices and device components for fabricating patterns on substrate surfaces, particularly patterns comprising structures having microsized and/or nanosized features of selected lengths in one, two or three dimensions. The present invention provides composite patterning devices comprising a plurality of polymer layers each having selected mechanical properties, such as Young's Modulus and flexural rigidity, selected physical dimensions, such as thickness, surface area and relief pattern dimensions, and selected thermal properties, such as coefficients of thermal expansion, to provide high resolution patterning on a variety of substrate surfaces and surface morphologies.

84 Claims, 25 Drawing Sheets

U.S. PATENT DOCUMENTS

| | | |
|---|---|---|
| 6,380,729 B1 | 4/2002 | Smith |
| 6,417,025 B1 | 7/2002 | Gengel |
| 6,420,266 B1 | 7/2002 | Smith et al. |
| 6,468,638 B2 | 10/2002 | Jacobsen et al. |
| 6,479,395 B1 | 11/2002 | Smith et al. |
| 6,527,964 B1 | 3/2003 | Smith et al. |
| 6,555,408 B1 | 4/2003 | Jacobsen et al. |
| 6,566,744 B2 | 5/2003 | Gengel |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,623,579 B1 | 9/2003 | Smith et al. |
| 6,655,286 B2 | 12/2003 | Rogers |
| 6,657,289 B1 | 12/2003 | Craig et al. |
| 6,665,044 B1 | 12/2003 | Jacobsen et al. |
| 6,683,663 B1 | 1/2004 | Hadley et al. |
| 6,693,384 B1 | 2/2004 | Vicentini et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,780,696 B1 | 8/2004 | Schatz |
| 6,814,898 B1 * | 11/2004 | Deeman et al. ............ 264/1.33 |
| 6,816,380 B2 | 11/2004 | Credelle et al. |
| 6,844,673 B1 | 1/2005 | Bernkopf |
| 6,850,312 B2 | 2/2005 | Jacobsen et al. |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,949,199 B1 * | 9/2005 | Gauzner et al. ............ 216/2 |
| 6,949,206 B2 | 9/2005 | Whiteford |
| 2003/0006527 A1 | 1/2003 | Rabolt et al. |
| 2003/0178316 A1 | 9/2003 | Jacobs et al. |
| 2004/0005723 A1 | 1/2004 | Empedocles et al. |
| 2004/0026684 A1 | 2/2004 | Empedocles et al. |
| 2004/0095658 A1 | 5/2004 | Buretea et al. |
| 2004/0112964 A1 | 6/2004 | Empedocles et al. |
| 2004/0136866 A1 | 7/2004 | Pontis et al. |
| 2004/0146560 A1 | 7/2004 | Whiteford et al. |
| 2004/0178390 A1 | 9/2004 | Whiteford |
| 2004/0206448 A1 | 10/2004 | Dubrow |
| 2004/0250950 A1 | 12/2004 | Dubrow |
| 2005/0038498 A1 | 2/2005 | Dubrow et al. |

FOREIGN PATENT DOCUMENTS

| | | |
|---|---|---|
| WO | WO 00/046854 | 8/2000 |
| WO | WO 00/049421 | 8/2000 |
| WO | WO 00/049658 | 8/2000 |
| WO | WO 00/055915 | 9/2000 |
| WO | WO 00/055916 | 9/2000 |
| WO | WO 01/033621 | 5/2001 |
| WO | WO 02/027701 | 4/2002 |
| WO | WO 02/043032 | 5/2002 |
| WO | WO 02/097708 | 12/2002 |
| WO | WO 02/097724 | 12/2002 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 04/003535 | 1/2004 |
| WO | WO 04/022637 | 3/2004 |
| WO | WO 04/022714 | 3/2004 |
| WO | WO 04/023527 | 3/2004 |
| WO | WO 04/024407 | 3/2004 |
| WO | WO 04/027822 | 4/2004 |
| WO | WO 04/032190 | 4/2004 |
| WO | WO 04/032191 | 4/2004 |
| WO | WO 04/032193 | 4/2004 |
| WO | WO 04/034025 | 4/2004 |
| WO | WO 04/086289 | 10/2004 |
| WO | WO 04/094303 | 11/2004 |
| WO | WO 04/099068 | 11/2004 |
| WO | WO 04/100252 | 11/2004 |
| WO | WO 04/105465 | 12/2004 |
| WO | WO 05/005679 | 1/2005 |
| WO | WO 05/015480 | 2/2005 |
| WO | WO 05/017962 | 2/2005 |
| WO | WO 05/022120 | 3/2005 |

OTHER PUBLICATIONS

Givargizov, E.I. (1991) "Applications," In; *Oriented Crystallization on Amorphous Substrates*, Plenum Press, New York, pp. 341-363.

Adachi et al. (1983) "Chemical Etching Characteristics of (001)GaAs," *J. Electrochem. Soc.* 130:2427-2435.

Adachi et al (1982) "Chemical Etching of InGaAsP/InP DH Wafer," *J. Electrochem. Soc.* 129:1053-1062.

Alivisatos et al. (1996) "Semiconductor Clusters, Nanocrystals, and Quantum Dots," *Science* 271:933-937.

Alivisatos et al. (1998) "From Molecules to Materials: Current Trends and Future Directions," *Adv. Mater.* 10:1297-1336.

Ando et al. (2004) "Self-Aligned Self-Assembly Process for Fabricating Organic Thin-Film Transistors," *Appl. Phys. Lett.* 85:1849-1851.

Bao et al. (1999) "Printable Organic and Polymeric Semiconducting Materials and Devices," *J. Mater. Chem.* 9:1895-1904.

Battaglia et al. (2003) "Colloidal Two-Dimensional Systems: CdSe Quantum Shells and Wells," Angew. Chem. Int. Ed. 442:5035-5039.

Berg et al. (2003) "Tailored Micropatterns Through Weak Polyelectrolyte Stamping," Langmuir 19:2231-2237.

Bhunia et al. (2004) "Free-Standing and Vertically Aligned InP Nanowires Grown by Metalorganic Vapor Phase Epitaxy," *Physica E* 21:583-587.

Brushi et al. (2001) "Micromachined Silicon Suspended Wires With Submicrometric Dimensions," *Microelectron. Eng.* 57-58:959-965.

Burns et al. (2003) "Printing of Polymer Thin-Film Transistors for Active-Matrix-Display Applications," *J. Soc. Inf. Display* 11:599-604.

Carr et al. (1998) "Measurement of Nanomechanical Resonant Structures in Single-Crystal Silicon," *J. Vac. Sci. Technol. B* 16:3821-3824.

Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.

Childs et al. (2002) "Decal Transfer Microlithography: A New Soft-Lithographic Patterning Method," *J. Am. Chem. Soc.* 124:13583-13596.

Chung et al. (2000) "Silicon Nanowire Devices," *Appl. Phys. Lett.* 76(15):2068-2070.

Crowder et al. (1998) "Low-Temperature Single-Crystal Si TFTs Fabricated on Si Films Processed via Sequential Lateral Solidification," *IEEE Electron. Dev. Lett.* 19:306-308.

Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.

DeBoer et al. (2004) "Organic Single-Crystal Field-Effect Transistors," *Phys. Stat. Sol.* 201:1302-1331.

Delmerche et al. (1997) "Stability of Molded Polydimethylsiloxane Microstructures," *Adv. Mat.* 9:741-746.

Duan et al. (2003) "High-performance Thin-Film Transistors Using Semiconductor Nanowires and Nanoribbons," *Nature* 425:274-278.

Duan et al. (2000) "General Synthesis of Compound Semiconductor Nanowires," *Adv. Mater.* 12:298-302.

Gan et al. (2002) "Preparation of Thin-Film Transistors with Chemical Bath Deposited CdSe and CdS Thin Films," *IEEE Trans. Electron. Dev.* 49:15-18.

Garnier et al. (1994) "All-Polymer Field-Effect Transistor Realized by Printing Techniques," *Science* 265:1684-1686.

Gelinck et al. (2000) "High-Performance All-Polymer Integrated Circuits," *Appl. Phys. Lett.* 77:1487-1489.

Goldmann et al. (2004) "Hole Mobility in Organic Single Crystals Measured by a "Flip-Crystal" Field-Effect Technique," *J. Appl. Phys.* 96:2080-2086.

Goldman et al. (1996) "Correlation of Buffer Strain Relaxation Modes with Transport Properties of Two-Dimensional Electron Gases," *J. Apple. Phys.* 80:6849-6854.

Haisma et al. (2002) "Contact Bonding, Including Direct-Bonding in a Historical and Recent Context of Materials Science and Technology, Physics and Chemistry," *Mater. Sci Eng.* 37:1-60.

Hu et al. (1999) Chemistry and Physics in One Dimension: Synthesis and Properties of Nanowires and Nanotubes, *Acc. Chem. Res.* 32:435-445.

Hu et al. (1997) "Using Soft Lithography to Fabricate GaAs/AlGaAs Heterostructure Field Effect Transistors," *Appl. Phys. Lett.* 71:2020-2022.

Huang et al. (2001) "Room-Temperature Ultraviolet Nanowire Nanolasers," *Science* 292:1897-1899.

Huitema et al. (2001) "Plastic Transistors in Active-Matrix Displays," *Nature* 414:599.

Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30:1604-1608.

Jenkins et al. (1994) "Gallium Arsenide Transistors: Realization Through a Molecularly Designed Insulator," *Science* 263:1751-1753.

Jin et al. (2004) "Scalable Interconnection and Integration of Nanowire Devices Without Registration," *Nano Lett.* 4:915-919.

Jiyun, C.H. (2003) "Guided Molecular Self-Assembly: A Review of Recent Efforts," *Smart Mater. Struct.* 12:264-271.

Kagan (1999) "Organic-Inorganic Hybrid Materials as Semiconducting Channels in Thin-Film Field-Effect Transistors," *Science* 286:945-947.

Kagan et al. (2003) *Thin Film Transistors*, Dekker, New York.

Kane et al. (2000) "Analog and Digital Circuits Using Organic Thin-Film Transisors on Polyster Substrates," *IEEE Electron. Dev. Lett.* 21:534-536.

Kilby, J.S. (1976) "Invention of the Integrated Circuit," *IEEE Trans. Electron. Dev.* 23:648-654.

Klauk et al. (2002) "High-Mobility Polymer Gate Dielectric Pentacene Thin Film Transistors," *J. Appl. Phys.* 92:5259-5263.

Kong et al. (2004) "Single-Crystal Nanorings Formed by Epitaxial Self-Coiling of Polar Nanobelts," *Science* 303:1348-1351.

Leclercq et al. (1998) "III-V Micromachined Devices for Microsystems," *Microelectronics J.* 29:613-619.

Lee et al. (2003) "High-Performance Poly-Si TFTs on Plastic Substrates Using a Nano-Structured Separation Layer Approach," *IEEE Elec. Dev. Lett.* 24:19-21.

Lee et al. (2000) "Thin Film Transistors for Displays on Plastic Substrates," *Solid State Electron.* 44:1431-1434.

Li et al. (2003) "Ultrathin Single-Crystalline-Silicon Cantilever Resonators: Fabrication Technology and Significant Specimen Size Effect on Young's Modulus," *Appl. Phys. Lett.* 83:3081-3083.

Lieber, C. (2001) "The Incredible Shrinking Circuit," *Sci. Am.* 285(3):58-64.

Luan et al. (1992) "An Experimental Study of the Source/Drain Parasitic Resistance Effects in Amorphous Silicon Thin Film Transistors," *J. Appl. Phys.* 72:766-772.

Maikap et al. (2004) "Mechanically Strained-Si NMOSFETs," *IEEE Electron. Dev. Lett.* 25:40-42.

Martensson et al. (2004) "Nanowire Arrays Defined by Nanoimprint Lithography," *Lano Lett.* 4:699-702.

Matsunaga et al. (2003) "An Improved GaAs Device Model for the Simulation of Analog Integrated Circuit," *IEEE Trans. Elect. Dev.* 50:1194-1199.

Markovich et al. (1999) "Architectonic Quantum Dot Solids," *Acc. Chem. Res.* 32:415-423.

McCaldin et al. (1971) "Diffusivity and Solubility of Si in the Al Metallization of Integrated Circuits," *Appl. Phys. Lett.* 19:524-527.

Meitl et al. (2004) "Solution Casting and Transfer Printing Single-Walled Carbon Nanotube Films," *Nano Lett.* 4:1643-1947.

Melosh et al. (2003) "Ultrahigh-Density Nanowire Lattices and Circuits," *Science* 300:112-115.

Menard et al. (2004) "A Printable Form of Silicon for High Performance Thin Film Transistors on Plastic Substrates," *Appl. Phys. Lett.* 84:5398-5400.

Menard et al. (2004) "High-Performance n- and p-Type Single-Crystal Organic Transistors with Free-Space Gate Dielectrics," *Adv. Mat.* 16:2097-2101.

Menard et al. (2005) Bendable Single Crystal Silicon Thin Film Transistors Formed by Printing on Plastic Substrates *Appl. Phys. Lett.* 86(093507):1-3.

Milliron et al. (2004) "Colloidal Nanocrystal Heterostructures with Linear and Branched Topology," *Nature* 430:190-195.

Mitzi et al. (2004) "High-Mobility Ulltrathin Semiconducting Films Prepared by Spin Coating," *Nature* 428:299-303.

Mori et al. (1978) "A New Etching Solution System, $H_3PO_4$-$H_2O_2H_2$), for GaAs and Its Kinetics," *J. Electrochem. Soc.* 125:1510-1514.

Morkoc et al. (1995) "High-Luminosity Blue and Blue-Green Gallium Nitride Light-Emitting Diodes," *Science* 267:51-55.

Morra et al. (1990) "On the Aging of Oxygen Plasma-Treated Polydimethylsiloxane Surfaces," *J. Colloid Interface Sci.* 137:11-24.

Namazu et al. (2000) "Evaluation of Size Effect on Mechanical Properties of Single Crystal Silicon by Nanoscale Bending Test Using AFM," *J. MEMS* 9:450-459.

Nirmal et al. (1999) "Luminescence Photophysics in Semiconductor Nanocrystals," *Acc. Chem. Res.* 32:407-414.

Ouyang et al. (2002) "High-Performance, Flexible Polymer Light-Emitting Diodes Fabricated by a Continuous Polymer Coating Process," *Adv. Mat.* 14:915-918.

Pan et al. (2001) "Nanobelts of Semiconducting Oxides," *Science* 291:1947-1949.

Panev et al. (2003) "Sharp Exciton from Single InAs Quantum Dots in GaAs Nanowires," *Appl. Phys. Lett.* 83:2238-2240.

Raman et al. (1989) "Study of Mesa Undercuts Produced in GaAs with $H_3PO_4$-Based Etchants," *J. Electrochem. Soc.* 136:2405-2410.

Razeghi et al. (1994) "High-Power Laser Diodes Based on InGaAsP Alloys," *Nature* 369-631-633.

Ribas et al. (1998) "Bulk Micromachining Characterization of 0.2 µm HEMT MMIC Technology for GaAs MEMS Design," *Mater. Sci. Eng. B* 51:267.

Ridley et al. (1999) "All-Inorganic Field Effect Transistors Fabricated by Printing," *Science* 286:746-749.

Robinson et al. (1983) "GaAs Readied for High-Speed Microcircuits," *Science* 219:275-277.

Rotkin et al. (2003) "Universal Description of Channel Conductivity for Nanotube and Nanowire Transistors," *Appl. Phys. Lett.* 83:1623-1625.

Schrieber et al. (1998) "The Effectiveness of Silane Adhesion Promotors in the Performance of Polyurethane Adhesives," *J. Adhesion* 68:31-44.

Schnable et al. 1969) "Aluminum Metallization; Advantages and Limitations for Integrated Circuit Applications," *IEEE* 57:1570-1580.

Sheraw et al. (2002) "Organic Thin-Film Transistor-Driven Polymer-Dispersed Liquid Crystal Displays on Flexible Polymeric Substrates," *Appl. Phys. Lett.* 80:1088-1090.

Sim et al. (1993) "An Analytical Back-Gate Bias Effect Model for Ultrathin SOI CMOS Devices," *IEEE Trans. Elec. Dev.* 40:755-765.

Sirrunghaus et al. (2003) "Inkjet Printing of Functional Materials," *MRS Bull.* 28:802-806.

Smith et al. (2000) "Electric-Field Assisted Assembly and Alignment of Metallic Nanowires," *Appl. Phys. Lett.* 77(9):1399-1401.

Sun et al. (2004) "Fabricating Semiconductor Nano/Microwires and Transfer Printing Ordered Arrays of Them onto Plastic Substrates," *Nano Lett.* 4:1953-1959.

Sun et al. (2005) "Photolithographic Route to the Fabrication of Micro/Nanowires of III-V Semiconductors," *Adv. Funct. Mater.* 15:30-40.

Sze, S. (1994) *Semiconductor Sensors*, John Wiley and Sons: New York pp. 17-95.

Sze, S. (1985) *Semiconductor Devices: Physics and Technology*, New York: Wiley, pp. 428-467.

Sze, S. (1988) *VLSI Technology*, Mcgraw-Hill, 327-374, 566-611.

Tao et al. (2003) "Langmuir-Blodgett Silver Nanowire Monolayers for Molecular Sensing Using Surface-Enhanced Raman Spectroscopy," *Nano Lett.* 3:1229-1233.

Theiss et al. (1998) "PolySilicon Thin Film Transistors Fabricated at 100°C. on a Flexible Plastic Substrate," *IEDM* 257-260.

Tong (1999) *Semiconductor Wafer Bonding: Science and Technology*, John Wiley; New York, pp. 187-221.

Trentler et al. (1995) "Solution-Liquid-Solid Growth of Crytalline III-V Semiconductors: An Analog to Vapor-Liquid-Solid Growth," *Science* 270:1791-1794.

Vilan et al. (2000) "Molecular Control Over Au/GaAs Diodes," *Nature* 404:166-168.

Voss, D. (2000) "Cheap and Cheerful Circuits," *Nature* 407:442-444.

Wagner et al. (2003) "Silicon for Thin-Film Transistors," *Thin Solid Films* 430:15-19.

Wang et al. (2003) "A Solution-Phase, Precursor Route to Polycrystalline $SnO_2$ Nanowores That Can Be Used for Gas Sensing under Ambient Conditions," *J. Am. Chem. Soc.* 125:16176-16177.

Whang et al. (2003) "Large-Scale Hierarchical Organization of Nanowire Arrays for Integrated Nanosystems," *Nano Lett.* 3(9):1255-1259.

Won et al. (2004) "Effect of Mechanical and Electrical Stresses on the Performance of an a-Si:H TFT on Plastic Substrate," *J. Electrochem. Soc.* 151:G167-G170.

Wu et al. (2002) "Growth of Au-Catalyzed Ordered GaAs Nanowire Arrays by Molecular-Beam Epitaxy," *Appl. Phys. Lett.* 81:5177-5179.

Wu et al. (2003) "Growth, Branching, and Kinking of Molecular-Beam Epitaxial (110) GaAs Nanowires," *Appl. Phys. Lett.* 83:3368-3370.

Xia et al. (2003) "One-Dimensional Nanostructures: Synthesis, Characterization and Applications," *Adv. Mater.* 15:353-389.

Xia et al. (1998) "Soft Lithography," *Annu. Rev. Mater. Sci.* 28:153-184.

Yin et al. (2000) "A Soft Lithography Approach to the Fabrication of Nanostructures of Single Crystalline Silicon with Well-Defined Dimensions and Shapes," *Adv. Mater.* 12:1426-1430.

Yu et al. (2003) "Two- Versus Three-Dimensional Quantum Confinement in Indium Phosphide Wires and Dots," *Nat. Mater.* 2:517-520.

Yu et al. (2003) "Solution-Liquid-Solid Growth of Soluble GaAs Nanowires," *Adv. Mater.* 15:416-419.

Zhou et al. (2004) "p-Channel, n-Channel Thin Film Transistors and p-n Diodes Based on Single Wall Carbon Nanotube Networks," *Nano Lett.* 4:2031-2035.

Zhu et al. (2005) "Spin on Dopants for High-Performance Single Crystal Silicon Transistors on Flexible Plastic Substrates," *Appl. Physl. Lett.* 86(133507):1-3.

Blanchet, G. et al. (2003) "Printing Techniques for Plastic Electronics"; *J. of Imaging Sci. & Tech.* 47(4);296-303.

Mirkin, C.A. et al. (Jul. 2001) "Emerging Methods for Micro- and Nanofabrication"; *MRS Bulletin* 506-507.

Park, S.H. et al (1998) "Fabrication of Three-Dimensional Macroporous Membranes with Assemblies of Microspheres as Templates"; *Chem. Mater.* 10:1745-1747.

Rogers, J.A. et al. (2002) "Printed Plastic Electronics and Paperlike Displays"; *J. Polym. Sci. Part. A: Polym. Chem.* 40:3327-3334.

Bates, F.S. (1991) "Polymer-Polymer Phase Behavior," *Science* 251:898-905.

Bernard et al. (1998) "Printing Patterns of Proteins," *Langmuir* 14(9):2225-2229.

Blanchet et al. (2003) "Large Area, High Resolution, Dry Printing of Conducting Polymers for Organic Electronics," *Appl. Phys. Lett.* 82:463-465.

Boltau et al. (1998) "Surface-Induced Structure Formation of Polymer Blends on Patterned Substrates," *Nature* 391:877-879.

Bowden et al. (2001) "Molecule-Mimetic Chemistry and Mesoscale Self Assembly," *Acc. Chem. Res.* 34:231-238.

Bowden et al. (1998) "Spontaneous Formation of Ordered Structures in Thin Films of Metals Supported on an Elastomeric Polymer," *Nature* 393:146-149.

Braun et al. (1999) "Electrochemically Grown Photonic Crystals," *Nature* 402:603-604.

Burgin et al. (2000) "Large Area Submicrometer Contact Printing Using a Contact Aligner," *Langmuir* 16:5371-5375.

Campbell et al. (2000) "Fabrication of Photonic Crystals for the Visible Spectrum by Holographic Lithography," *Nature* 404:53-56.

Dinsmore et al. (2002) "Colloidosomes: Selectively Permeable Capsules Composed of Colloidal Particles," *Science* 298:1006-1009.

Divliansky et al. (2003) "Fabrication of Three-Dimensional Polymer Photonic Crystal Structures Using Single Diffraction Element Interference Lithography," *Appl. Phys. Lett.* 82(11):1667-1669.

Duffy et al. (1998) "Rapid Prototyping of Microfluidic Systems in Poly(dimethylsiloxane)," *Anal. Chem.* 70(23):4974-4984.

Edrington et al. (2001)"Polymer-Based Photonic Crystals," *Adv. Mater.* 13:421-425.

Felgner et al. (1996) "Flexural Rigidity of Microtubules Measured with the Use of Optical Tweezers," *J. Cell Sci.* 109:509-516.

Fink et al. (1999) "Block Copolymers as Photonic Bandgap Materials," *J. Lightwave Tech.* 17:1963-1969.

Folch et al. (1999) "Wafer-Level In-Registry Microstamping," *J. Microelectromech. Syst.* 8:85-89.

Furneaux et al. (1989) "The Formation of Controlled-Porosity Membranes from Anodically Oxidized Aluminum," *Nature* 337:147-149.

Goetting et al. (1999) "Microcontact Printing of Alkanephosphonic Acids on Aluminum: Pattern Transfer by Wet Chemical Etching," *Langmuir* 15:1182-1191.

Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.

Hoyer, P. (1996) "Semiconductor Nanotube Formation by a Two-Step Template Process," *Adv. Mater.* 8:857-859.

Huang et al. (2001) "Directed Assembly of One-Dimensional Nanostructures into Functional Networks," *Science* 291:630-633.

Hsu et al. (2003) "Nature of Electrical Contacts in a Metal-Molecule-Semiconductor System" *J. Vac. Sci. Technol. B* 21(4):1928-1935.

Jacobs et al. (2002) "Fabrication of a Cylindrical Display by Patterned Assembly," *Science* 296:323-325.

James et al. (1998) "Patterned Protein Layers on Solid Substrates by This Stamp Microcontact Printing," *Langmuir* 14:741-744.

Jeon et al. (2004) "Fabricating Complex Three-Dimensional Nanostructures with High Resolution Conformable Phase Masks," *Proc. Natl. Acad. Sci. USA* 101:12428-12433.

Jeon et al. (2004) "Three Dimensional Nanofabrication with Arubber Stamps and Conformable Photomasks," *Adv. Mater.* 16:593-600.

Jeon et al. (1995) "Patterning of Dielectric Oxide Thin Layers by Microcontact Printing of Self-Assembled Monolayers," *J. Mater. Res.* 10:2996-2999.

Jiang et al. (1999) "Preparation of Macroporous Metal Films from Colloidal Crystals," *J. Am. Chem. Soc.* 121:7957-7958.

Jiang et al. (2002) "Polymer-on-Polymer Stamping: Universal Approaches to Chemically Patterned Surfaces," *Langmuir* 18:2607-2615.

Johnson et al. (1999) "Ordered Mesoporous Polymers of Tunable Pore Size from Colloidal Silica Templates," *Science* 283:963-965.

Kagan et al. (2001) "Patterning Organic-Inorganic Thin-Film Transistors Using Microcontact Printed Templates," *Appl. Phys. Lett.* 79(21):3536-3538.

Kawata et al. (2001) "Finer Features for Functional Microdevices," *Nature* 412:697-698.

Kim et al. (2003) "Epitaxial self-assembly of block copolymers on lithographically defined nanopatterned substrates," *Nature* 424:411-414.

Kim et al. (2002) "Nanolithography Based on Patterned Metal Transfer and its Application to Organic Electronic Devices," *Appl. Phys. Lett.* 80:4051-4053.

Klein-Wiele et al. (2003) "Fabrication of Periodic Nanostructures by Phase-Controlled Multiple-Beam Interference," *Appl. Phys. Lett.* 83(23):4707-4709.

Koide et al. (2000) "Patterned Luminescence of Organic Light-Emitting Diodes by Hot Microcontact Printing (HμCP) of Self-Assembled Monolayers," *J. Am. Chem. Soc.* 122:11266-11267.

Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(4):2002-2004.

Lee et al. (2004)"Organic Light-Emitting Diodes Formed by Soft Contact Lamination," *Proc. Natl. Acad. Sci. USA* 101(2):429-433.

Li et al. (2002) "High-Resolution Contact Printing with Dendrimers," *Nano Lett.* 2(4):347-349.

Loo et al. (2003) "Electrical Contacts to Molecular Layers by Nanotransfer Printing," *Nano Lett.* 3(7):913-917.

Loo et al. (2002) "Additive, Nanoscale Patterning of Metal Films with a Stamp and a Surface Chemistry Mediated Transfer Process: Applications in Plastic Electronics," *Appl. Physics Lett.* 81:562-564.

Loo et al. (2002) "Interfacial Chemistries for Nanoscale Transfer Printing," *J. Am. Chem. Soc.* 124:7654-7655.

Loo et al. (2002) "High-Resolution Transfer Printing on GaAs Surfaces Using Alkane Dithiol Monolayers," *J. Vac. Sci. Technol. B* 20(6):2853-2856.

Loo et al. (2002) "Soft, Conformable Electrical Contacts for Organic Semiconductors: High-Resolution Plastic Circuits by Lamination," *Proc. Natl. Acad. Sci. USA* 99(16):10252-10256.

Maldovan et al. (2004) "Diamond-Structured Photonic Crystals," *Nature Materials* 3:593-600.

Martin, C.R. (1995) "Template Synthesis of Electronically Conductive Polymer Nanostructures," *Acc. Chem. Res.* 28:61-68.

Meisel et al. (2004) "Three-Dimensional Photonic Crystals by Holographic Lithography Using the Umbrella Configuration: Symmetries and Complete Photonic Band Gaps," *Phys. Rev. B.* 70:165101:1-10.

Menard et al. (2004) "Improved Surface Chemistries, Thin Film Deposition Techniques, and Stamp Designs for Nanotransfer Printing," *Langmiur* 20:6871-6878.

Michel et al. (Sep. 2001) "Printing Meets Lithography: Soft Approaches to High-resolution Patterning," *IBM J. Res. & Dev.* vol. 45, No. 5, pp. 697-708.

Morkved et al. (1994) "Mesoscopic Self-Assembly of Gold Islands on Diblock-Copolymer Films," *Appl. Phys. Lett.* 64:422-424.

Odom et al. (2002) "Improved Pattern Transfer in Soft Lithography Using Compasite Stamps," *Langmuir* 18:5314-5320.

Park et al. (1997) "Block Copolymer Lithography: Periodic Arrays of ~$10^{11}$ Holes in 1 Square Centimeter," *Science* 276:1401-1404.

Quake et al (2000) "From Micro- to Nanofabrication with Soft Materials," *Science* 290:1536-1540.

Rogers et al. (1998) "Quantifying Distortions in Soft Lithography," *J. Vac. Sci. Technol.* 16:88-97.

Rogers et al. (1998) "Generating ~90 Nanometer Features Using Near Field Contact Mode Photolithography with an Elastomeric Phase Mask," *J. Vac. Sci. Technol.* 16(1):59-68.

Rogers et al. (1998) "Using Printing and Molding Technoques to Produce Distributed Feedback and Bragg Reflector Resonators for Plastic Lasers," *Appl. Phys. Lett.* 73:1766-1768.

Rogers et al. (2001) "Paper-Like Electronic Displays: Large-Area Rubber-Stamped Plastic Sheets of Electronics and Microencapsulated Electrophoretic Inks," *Proc. Natl. Acad. Sci. USA* 98:4835-4840.

Rogers, J.A. (2001) "Toward Paperlike Displays," *Science* 291:1502-1503.

Rogers, J.A. (2001) "Rubber Stamping for Plastic Electronics and Fiber Optics," *MRS Bulletin* 26(7):530-534.

Roundy et al. (2003) "Photonic Crystal Structure with Square Symetry withing Each Layer and a Three Dimensional Band Gap," *Appl. Phys. Lett.* 82:3835-3837.

Schmid et al. (2003) "Preparation of Metallic Films on Elastomeric Stamps and Their Application for Contact Processing and Contact Printing," *Adv. Funct. Mater.* 13:145-153.

Sharp et al. (2003) "Holographic Photonic Crystals with Diamond Symmetry," *Phys. Rev. B* 68:205102/1-205102/6.

Smay et al. (2002) "Colloidal Inks for Directed Assembly of 3-D Periodic Structures," *Langmuir* 18:5429-5437.

Toader et al. (2003) "Photonic Band Gaps Based on Tetragonal Lattices of Slanted Pores," *Phys. Rev. Lett.* 90:233901/1-233901/4.

Toader et al. (2004) "Photonic Band Gap Architechtures for Holographic Lithography," *Phy. Rev. Lett.* 043905/1-043905/4.

Trau et al. (1997) "Microscopic Patterning of Orientated Mesoscopic Silica Through Guided Growth," *Nature* 390:674-676.

Velev et al. (1997) "Porous silica via colloidal crystallization," *Nature* 389:447-448.

Vlasov et al. (2001) "On-Chip Natural Assembly of Silicon Photonic Bandgap Crystals," *Nature* 414:289-293.

Xia et al. (1999) "Unconventional Methods for Fabricating and Patterning Nanostructures," *Chem. Rev.* 99:1823-1848.

Xia (1998) "Soft Lithography" *Angew. Chem. Int. Ed.* 37:550-575.

Yang et al. (1997) "Mesoporous Silica with Micrometer-Scale Desgns," *Adv. Mater.* 9:811-814.

Yang et al. (2002) "Creating Periodic Three-Dimensional Structures by Multibeam Interface of Visible Laser," *Chem. Mater.* 14:2831-2833.

Yeh et al. (1994) "Fluidic Self-Assembly for the Integration of GaAs Light-Emitting Diodes on Si Substrates," *IEEE Photon. Techn. Lett.* 6:706-708.

Zakhidov et al. (1998) "Carbon Structure with Three-Dimensional Periodicity at Optical Wavelengths," *Science* 282:897-901.

Zaumseil et al. (2003) "Nanoscale Organic Transistors that use Source/Drain Electrodes Supported by High Resolution Rubber Stamps," *Appl. Phys. Lett.* 82(5):793-795.

Zaumseil et al. (2003) "Three-Dimensional and Multilayer Nanostructures Formed by Nanotransfer Printing," *Nano Lett.* 3(9):1223-1227.

Zhou et al. (2002) "An Efficient Two-Photon-Generated Photoacid Applied to Positive-Tone 3D Microfabrication," *Science* 296:1106-1109.

* cited by examiner

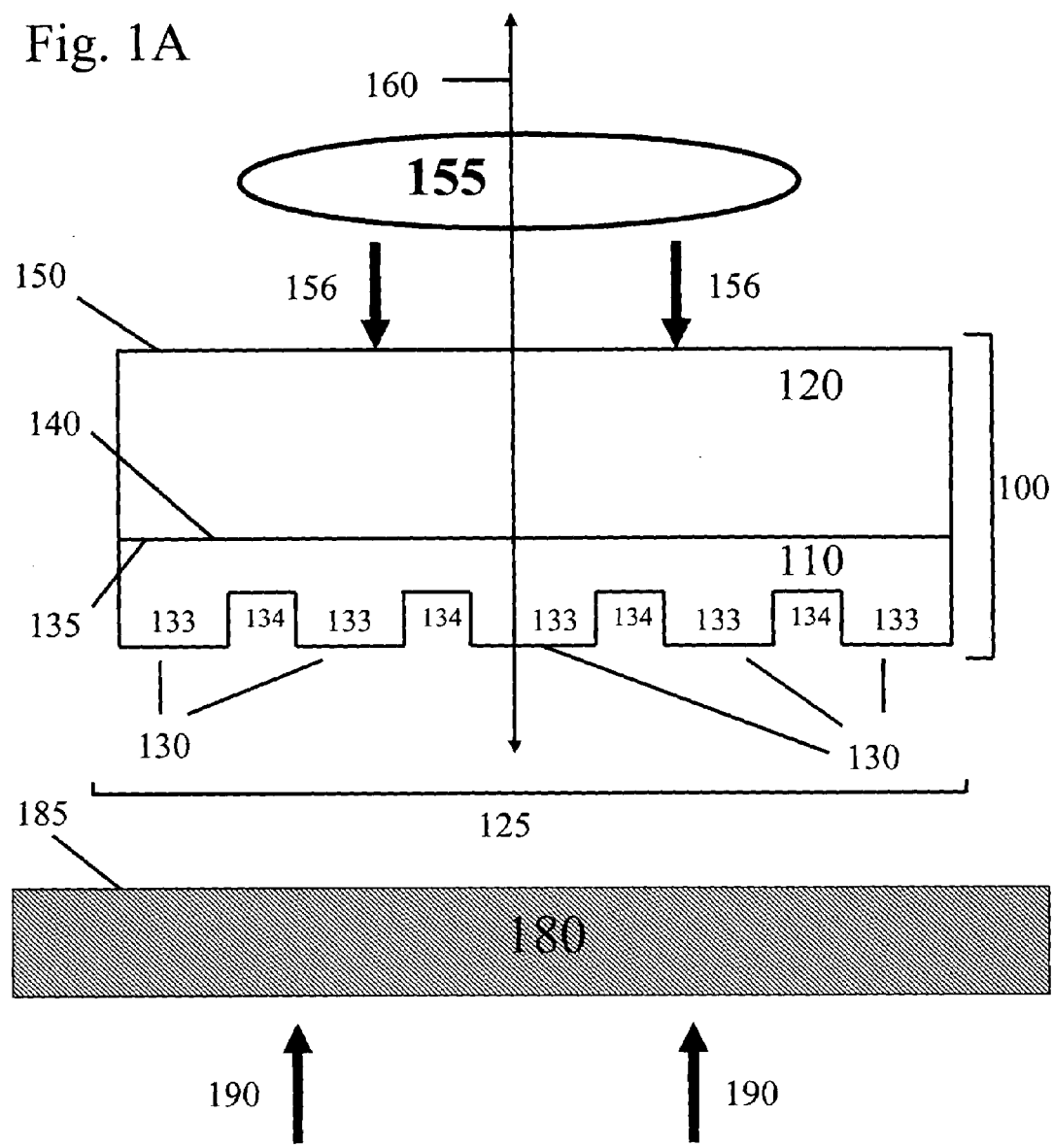

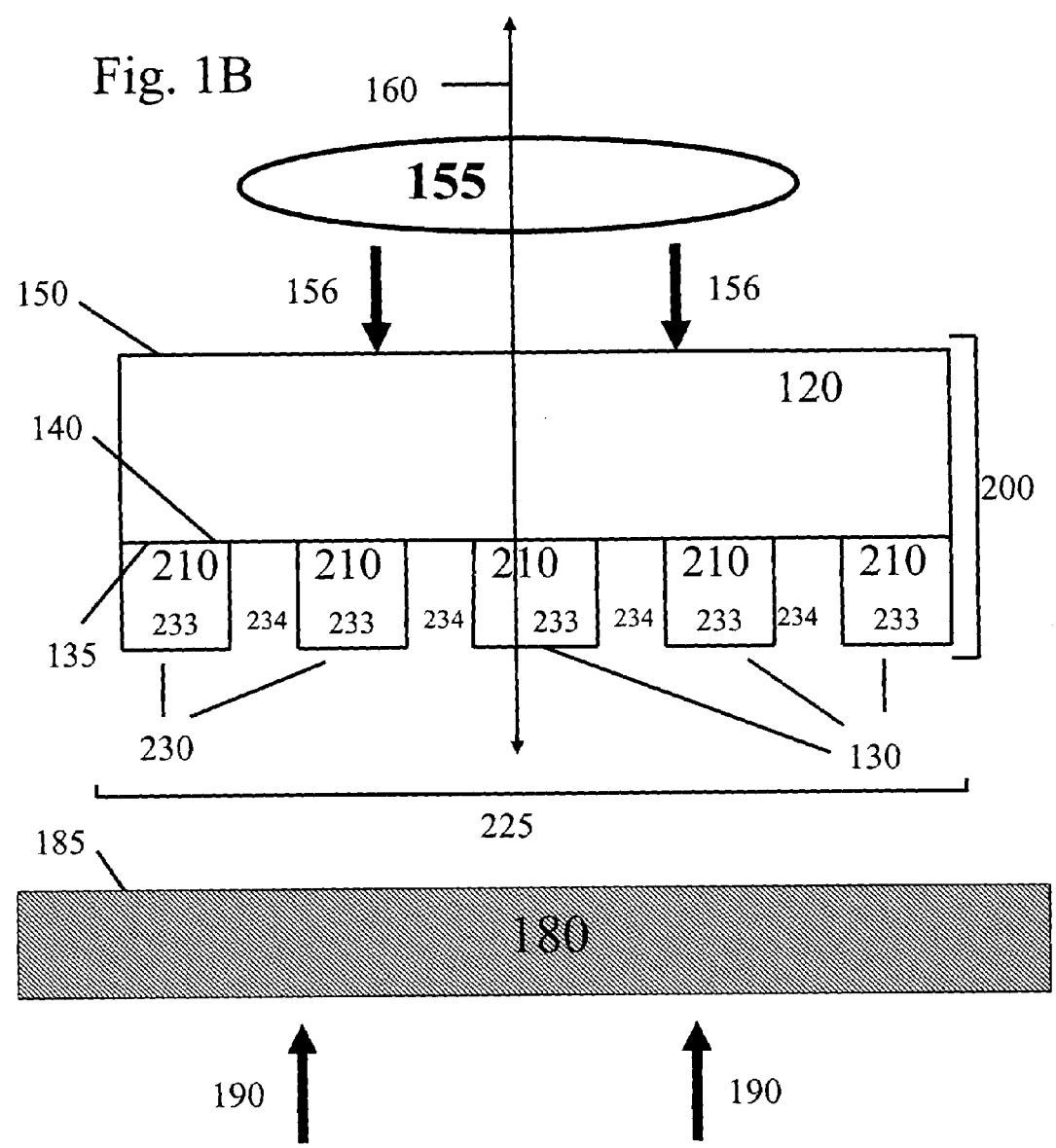

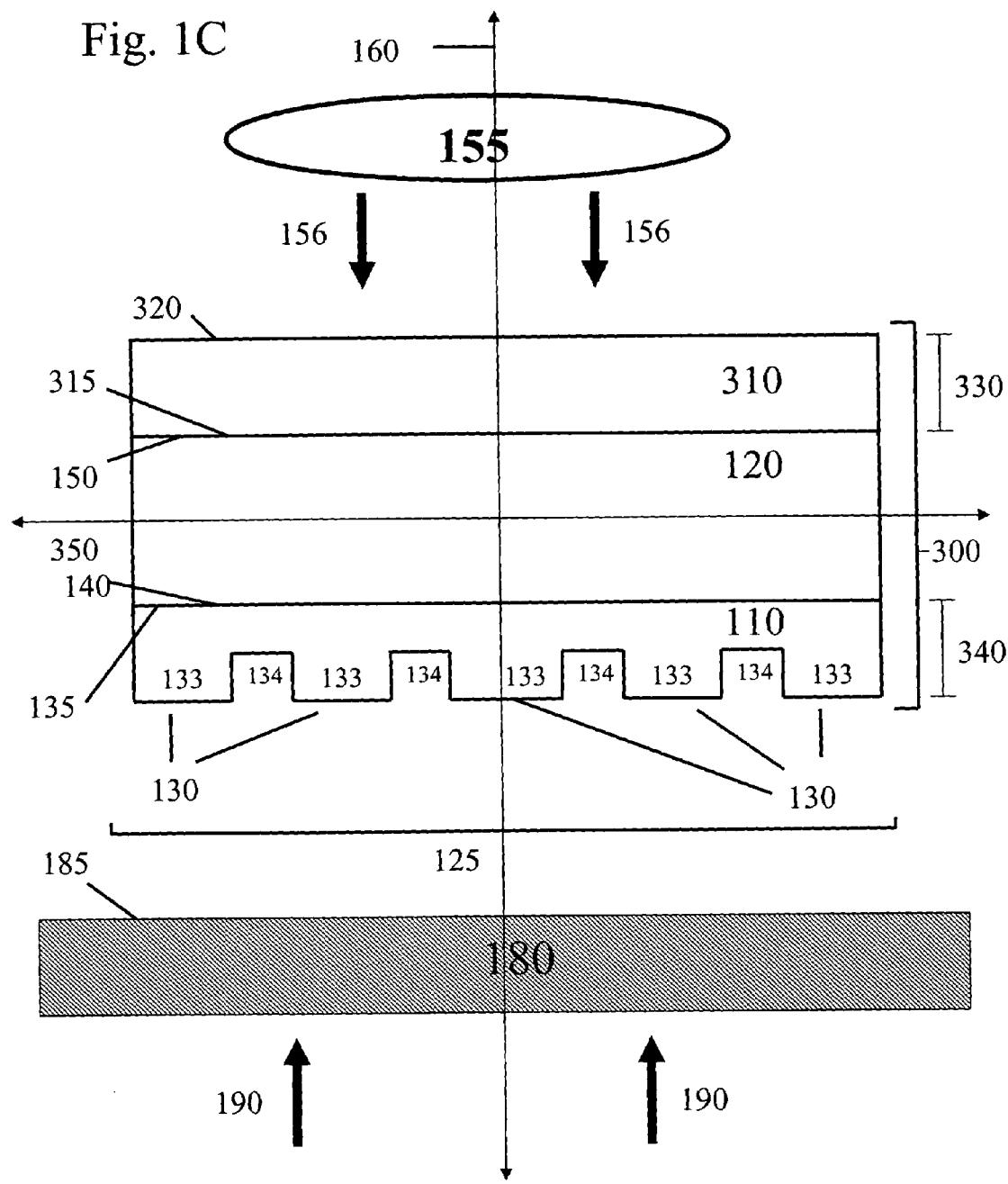

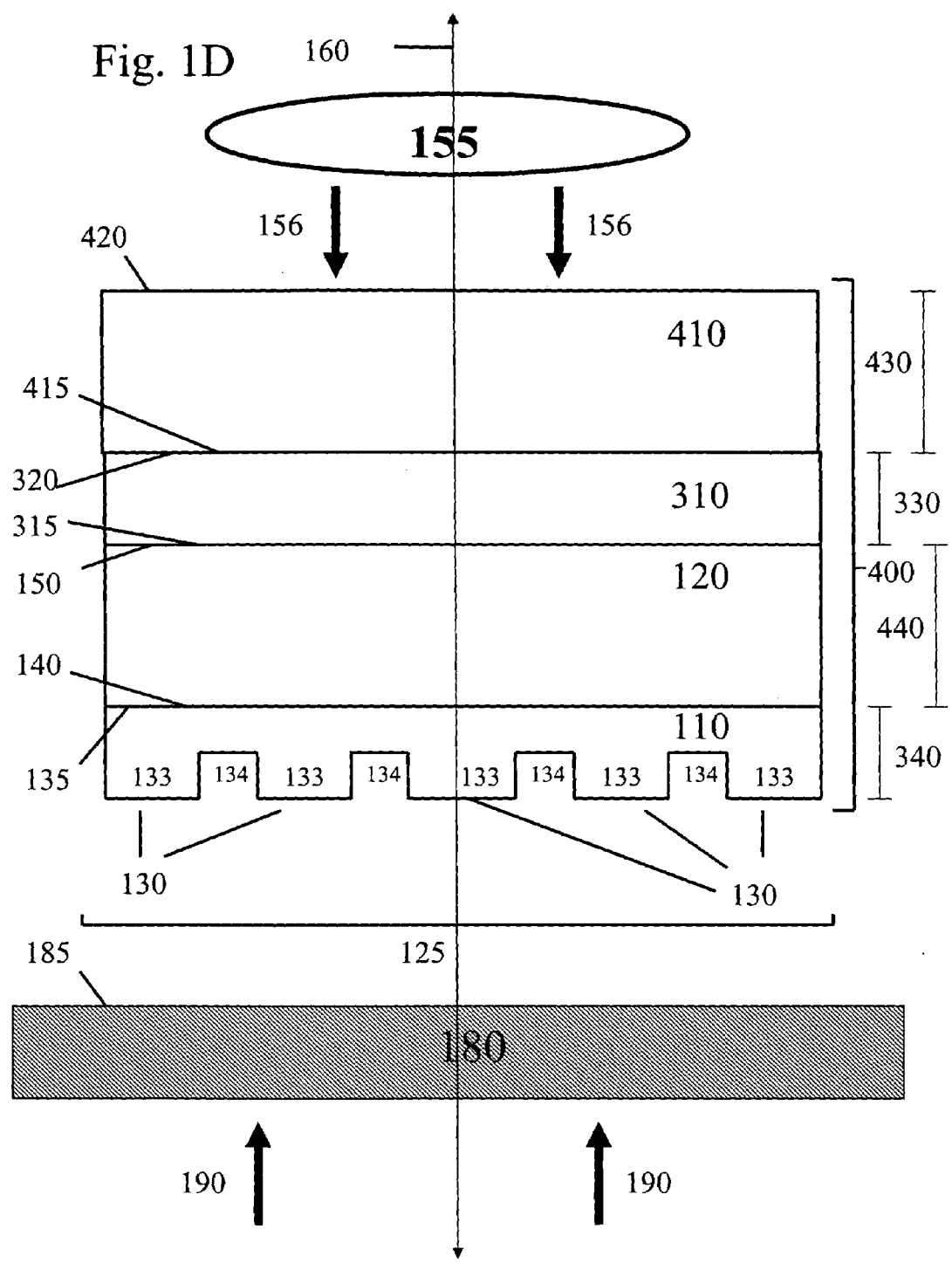

Fig. 3A a) Spin coating of low modulus elastomeric material (3000~6000 RPM)

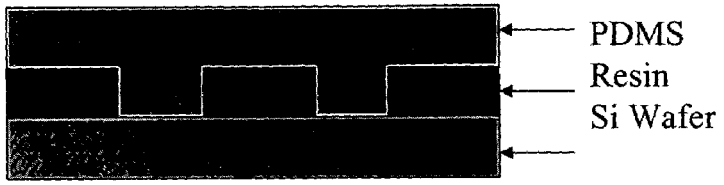

- PDMS
- Resin
- Si Wafer b) Oven/hot plate curing of the elastomeric material (few hours at 60~80°C for PDMS)

c) e-beam evaporation of Ti/Au on eleastomeric material and high modulus polymer backing

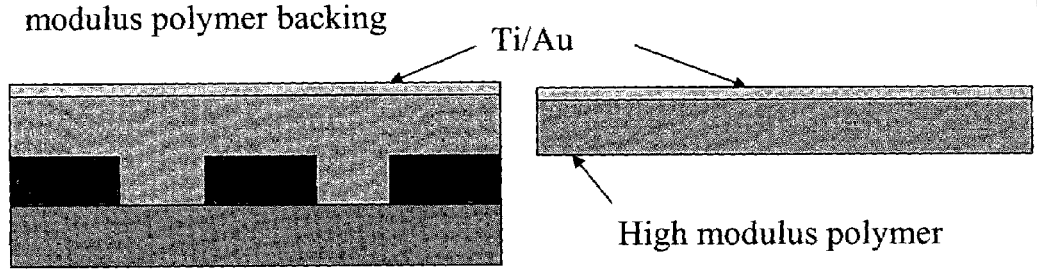

Ti/Au

High modulus polymer d) Cold welding of the high modulus polymer on top of the low modulus elastomeric material

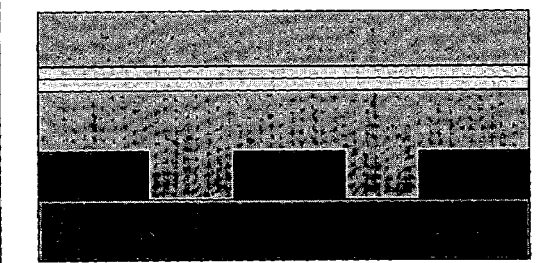

e) The composite stamp is pealed away from the master

Fig. 3B a) e-beam evaporation of Ti/SiO$_2$ on a high modulus polymer backing

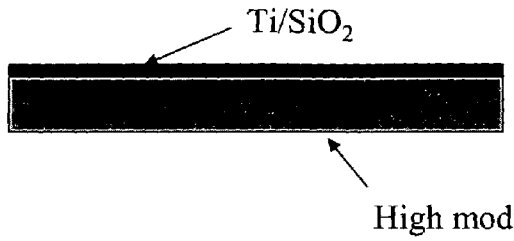

Ti/SiO$_2$

High modulus polymer b) The Ti/SiO$_2$ primed high modulus polymer is brought into contact with a PDMS coated master

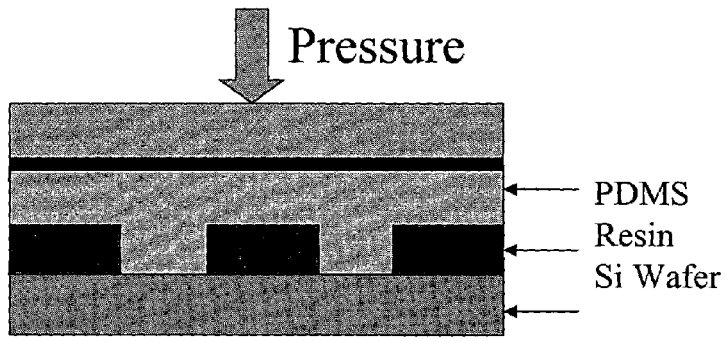

Pressure

PDMS
Resin
Si Wafer

The thickness of the PDMS layer can be reduces to a desired value by:
-spinning the master with the high modulus polymer lying on top
-applying pressure on the back of the high modulus polymer with a flat or rocker based press c) Oven curing of the elastomeric material (few hours at 60~80°C for PDMS)

d) The composite stamp is pealed away from the master 5 cm

Au
PDMS
Polyimide

50 μm $T_{curing} = 80°C$
$T_{amb} = 20°C$ $h_{PDMS} = 5\mu m$
$h_{KAPTON} = 25\mu m$ $CTE_{PDMS} = 260 ppm$
$CTE_{KAP} = 14.5 ppm$ $$Rc = \frac{(x'^2 + y'^2)^{3/2}}{x' \cdot y'' - y' \cdot x''}$$

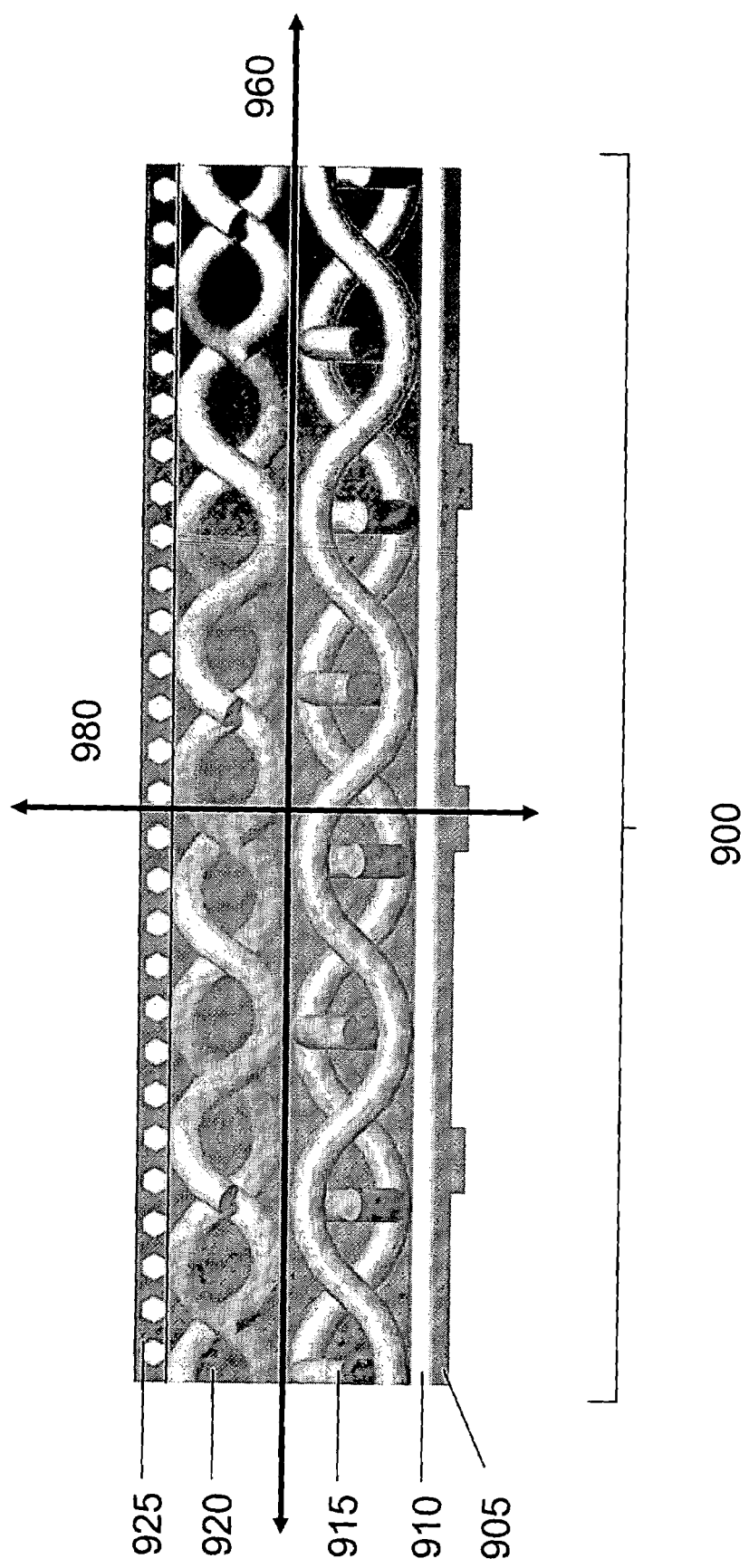

Fig. 18

A: e-beam evaporation of metal (Al) on a high modulus polymer backing

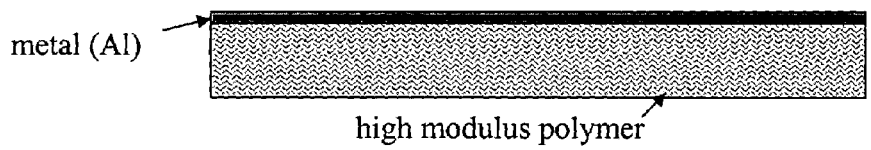

B: photo-lithography and back solution etching of the metal layer

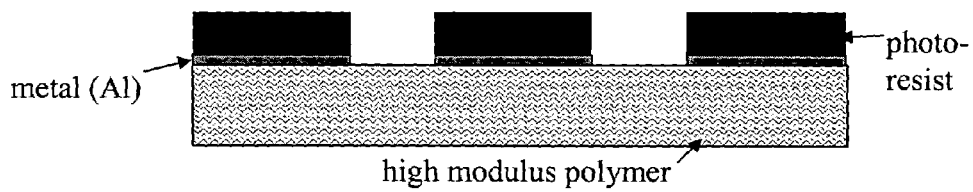

C: e-beam evaporation of Ti/SiO$_2$ to promote adhesion of the PDMS

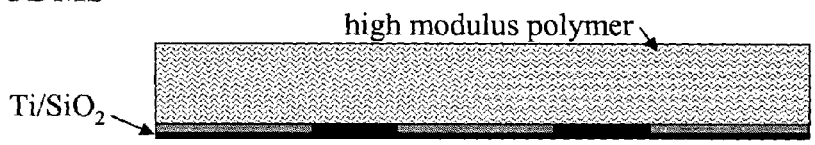

D: a flat Si substrate is treated with a non-stick SAM and then a thin layer of PDMS is spin coated on it

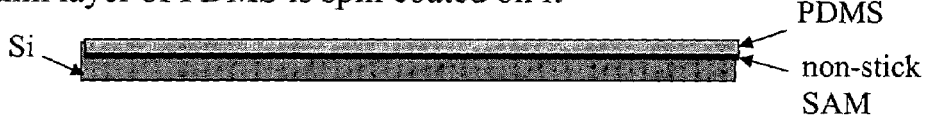

E: the soft optical mask is pressed on the PDMS-coated Si wafer

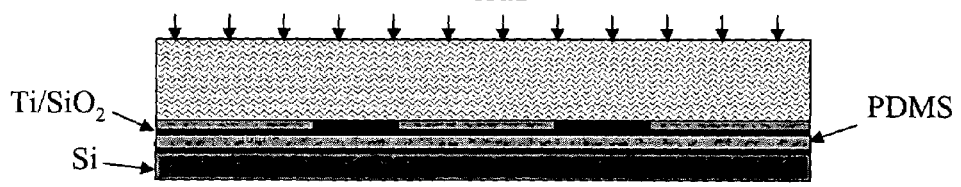

F: oven curing of the elastomeric material (few hours at 60~80°C for PDMS)

G: the soft optical mask is pealed away from the master

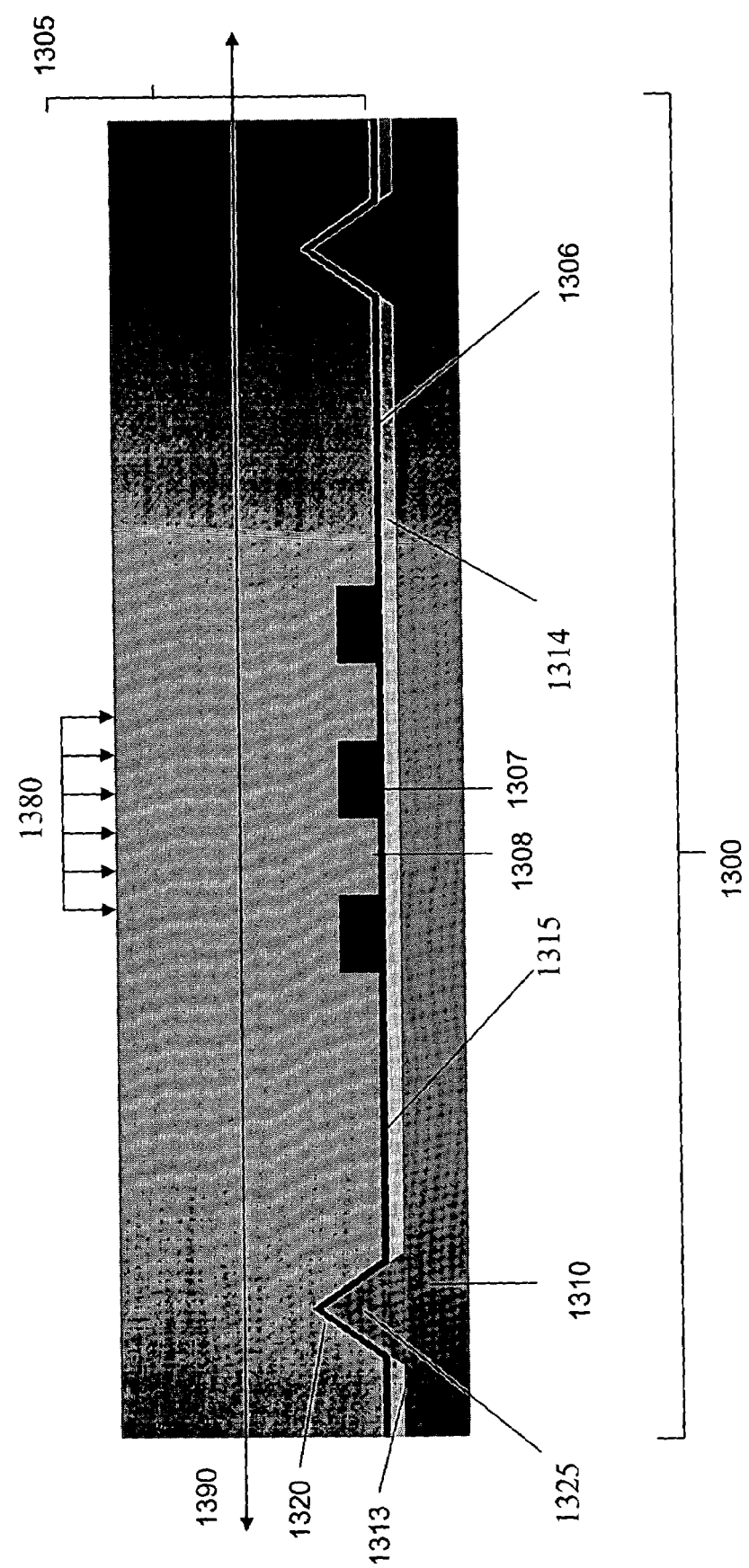

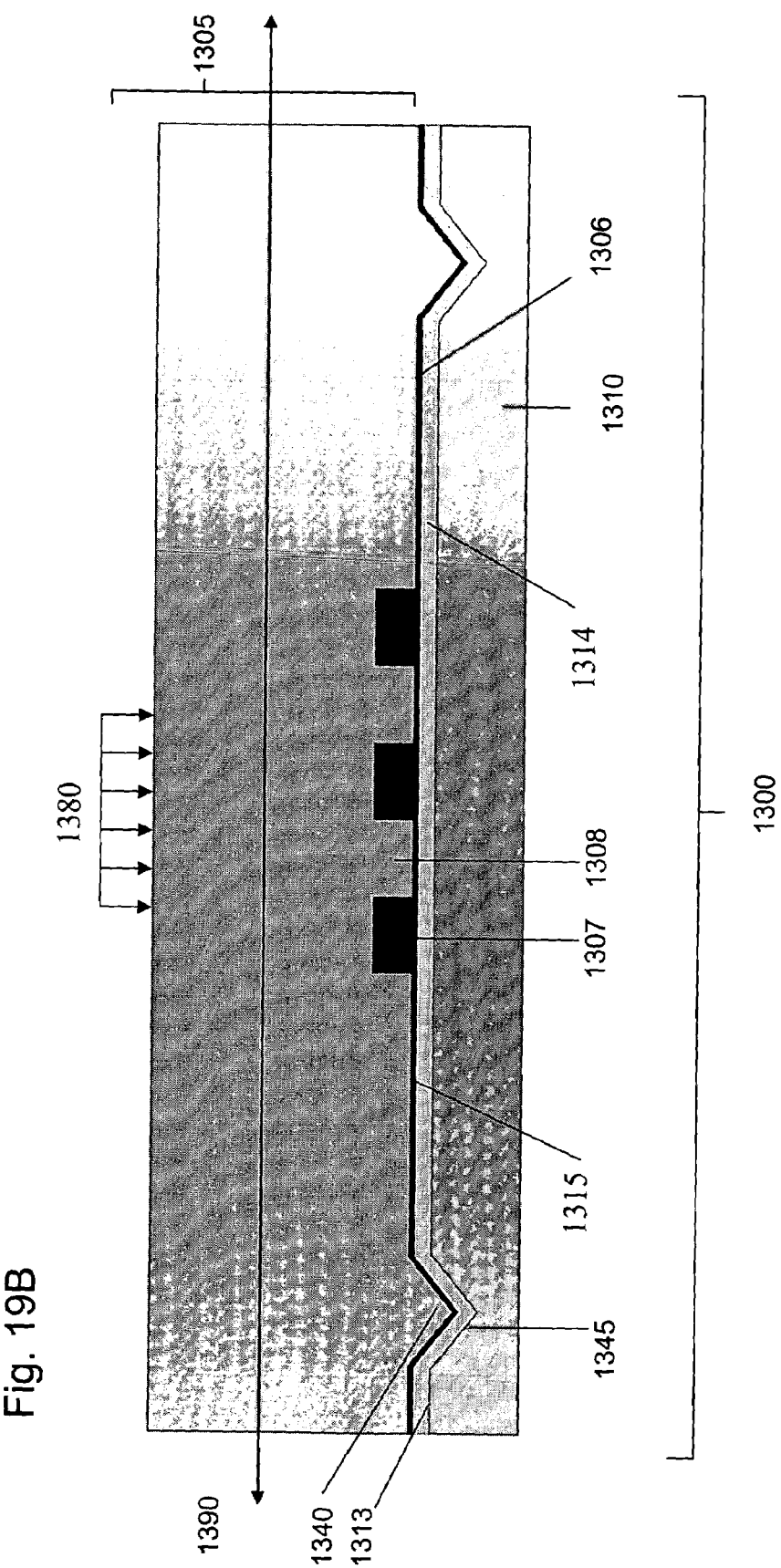

COMPOSITE PATTERNING DEVICES FOR SOFT LITHOGRAPHY

CROSS REFERENCE TO RELATED APPLICATION

This application claims priority under 35 U.S.C. 119(e) to U.S. Provisional Patent Application 60/565,604, filed Apr. 27, 2004, which is hereby incorporated by reference in its entirety to the extent not inconsistent with the disclosure herein.

STATEMENT REGARDING FEDERALLY SPONSORED RESEARCH OR DEVELOPMENT

This invention was made, at least in part, with United States governmental support awarded by Department of Energy Grant DEFG02-91ER45439. The United States Government has certain rights in this invention.

BACKGROUND OF INVENTION

The design and fabrication of micrometer sized structures and devices have had an enormous impact on a number of important technologies including microelectronics, optoelectronics, microfluidics and microsensing. The ability to make micro-sized electronic devices, for example, has revolutionized the electronics field resulting in faster and higher performing electronic components requiring substantially less power. As these technologies continue to rapidly develop, it has become increasingly apparent that additional gains are to be realized by developing the ability to manipulate and organize matter on the scale of nanometers. Advances in nanoscience and technology promise to dramatically impact many areas of technology ranging from materials science to applied engineering to biotechnology.

Fabrication of devices having nanoscale dimensions is not merely a natural extension of the concept of miniaturization, but a fundamentally different regime in which physical and chemical behavior deviates from larger scale systems. For example, the behavior of nanoscale assemblies of many materials is greatly influenced by their large interfacial volume fractions and quantum mechanical effects due to electronic confinement. The ability to make structures having well-defined features on the scale of nanometers has opened up the possibility of making devices based on properties and processes only occurring at nanometer dimensions, such single-electron tunneling, Coulomb blockage and quantum size effect. The development of commercially practical methods of fabricating sub-micrometer sized structures from a wide range of materials, however, is critical to continued advances in nanoscience and technology.

Photolithography is currently the most prevalent method of microfabrication, and nearly all integrated electronic circuits are made using this technique. In conventional projection mode photolithography, an optical image corresponding to a selected two dimensional pattern is generated using a photomask. The image is optically reduced and projected onto a thin film of photoresist spin coated onto a substrate. Alternatively, in Direct Write to Wafer photolithographic techniques, a photoresist is directly exposed to laser light, an electron beam or ion beam without the use of a photomask. Interaction between light, electrons and/or ions and molecules comprising the photoresist chemically alters selected regions of the photoresist in a manner enabling fabrication of structures having well defined physical dimensions. Photolithography is exceptionally well suited for generating two-dimensional distributions of features on flat surfaces. In addition, photolithography is capable of generating more complex three dimensional distributions of features on flat surfaces using additive fabrication methods involving formation of multilayer stacks.

Recent advances in photolithography have extended its applicability to the manufacture of structures having dimensions in the submicron range. For example, nanolithographic techniques, such as deep UV projection mode lithography, soft X-ray lithography, electron beam lithography and scanning probe methods, have been successfully employed to fabricate structures with features on the order of 10s to 100s of nanometers. Although nanolithography provides viable methods of fabricating structures and devices having nanometer dimensions, these methods have certain limitations that hinder their practical integration into commercial methods providing low cost, high volume processing of nanomaterials. First, nanolithographic methods require elaborate and expensive steppers or writing tools to direct light, electrons and/or ions onto photoresist surfaces. Second, these methods are limited to patterning a very narrow range of specialized materials, and are poorly suited for introducing specific chemical functionalities into nanostructures. Third, conventional nanolithography is limited to fabrication of nanosized features on small areas of ultra-flat, rigid surfaces of inorganic substrates and, thus is less compatible with patterning on glass, carbon and plastic surfaces. Finally, fabrication of nanostructures comprising features having selectable lengths in three dimensions is difficult due to the limited depth of focus provided by nanolithographic methods, and typically requires labor intensive repetitive processing of multilayers.

The practical limitations of photolithographic methods as applied to nanofabrication have stimulated substantial interest in developing alternative, non-photolithographic methods for fabricating nanoscale structures. In recent years, new techniques based on molding, contact printing and embossing collectively referred to as soft lithography have been developed. These techniques use a conformable patterning device, such as a stamp, a mold or mask, having a transfer surface comprising a well defined relief pattern. Microsized and nanosized structures are formed by material processing involving conformal contact on a molecular scale between the substrate and the transfer surface of the patterning device. Patterning devices used in soft lithography typically comprise elastomeric materials, such as poly(dimethylsiloxane) (PDMS), and are commonly prepared by casting prepolymers against masters generated using conventional photolithography. The mechanical characteristics of the patterning devices are critical to the fabrication of mechanically robust patterns of transferred materials having good fidelity and placement accuracy.

Soft lithographic methods capable of generating microsized and/or nanosized structures include nanotransfer printing, microtransfer molding, replica molding, micromolding in capillaries, near field phase shift lithography, and solvent assisted micromolding. Conventional soft lithographic contact printing methods, for example, have been used to generate patterns of self assembled monolayers of gold having features with lateral dimensions as small as about 250 nm. Structures generated by soft lithography have been integrated into a range of devices including diodes, photoluminescent porous silican pixels, organic light emitting diodes and thin-film transistors. Other applications of this technology generally include the fabrication flexible electronic components, microelectromechanical systems, microanalytical systems and nanophotonic systems.

Soft lithographic methods for making nanostructures provide a number of benefits important to fabricating nanoscale structures and devices. First, these methods are compatible with a wide range of substrates, such as flexible plastics, carbonaceous materials, ceramics, silicon and glasses, and tolerate a wide range of transfer materials, including metals, complex organic compounds, colloidal materials, suspensions, biological molecules, cells and salt solutions. Second, soft lithography is capable of generating features of transferred materials both on flat and contoured surfaces, and is capable of rapidly and effectively patterning large areas of substrate. Third, soft lithographic techniques are well-suited for nanofabrication of three dimensional structures characterized by features having selectably adjustable lengths in three-dimensions. Finally, soft lithography provides low cost methods which are potentially adaptable to existing commercial printing and molding techniques.

Although conventional PDMS patterning devices are capable of establishing reproducible conformal contact with a variety of substrate materials and surface contours, use of these devices for making features in the sub –100 nm range are subject to problems associated with pressure induced deformations due to the low modulus (3 MPa) and high compressibility (2.0 N/mm$^2$) of conventional single layer PDMS stamps and molds. First, at aspect ratios less than about 0.3, conventional PDMS patterning devices having wide and shallow relief features tend to collapse upon contact with the surface of the substrate. Second, adjacent features of conventional single layer PDMS patterning devices having closely spaced (<about 200 nm), narrow (<about 200 nm) structures tend to collapse together upon contact with a substrate surface. Finally, conventional PDMS stamps are susceptible to rounding of sharp corners in transferred patterns when a stamp is released from a substrate due to surface tension. The combined effect of these problems is to introduce unwanted distortions into the patterns of materials transferred to a substrate. To minimizing pattern distortions caused by conventional single layer PDMS patterning devices, composite patterning devices comprising multilayer stamps and molds have been examined as a means of generating structures having dimensions less than 100 nm.

Michel and coauthors report microcontact printing methods using a composite stamp composed of a thin bendable layer of metal, glass or polymer attached to an elastomeric layer having a transfer surface with a relief pattern. [Michel et al. Printing Meets Lithography: Soft Approaches to High Resolution Patterning, IBM J. Res. & Dev., Vol. 45, No. 5, pgs 697–719 (September 2001). These authors also describe a composite stamp design consisting of a rigid supporting layer and a polymer backing layer comprising a first soft polymer layer attached to a second harder layer having a transfer surface with a relief pattern. The authors report that the disclosed composite stamp designs are useful for "large area, high-resolution printing applications with feature sizes as small as 80 nm."

Odom and coauthors disclose a composite, two layer stamp design consisting of a thick (≈3 mm) backing layer of 184 PDMS attached to a thin (30–40 microns), layer of h-PDMS having a transfer surface with relief patterns. [Odem et al., Langmuir, Vol. 18, pgs 5314–5320 (2002). The composite stamp was used in this study to mold features having dimensions on the order of 100 nm using soft lithography phase shifting photolithography methods. The authors report that the disclosed composite stamp exhibits increase mechanical stability resulting in a reduction in sidewall buckling and sagging with respect to conventional low modulus, single layer PDMS stamps.

Although use of conventional composite stamps and molds have improved to some degree the capabilities of soft lithography methods for generating features having dimensions in the sub-100 nm range, these techniques remain susceptible to a number of problems which hinder there effective commercial application for high throughput fabrication of micro-scale and nanoscale devices. First, some conventional composite stamp and mold designs have limited flexibility and, thus, do not make good conformal contact with contoured or rough surfaces. Second, relief patterns of conventional, multimaterial PDMS stamps are susceptible to undesirable shrinkage during thermal or ultraviolet curing, which distort the relief patterns on their transfer surfaces. Third, use of conventional composite stamps comprising multilayers having different thermal expansion coefficients can result in distortions in relief patterns and curvature of their transfer surfaces induced by changes in temperature. Fourth, use of stiff and/or brittle backing layers, such as glass and some metal layers, prevents easy incorporation of conventional composite stamps into preexisting commercial printer configurations, such as rolled and flexographic printer configurations. Finally, use of composite stamps having transfer surfaces comprising high modulus elastomeric materials impede formation of conformal contact between a transfer surface and a substrate surface necessary for high fidelity patterning.

It will be appreciated from the foregoing that there is currently a need in the art for methods and devices for fabricating high resolution patterns of structures having features on the scale of 10s to 100s of nanometers. Specifically, soft lithography methods and patterning devices are needed which are capable of fabricating patterns of nanoscale structures having high fidelity, good mechanical robustness and good placement accuracy. In addition, patterning devices are needed that minimize pattern distortions, for example by reducing relief pattern shrinkage during thermal or ultraviolet curing and/or minimizing temperature induced distortions as compared to conventional patterning devices. Finally, soft lithography methods and devices are needed that are compatible with and can be easily integrated into preexisting high speed commercial printing and molding systems.

SUMMARY OF THE INVENTION

The present invention provides methods, devices and device components for fabricating patterns on substrate surfaces, particularly patterns comprising structures having microsized and/or nanosized features of selected lengths in one, two or three dimensions. Specifically, the present invention provides stamps, molds and photomasks used in soft lithography fabrication methods for generating high resolution patterns of structures on flat and contoured surfaces, including surfaces having a large radius of curvature on a wide variety of substrates, including flexible plastic substrates. It is an object of the present invention to provide methods and devices for fabricating three-dimensional structures having well defined physical dimensions, particularly structures comprising well defined features having physical dimensions on the order of 10s of nanometers to 1000s of nanometers. It is another object of the present invention to provide methods, devices and device components for fabricating patterns of structures characterized by high fidelity over large substrate surface areas and good placement accuracy. It is further an object of the present invention to provide composite patterning devices which exhibit better thermal stability and resistance to curing induced pattern distortion than conventional single layer or multilayer stamps, molds and photomasks. It is another object of the present invention to provide soft lithography methods, devices and device components that are compatible with existing high speed commercial printing, molding and embossing techniques, devices and systems.

In one aspect, the present invention provides patterning devices comprising a plurality of polymer layers each having selected mechanical properties, such as Young's Modulus and flexural rigidity, selected physical dimensions, such as thickness, surface area and relief pattern dimensions, and selected thermal properties, such as coefficients of thermal expansion, to provide high resolution patterning on a variety of substrate surfaces and surface morphologies. Patterning devices of this aspect of the present invention include multilayer polymer stamps, molds and photomasks useful for a variety of soft lithographic patterning applications including contact printing, molding and optical patterning. In one embodiment, discrete polymer layers having different mechanical properties, physical dimensions and thermal properties are combined and/or matched to provide patterning devices having cumulative mechanical and thermal properties providing enhanced pattern resolution and fidelity, and improved thermal stability over conventional soft lithography devices. In addition, patterning devices of the present invention comprising a combination of discrete polymer layers tolerate a wide variety of device configurations, positions and orientations without fracture which make them more easily integrated into existing commercial printing, molding and optical patterning systems than conventional single layer or multiple layer stamps, molds and photomasks.

In one embodiment, the present invention provides a composite patterning comprising a first polymer layer having a low Young's modulus and a second polymer layer having a high Young's modulus. The first polymer layer comprises a selected three-dimensional relief pattern having at least one contact surface disposed thereon and has an internal surface opposite the contact surface. The second polymer layer has an external surface and an internal surface. First and second polymer layers are arranged such that a force applied to the external surface of the second polymer layer is transmitted to the first polymer layer. For example, first and second polymer layers may be arranged such that a force applied to the external surface of the second layer is transmitted to at least a portion of the contact surface(s) of the first polymer layer. In an embodiment, the internal surface of the first polymer layer is operationally coupled to the internal surface of the second polymer layer. For example, the internal surface of the first polymer layer may be in physical contact with the internal surface of the second polymer layer. Alternatively, the first polymer layer and the second polymer layer may be connected by one or more connecting layers, such as thin metal layers, polymer layers or ceramic layers, positioned between the internal surface of the first polymer layer and the internal surface of the second polymer layer.

Composite patterning devices of this aspect of the present invention are capable of establishing conformal contact between at least a portion of the contact surface(s) of the first polymer layer and the substrate surface undergoing patterning. Optionally, the second polymer layer may be operationally coupled to an actuator, such as a stamping, printing or molding device, capable of providing an external force to the external side of the second polymer layer so as to bring the patterning device into conformal contact with the substrate surface undergoing patterning. Optionally, the substrate may be operationally coupled to an actuator, capable of bringing the substrate into conformal contact with the patterning device.

Selection of the physical dimensions and Young's modulus of polymer layers in composite patterning devices of the present invention establishes the overall mechanical properties of the composite patterning device, such as the net flexural rigidity and conformability of the patterning device. In an embodiment of the present invention useful for soft lithographic contact printing and molding applications the first polymer layer is characterized by a Young's modulus selected over the range of about 1 MPa to about 10 MPa and a thickness selected over the range of about 1 micron to about 100 microns, and the second polymer layer is characterized by a Young's modulus selected over the range of about 1 GPa to about 10 GPa and a thickness selected over the range of about 10 microns to about 100 microns. Composite patterning devices of the present useful for soft lithographic contact printing applications also include embodiments wherein the ratio of the thickness of the first polymer layer and the thickness of the second polymer layer is selected from the range of about 1 to about 10, preferably equal to about 5 for some applications. In one embodiment, the first polymer is an elastomeric layer, such as a PDMS or h-PDMS layer, the second polymer layer is a thermoplastic or thermoset layer, such as a polyimide layer, and the composite patterning device has a net flexural rigidity selected from the range of about $1\times10^{-7}$ Nm to about $1\times10^{-5}$ Nm.

Use of a low modulus first polymer layer, such as an elastomer layer, is beneficial in the present invention because it provides patterning devices having the capability to establish conformal contact with large areas (up to several $m^2$) of smooth surfaces, flat surfaces, rough surfaces, particularly surfaces having roughness amplitudes up to about 1 micron, and contoured surfaces, preferably surfaces having radii of curvature up to about 25 microns. In addition, use of a low modulus first polymer layer allows conformal contact to be established between the contact surface(s) and large areas of substrate surface using relative low pressures (about 0.1 kN $m^{-2}$ to about 10 kN $m^{-2}$) applied to the external surface of the second polymer layer. For example, a low modulus first polymer layer comprising a PDMS layer having a thickness greater than or equal to about 5 microns establishes reproducible conformal contact over substrate surface areas as large as 250 $cm^2$ upon application of external pressures less than or equal to about 100 N $m^{-2}$. In addition, incorporation of a low modulus first polymer layer into patterning devices of the present invention allows conformal contact to be established in a gradual and controlled manner, thus, avoiding the formation of trapped air pockets between the contact surface of the first layer and a substrate surface. Further, incorporation of a low modulus first polymer layer provides good release characteristics of contact surfaces from substrate surfaces and the surfaces of master relief patterns used to make composite patterning devices of the present invention.

Use of a high modulus second polymer layer in patterning devices of the present invention is beneficial because it provides patterning devices having a net flexural rigidity large enough to minimize distortions of the relief pattern which may occur upon formation of conformal contact between the contact surface(s) and a substrate surface. First, incorporation of a high modulus second polymer layer into patterning devices of the present invention minimizes distortions of the relief pattern in planes parallel to a plane containing the contact surface, such as distortions characterized by the collapse of narrow relief features of patterns having high aspect ratios. Second, incorporation of a high modulus second polymer layer minimizes distortions of the relief pattern in planes which intersect a plane containing the contact surface, such as distortions characterized by sagging of recessed regions of a relief pattern. This reduction in relief pattern distortion provided by incorporation of a high modulus second polymer layer allows patterns of small structures comprising well defined features having physical dimensions as small as 50 nanometers to be fabricated using patterning devices and methods of the present invention.

Use of a high modulus second polymer layer in patterning devices of the present invention is also beneficial because it allows for easy handling and incorporation of patterning devices of the present invention into printing, embossing and molding machines. This attribute of the present invention facilitates mounting, remounting, orienting, maintaining and cleaning of the present patterning devices. Incorporation of a high modulus second polymer layer also improves the accuracy in which patterning devices of the present invention may be brought into contact with a selected region of a substrate surface by a factor of 25 with respect to conventional single layer PDMS stamps, molds and photomasks. For example, incorporation of a 25 micron thick second polymer layer having a Young's modulus equal to or greater than 5 GPa, such as a polyimide layer, allows patterning devices of the present invention to be brought into contact with a substrate surface with a placement accuracy equal to about 1 micron over a substrate area equal to about 232 $cm^2$. Further, use of a flexible and resilient, high modulus second polymer layer allows patterning devices of the present invention to be operated in a range of device configurations and easily integrated into conventional printing and molding systems. For example, use of a second polymer layer having a flexural rigidity of about $7 \times 10^{-6}$ Nm allows integration of pattering devices of the present invention into conventional roller and flexographic printing systems.

In an alternative embodiment, a patterning device of the present invention comprises a unitary polymer layer. The unitary polymer layer comprises a three-dimensional relief pattern having at least one contact surface disposed thereon and a base having an external surface positioned opposite to the contact surface. The contact surface is oriented orthogonal to a layer alignment axis extending through the polymer layer, and the Young's modulus of the polymer layer varies continuously along the layer alignment axis from the contact surface to the external surface of the base. In one embodiment, the Young's modulus of the polymer layer varies continuously along the layer alignment axis from a low value at the contact surface to a high value at the mid point between the contact surface and the external surface along the layer alignment axis. In another embodiment, the Young's modulus of the polymer layer varies continuously from a high modulus value at the mid point between the contact surface and the external surface along the layer alignment axis to a low modulus value at the external surface of the base. Optionally, the polymer layer may also have a substantially symmetrical distribution of the coefficients of thermal expansion about the center of the patterning device along the layer alignment axis. Variation of the Young's modulus in the polymer layer may be achieved by any means known in the art including methods wherein the extent of cross linking in the unitary polymer layer is selectively varied to achieve control of the Young's modulus as a function of position along the layer alignment axis.

Three-dimensional relief patterns useable in the present invention may comprise a singular continuous relief feature or a plurality of continuous and/or discrete relief features. In the present invention, selection of the physical dimensions of relief features or their arrangement in a relief pattern is made on the basis of the physical dimensions and relative arrangements of the structures to be generated on a substrate surface. Relief patterns useable in composite patterning devices of the present invention may comprise relief features having physical dimensions selected over the range of about 10 nanometers to about 10,000 nanometers, preferably selected over the range of about 50 nanometers to about 1000 nanometers for some applications. Relief patterns useable in the present invention may comprise symmetrical patterns of relief features or asymmetrical patterns of relief features. Three-dimensional relief patterns may occupy a wide range of areas, and relief areas selected over the range of about 10 $cm^2$ to about 260 $cm^2$ are preferred for some micro- and nanofabrication applications.

In another embodiment, a composite patterning device of the present invention further comprises a third polymer layer having an internal surface and an external surface. In this three layer embodiment, the first, second and third polymer layers are arranged such that a force applied to the external surface of the third polymer layer is transmitted to the first polymer layer. For example, first, second and third polymer layers may be arranged such that a force applied to the external surface of the third layer is transmitted to at least a portion of the contact surface(s) of the first polymer layer. In an embodiment, the external surface of the second polymer layer is operationally coupled to the internal surface of the third polymer layer. For example, the external surface of the second polymer layer may be in physical contact with the internal surface of the third polymer layer. Alternatively, the second polymer layer and the third polymer layer may be connected by one or more connecting layers, such as thin metal layers, polymer layers or ceramic layers, positioned between the external surface of the second polymer layer and the internal surface of the third polymer layer. Optionally, the third polymer layer may be operationally coupled to an actuator capable of providing an external force to the external side of the third polymer layer so as to bring the contact surface(s) of the patterning device into conformal contact with the substrate surface undergoing patterning. Incorporation of a third polymer layer may also provide a means of handing, positioning, orienting, mounting, cleaning and maintaining composite patterning devices of the present invention.

Incorporation of a third polymer layer having a low young's modulus into composite patterning devices of the present invention is beneficial for some soft lithography applications. First, use of a low Young's modulus third polymer layer allows the force applied to the patterning device to be applied in a gradual and controlled manner, facilitating generation of conformal without formation of trapped air bubbles. Second, integration of a low Young's modulus third polymer layer provides an effective means of uniformly distributing a force applied to the patterning device to the contact surface(s) of the first polymer layer. Uniform distribution of the force applied to the patterning device to the contact surface(s) promotes formation of conformal contact over large areas of the substrate surface and enhances the fidelity of patterns generated on a substrate surface. In addition, uniform distribution of the force applied to the patterning device to the contact surface(s) improves the overall efficiency and energy consumption of the patterning process. An exemplary third polymer layer has a thickness which is several times thicker than the roughness and/or radius of curvature of the substrate surface.

In another aspect, the present invention provides thermally stable composite patterning devices that undergo less thermal induced pattern distortion than conventional single layer and multiple layer stamps, molds and photomasks. Some materials having a low Young's modulus are also characterized by a large coefficient of thermal expansion. For example, PDMS has a Young's modulus of 3 MPa and a coefficient of thermal expansion equal to about 260 ppm. Increases or decreases of temperature, therefore, can result in substantial distortions in relief patterns comprising these materials, particularly for patterning devices having large area relief patterns. Relief pattern distortions caused by changes in temperature may be especially problematic for applications involving fabrication of patterns of structures having features with very small dimensions, such as submicron sized structures, over large areas of substrate In one aspect of the present invention, a plurality of layers having different mechanical properties and/or thermal expansion coefficients are combined and matched in a manner providing patterning devices exhibiting high thermal stability. In another aspect of the present invention, a plurality of layers are combined such that the net thermal expansion properties of the patterning device is matched to the thermal expansion properties of the substrate, preferably matched to with 10% for some applications. In the context of the present description, "high thermal stability" refers to patterning devices exhibiting minimal pattern distortions upon changes in temperature. Composite pattering devices of the present invention having high thermal stability exhibit reduced deformation of relief patterns and contact surfaces caused by stretching, bowing, buckling, expansion and compression induced by changes in temperature, as compared to conventional single layer and multilayer stamps, molds and photomasks. In one embodiment, a high modulus second polymer layer having a low coefficient of thermal expansion, such as a polyimide layer, is operationally coupled to the internal surface of a low modulus first polymer layer having a large coefficient of thermal expansion, such as a PDMS layer or a h-PDMS layer. In this arrangement, integration of a second polymer layer having a high modulus and low coefficient of thermal expansion constrains expansion or contraction of the first polymer layer and, therefore, significantly decreases the extent of stretching or compression of the contact surface(s) and three-dimensional relief pattern induced by increases or decreases in temperature. In one embodiment of this aspect of the present invention, the second polymer layer has a coefficient of thermal expansion less than or equal to about 14.5 ppm and, optionally a thickness that is about five times larger than the thickness of the first layer.

In the present invention, good thermal stability may also be achieved by incorporation of a discontinuous low modulus first layer operationally coupled to a high modulus second layer, preferably a high modulus layer having a low thermal expansion coefficient. In one embodiment, the discontinuous low modulus layer is a three dimensional relief pattern comprising a plurality of discrete relief features. Discrete relief features comprising the low modulus layer are not in contact with each other but are each operationally coupled to the high modulus layer. For example, the pattern of discrete relief features may comprise a pattern of individual islands of low modulus material on the internal surface of the high modulus layer. Incorporation of a first low modulus layer comprising a plurality of discrete relief features into composite patterning devices of the present invention is beneficial because it decreases the extent of the mismatch between thermal expansion properties of the low modulus and high modulus layers. In addition, use of a discontinuous low modulus layer decreases the net amount of material having a high coefficient of thermal expansion, which decreases the net extent of expansion or contraction induced by a change in temperature. In an exemplary embodiment, the discontinuous low modulus layer comprises an elastomer, such as PDMS or h-PDMS, and the high modulus layer comprises polyimide.

In another embodiment of the present invention providing patterning devices having good thermal stability, a plurality of layers are arranged so as to provide a substantially symmetrical distribution of coefficients of thermal expansion, thicknesses or both about the center of the patterning device along a layer alignment axis extending through the patterning device, for example a layer alignment axis positioned orthogonal to the contact surface. In an alternative embodiment also exhibiting good thermal stability, a temperature compensated patterning device of the present invention comprises a unitary polymer layer having a substantially symmetrical distribution of coefficients of thermal expansion about the center of the patterning device along a layer alignment axis extending through the patterning device, for example positioned orthogonal to the contact surface.

The symmetrical distribution of coefficients of thermal expansion, thicknesses or both in these configurations provides a means of compensating for the thermal expansion or compression of one or more layers. The result of this compensation scheme is to minimize buckling, bowing, elongation and compression of the relief pattern induced by changes in temperature. Particularly, a symmetrical distribution of coefficients of thermal expansion and layer thicknesses generates opposing forces having approximately the same magnitude but opposite directions upon a change in temperature. Accordingly, this temperature compensation scheme is used to minimize the magnitude of forces generated upon a change in temperature which act on the contact surface, relief features and three-dimensional relief pattern of the first layer.

An exemplary temperature compensated patterning device of the present invention comprises three layers having mechanical and physical properties selected to provide a substantially symmetrical distribution of thermal expansion coefficients about the center of the device. The first layer comprises a three-dimensional relief pattern having at least one contact surface disposed thereon and an internal surface positioned opposite the contact surface. The first layer also has a low Young's modulus, for example ranging from about 1 MPa to about 10 MPa. The second layer has an internal surface and an external surface, and a high Young's modulus, for example ranging from about 1 GPa to about 10 GPa. The third layer has an internal surface and an external surface. In this three layer embodiment, the first, second and third layers are arranged such that a force applied to the external surface of the third layer is transmitted to the contact surface of the first layer. The thicknesses and thermal expansion coefficients of the first and third layers may be selected to provide a substantially symmetrical distribution of the coefficients of thermal expansion about the center of the patterning device along a layer alignment axis extending through said patterning device, such as a layer alignment axis positioned orthogonal to a plane encompassing at least one contact surface.

An exemplary three layer composite patterning device exhibiting high thermal stability comprises a PDMS first layer, a polyimide second layer and a PDMS third layer. In this embodiment, the thickness of first and third PDMS layers may be substantially equal, for example within 10% of each other, to provide a substantially symmetrical distribution of coefficients of thermal expansion about the center of the device along a layer alignment axis extending orthogonal to the contact surface. In this embodiment, pattern distortions across a 1 cm$^2$ relief pattern less than 150 nanometers for a change in temperature of 1 K are observed for three layer patterning devices of the present invention having first and third PDMS layers comprising the same material, having thicknesses equal to about 5 microns and separated by an approximately 25 micron thick polyimide layer. In an embodiment of the present invention having matched first and third layers providing a substantially symmetrical distribution of coefficients of thermal expansion, the ratio of the relief depth to the thickness of the first layer is kept small (e.g. less than or equal to 0.10) to avoid unwanted temperature induced thermal expansion or contraction corresponding to thermal coefficient mismatching in recessed regions of the relief pattern.

In another aspect, the present invention provides composite patterning devices that undergo less pattern distortion caused by polymerization and curing during fabrication than conventional single layer and multiple layer stamps, photomasks and molds. Many polymers, such as PDMS, undergo a significant decrease in their physical dimensions upon polymerization. As relief patterns used in patterning devices are typically fabricated by initiating polymerization of a prepolymer in contact with a master relief surface, such as a master relief surface generated by conventional photolithography methods, this shrinkage may significantly distort the physical dimensions of relief patterns and contact surfaces of pattering devices comprising polymeric materials, particularly elastomers.

The present invention provides multilayer stamp designs that are less susceptible to deformations caused by polymerization and curing during fabrication. Composite pattering devices of the present invention having decreased susceptibility to curing induced deformations of relief patterns and contact surfaces exhibit less stretching, bowing, buckling, expansion and compression induced by polymerization reactions during fabrication, as compared to conventional single layer and multilayer stamps, molds and photomasks. In one embodiment, a plurality of polymer layers having specific mechanical and thermal expansion characteristics are combined and/or matched in a manner decreasing the net extent of pattern distortion generated upon polymerization and curing during fabrication.

A composite patterning device of the present invention having decreased sensitivity to curing induced deformations of relief patterns and contact surfaces further comprises third and fourth polymer layers, each have internal surfaces and external surfaces. In this four layer embodiment, the first, second, third and fourth polymer layers are arranged such that a force applied to the external surface of the fourth polymer layer is transmitted to the contact surface of the first polymer layer. For example, first, second, third and fourth polymer layers may be arranged such that a force applied to the external surface of the fourth layer is transmitted to at least a portion of the contact surfaces of the first polymer layer. In an embodiment, the external surface of the second polymer layer is operationally coupled to the internal surface of the third polymer layer and the external surface of the third polymer layer is operationally coupled to the internal surface of the fourth polymer layer. Improved resistance to curing and/or polymerization induced distortion may be provided by matching the thicknesses, coefficients of thermal expansion and Young's modulus of the first and third layers and by matching the thicknesses, coefficients of thermal expansion and Young's modulus of the second and fourth layers. The net result of this matched multilayer design is to decrease the extent of curing induced distortions by a factor of about 10 relative to conventional single layer or double layer stamps, molds and photomasks.

Composite patterning devices of the present invention may be fully optically transmissive or partially optically transmissive, particularly with respect to electromagnetic radiation having wavelengths in the ultraviolet and/or visible regions of the electromagnetic spectrum. Patterning devices which transmit visible light are preferred for some applications because they can be visually aligned with a substrate surface. Patterning devices of the present invention may transmit one or more patterns of electromagnetic radiation onto the substrate surface characterized by selected two dimensional distributions of intensities, wavelengths, polarization states or any combination of these. The intensities and wavelengths of electromagnetic radiation transmitted by patterning devices of the present invention may be controlled by introduction of materials into the polymer layers having selected absorption properties, scattering properties and/or reflection properties. In an exemplary embodiment, the patterning device is a partially transparent optical element characterized by a selected two dimensional distribution of absorption coefficients, extinction coefficients, reflectivities or any combination of these parameters. An advantage of this design is that it results in a selected two dimensional distribution of the intensities and wavelengths electromagnetic radiation transmitted to the substrate upon illumination by an optical source, such as a broad band lamp, atomic lamp, blackbody source or laser.

In one embodiment, the present invention comprises an optically transmissive mold capable of transmitting electromagnetic radiation for inducing polymerization reactions in a transfer material disposed between the relief pattern of the first layer of the patterning device and the substrate surface. In another embodiment, the present invention comprises an optically transmissive photomask capable of transmitting a pattern of electromagnetic radiation on to a substrate surface in conformal contact with the contact surface of the first layer of the patterning device. In another embodiment, the present invention comprises an optically transmissive stamp capable of illuminating materials transferred to the surface of a substrate.

The present invention provides highly versatile patterning devices that may be used in a wide range of soft lithography methods, microfabrication methods and nanofabrication methods. Exemplary fabrication methods compatible with the patterning devices of the present invention include, but are not limited to, nanotransfer and/or microtransfer printing, nanotransfer and/or microtransfer molding, replica molding, nanomolding and micromolding in capillaries, near field phase shift lithography, and solvent assisted nanomolding and micromolding. In addition, patterning devices of the present invention are compatible with a wide variety of contact surface orientations including but not limited to planar, contoured, convex and concave contact surface configurations, which allow their integration into many different printing, molding and masking systems. In some applications, the coefficient of thermal expansion and thickness of polymer layers comprising a patterning device of the present invention are selected such that the net thermal expansion properties of the patterning device matches the thermal expansion properties of the substrate undergoing patterning. Matching thermal properties of the patterning device and the substrate is beneficial because it results in improved placement accuracy and fidelity of patterns fabricated on substrate surfaces.

In another aspect, the present invention provides methods of generating one or more patterns on a substrate surface by contact printing a transfer material, including methods of microtransfer contact printing and nanotransfer contact printing. In one embodiment, a transfer material is deposited onto the contact surface of a composite patterning device of the present invention, thereby generating a layer of transfer material on the contact surface. Deposition of transfer material onto the contact surface may be achieved by any means known in the art including, but not limited to, vapor deposition, sputtering deposition, electron beam deposition, physical deposition, chemical deposition dipping and other methods which involve bringing the contact surface into contact with a reservoir of transfer material. The patterning device is contacted to the substrate surface in a manner establishing conformal contact between at least a portion of the contact surface and the substrate surface. Establishing conformal contact exposes at least a portion of the layer of transfer material to the substrate surface. To generate a pattern on the substrate surface, the patterning device is separated from the substrate surface, thus transferring at least a portion of the transfer material to the substrate surface. The present invention also includes fabrication methods wherein these steps are sequentially repeated to construct complex structures comprising patterned multilayer stacks.

In another aspect, the present invention provides methods of generating one or more patterns on a substrate surface by molding a transfer material, such as micromolding and nanomolding methods. In one embodiment, a composite patterning device of the present invention is brought into contact with a substrate surface in a manner establishing conformal contact between at least a portion of the contact surface and the substrate surface. Conformal contact generates a mold comprising the space separating the three-dimensional relief pattern and the substrate surface. A transfer material, such as a prepolymer, is introduced into the mold. To generate a pattern on the substrate surface, the patterning device is separated from the substrate surface, thus transferring at least a portion of the transfer material onto the substrate surface. Optionally, methods of the present invention may further comprise the steps of heating the transfer material in the mold, exposing the transfer material in the mold to electromagnetic radiation or adding a polymerization activator to the transfer material in the mold to initiate chemical changes such as polymerization and/or cross linking chemical reactions.

In another aspect, the present invention provides methods of generating one or more patterns on a substrate surface by contact photolithography. In one embodiment, a composite patterning device of the present invention is brought into contact with a substrate surface comprising one or more radiation sensitive materials in a manner establishing conformal contact between at least a portion of the contact surface and the substrate surface. Electromagnetic radiation is directed through the patterning device and onto the surface of the substrate, thereby generating a pattern of electromagnetic radiation on the substrate surface having selected two dimensional distributions of intensities, wavelengths and/or polarization states. Interactions between electromagnetic radiation and radiation sensitive materials of the substrate generate chemically and/or physically modified regions of the substrate surface, thereby generating one or more patterns on the substrate surface. Optional, methods of the present invention may further comprise the steps of removing at least a portion of the chemically modified regions of the substrate surface or removing at least a portion of the substrate surface which is not chemically modified. Material removal in this aspect of the present invention may be achieved by any means known in the art of photolithography, including but not limited to, chemical etching and exposure to chemical agents, such as solvents.

The methods, devices and device components of the present invention are capable of generating patterns on the surfaces of a wide variety of substrates including but not limited to, plastics, glasses, carbonaceous surfaces, metals, textiles, ceramics or composites of these materials. The methods, devices and device components of the present invention are also capable of generating patterns on substrate surfaces having a wide range of surface morphologies, such as rough surfaces, smooth surfaces, contoured surfaces and flat surfaces. Important in fabricating high resolution patterns characterized by good placement accuracy and high fidelity is the use of conformable contact surfaces that support strong associations between the molecules comprising a substrate surface and molecules of the contact surface. For example, PDMS contact surfaces undergo strong Vander Waals interactions with many substrate surfaces including surfaces comprised of plastics, polyimide layers, glasses, metals, metalloids, silicon and silicon oxides, carbonaceous materials, ceramics, textiles and composites of these materials.

The methods of the present invention are capable of fabricating microscale and nanoscale structures having a wide variety of physical dimensions and relative arrangements. Symmetrical and asymmetrical three-dimensional structures may be fabricated by the present methods. The present methods, devices and device components may be used to generate patterns comprising one or more structures having features with dimensions ranging from about 10 nanometers to about 100 microns or more preferably for some applications ranging from about 10 nanometer to about 10 microns. Structures generated by the present methods, devices and device components may have selectable lengths in two or three physical dimensions, and may comprise patterned multilayer stacks. The present methods may also be used to generate structures comprising self assembled monolayers and structures. The methods, devices and device components of the present invention are capable of generating patterns comprising a wide range of materials including, but not limited to, metals, organic compounds, inorganic compounds, colloidal materials, suspensions, biological molecules, cells, polymers, microstructures, nanostructures and salt solutions.

In another aspect, the present invention comprises methods of making composite patterning devices. An exemplary method of making a composite pattering device comprises the steps of: (1) providing a master relief pattern having a selected three-dimensional relief pattern; (2) contacting the master relief pattern with a prepolymer of a low modulus polymer; (3) contacting the prepolymer material with an high modulus polymer layer; (4) polymerizing the prepolymer, thereby generating a low modulus polymer layer in contact with the high modulus polymer layer and in contact with the master relief pattern; the low modulus layer having a three-dimensional relief pattern and (5) separating the low modulus layer from the master relief pattern, thereby making the composite patterning device. Master relief patterns useable in the present methods include relief patterns prepared using photolithography methods. In the present invention, polymerization may be initiated using any method known in the art including, but not limited to, thermal induced polymerization methods and electromagnetic radiation induced polymerization methods.

BRIEF DESCRIPTION OF THE DRAWINGS

FIG. 1A is a schematic showing a cross sectional view of a composite patterning device of the present invention comprising two polymer layers. FIG. 1B is a schematic showing a cross sectional view of another composite patterning device of the present invention comprising two polymer layers and exhibiting high thermal stability. FIG. 1C is a schematic showing a cross sectional view of a composite patterning device of the present invention comprising three polymer layers and exhibiting high thermal stability. FIG. 1D is a schematic showing a cross sectional view of a composite patterning device of the present invention comprising four polymer layers and exhibiting good resistance to pattern deformations caused by polymerization and/or curing during fabrication

FIG. 3A is a schematic diagram illustrating a method for making a composite patterning device of the present invention. FIG. 3B is a schematic diagram illustrating an alternative method for making a composite patterning device of the present invention

FIG. 6A corresponds to a conventional single layer PDMS stamp and FIG. 6B corresponds to a composite stamp of the present invention.

FIG. 13A is a schematic illustrating a two layer composite stamp comprising a PDMS layer of variable thickness operationally coupled to a 25 micron Kapton layer. FIG. 13B is a plot of the predicted horizontal distortion as a function of the thickness of the PDMS first layer. FIG. 13C is a plot of the predicted horizontal distortion as a function of the distance along the external surface of the PDMS first layer.

FIGS. 14A and 14B provide schematic diagrams illustrating a fiber reinforced composite stamp of the present invention. FIG. 14A provides a cross sectional view and FIG. 14B provides a perspective view.

FIG. 18 provides a process flow diagram illustrating a method of making a composite soft conformal photomask of the present invention.

FIGS. 19A and 19B provide schematic diagrams showing alignment systems using a patterning agent for aligning a photomask and substrate.

DETAILED DESCRIPTION OF THE INVENTION

Figure 2A:
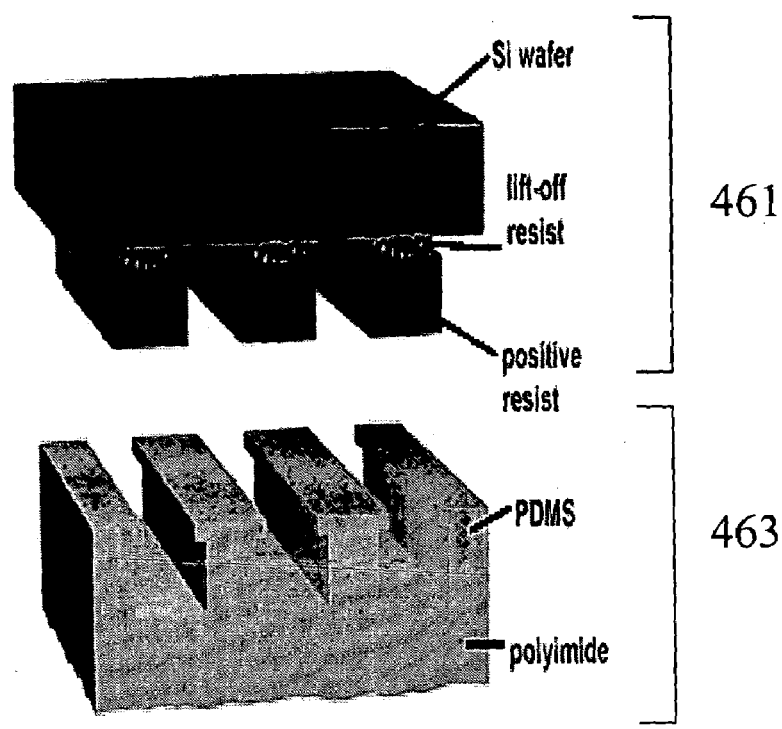
FIG. 2A is a schematic showing an exemplary master relief pattern and an exemplary patterning device fabricated from this master relief pattern.

Referring to the drawings, like numerals indicate like elements and the same number appearing in more than one drawing refers to the same element. In addition, hereinafter, the following definitions apply:

"Coefficient of thermal expansion" refers to a parameter which characterizes the change in size that a material undergoes upon experiencing a change in temperature. Linear thermal expansion coefficient is a parameter which characterizes the change in length a material undergoes upon experiencing a change in temperature and may be expressed by the equation:

$$\Delta L = \alpha L_O \Delta T \quad (I)$$

wherein $\Delta L$ is the change in length, $\alpha$ is the linear coefficient of thermal expansion, $L_O$ is the initial length and $\Delta T$ is the change in temperature. The present invention provides composite, multilayer patterning devices wherein thermal properties and physical dimensions of discrete layers are selected to provide a substantially symmetrical distribution of coefficients of thermal expansion about the center of the device along a layer alignment axis extending through the device.

"Placement accuracy" refers to the ability of a pattern transfer method or device to generate a pattern in a selected region of a substrate. "Good placement" accuracy refers to methods and devices capable of generating patterning in a select region of a substrate with spatial deviations from the absolutely correct orientation less than or equal to 5 microns, particularly for generating patterns on plastic substrates.

"Fidelity" refers to a measure of the similarity of a pattern transferred to a substrate surface and a relief pattern on a patterning device. Good fidelity refers to similarities between a pattern transferred to a substrate surface and a relief pattern on a patterning device characterized by deviations less than 100 nanometers.

"Young's modulus" is a mechanical property of a material, device or layer which refers to the ratio of stress to strain for a given substance. Young's modulus may be provided by the expression;

$$E = \frac{(\text{stress})}{(\text{strain})} = \left(\frac{L_0}{\Delta L} \times \frac{F}{A}\right); \quad \text{(II)}$$

wherein E is Young's modulus, $L_0$ is the equilibrium length, $\Delta L$ is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}; \quad \text{(III)}$$

wherein $\lambda$ and $\mu$ are Lame constants. Young's modulus may be expressed in units of force per unit area, such as Pascal (Pa=N m$^{-2}$).

High Young's modulus (or "high modulus") and low Young's modulus (or "low modulus") are relative descriptors of the magnitude of Young's modulus in a given material, layer or device. In the present invention, a High Young's modulus is larger than a low Young's modulus, preferably about 10 times larger for some applications, more preferably about 100 times larger for other applications and even more preferably about 1000 times larger for yet other applications. In one embodiment, a material having a high Young's modulus has a Young's modulus selected over the range of about 1 GPa to about 10 GPa and a material having a low Young's modulus has a Young's modulus selected over the range of about 1 MPa to about 10 MPa.

"Conformal contact" refers to contact established between surfaces and/or coated surfaces, which may be useful for fabricating structures on a substrate surface. In one aspect, conformal contact involves a macroscopic adaptation of one or more contact surfaces of a composite patterning device to the overall shape of a substrate surface. In another aspect, conformal contact involves a microscopic adaptation of one or more contact surfaces of a composite patterning device to a substrate surface leading to an intimate contact with out voids. The term conformal contact is intended to be consistent with use of this term in the art of soft lithography. Conformal contact may be established between one or more bare contact surfaces of a composite patterning device and a substrate surface. Alternatively, conformal contact may be established between one or more coated contact surfaces, for example contact surfaces having a transfer material and/or patterning agent deposited thereon, of a composite patterning device and a substrate surface. Alternatively, conformal contact may be established between one or more bare or coated contact surfaces of a composite patterning device and a substrate surface coated with a material such as a transfer material, patterning agent, solid photoresist layer, prepolymer layer, liquid, thin film or fluid. In some embodiments of the present invention, pattering devices of the present invention are capable of establishing conformal contact with flat surfaces. In some embodiments of the present invention, pattering devices of the present invention are capable of establishing conformal contact with contoured surfaces. In some embodiments of the present invention, pattering devices of the present invention are capable of establishing conformal contact with rough surfaces. In some embodiments of the present invention, pattering devices of the present invention are capable of establishing conformal contact with smooth surfaces.

"Flexural rigidity" is a mechanical property of a material, device or layer which refers to the ability of a material, device or layer to be deformed. Flexural rigidity may be provided by the expression:

$$D = \frac{Eh^3}{12(1-v^2)} \quad \text{(IV)}$$

wherein D is flexural rigidity, E is Young's modulus, h is thickness and $v$ is the Poisson ratio. Flexural rigidity may be expressed in units of force multiplied by unit length, such as Nm.

"Polymer" refers to a molecule comprising a plurality of repeating chemical groups, typically referred to as monomers. Polymers are often characterized by high molecular masses. Polymers useable in the present invention may be organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyamide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Elastomer" refers to a polymeric material which can be stretched or deformed and return to its original shape without substantial permanent deformation. Elastomers commonly undergo substantially elastic deformations.

Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, silicon containing polymers such as polysiloxanes including poly(dimethyl siloxane) (i.e PDMS and h-PDMS), poly(methyl siloxane), partially alkylated poly(methyl siloxane), poly(alkyl methyl siloxane) and poly(phenyl methyl siloxane), silicon modified el;astomers, thermoplastic elastomers, styrenic materials, olefenic materials, polyolefin, polyurethane thermoplastic elastomers, polyamides, synthetic rubbers, polyisobutylene, poly(styrene-butadiene-styrene), polyurethanes, polychloroprene and silicones.

"Polymer layer" refers to a layer that comprises one or more polymers. Polymer layers useful in the present invention may comprise a substantially pure polymer layer or a layer comprising a mixture of a plurality of different polymers. Polymer layers useful in the present invention also include multiphase polymeric layers and/or composite polymeric layers comprising a combination of one or more polymer and one or more additional material, such as a dopant or structural additive. Incorporation of such additional materials into polymer layers of the present invention is useful for selecting and adjusting the mechanical properties of polymer layers, such as the Young's modulus and the flexural rigidity. The distribution of additional materials in composite polymer layers may be isotropic, partially isotropic or non isotropic. Useful in composite polymeric layers of the present invention comprise one or more polymer (i) in combination with fibers, such as glass fibers or polymeric fibers, (ii) in combination with particles, such as silicon particles and/or nanosized particles, and/or (iii) in combination with other structural enhancers. In an embodiment of the present invention, a polymer layer having a high Young's modulus comprises a polymer having a Young's modulus selected over the range of about 1 GPa to about 10 GPa. Exemplary high Young's modulus polymer layers may comprise polyimide, polyester, polyetheretherketone, polyethersulphone, polyetherimide, polyethyleneapthalate, polyketones, poly(phenylene sulfide) any combinations of these materials or other polymeric materials having similar mechanical properties. In an embodiment of the present invention, a polymer layer having a low Young's modulus comprises a polymer having a Young's modulus selected over the range of about 1 MPa to about 10 MPa. Exemplary low Young's modulus polymer layers may comprise elastomers such as, PDMS, h-PDMS polybutadiene, polyisobutylene, poly(styrene-butadiene-styrene), polyurethanes, polychloroprene and silicones.

"Composite" refers to a material, layer, or device that comprises more than one component, such as more than one material and/or phase. The present invention provides composite patterning devices comprising a plurality of polymer layers having different chemical compositions and mechanical properties. Composite polymer layers of the present invention include layers comprising a combination of one or more polymer and a fiber, such as a glass or elastomeric fiber, particulate, such as nanoparticles or microparticles or any combinations of these.

"Elastomer" refers to a polymeric material which can be stretched or deformed and return to its original shape without substantial permanent deformation. Elastomers commonly undergo substantially elastic deformations. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, PDMS, h-PDMS, polybutadiene, polyisobutylene, poly(styrene-butadiene-styrene), polyurethanes, polychloroprene and silicones.

The term "electromagnetic radiation" refers to waves of electric and magnetic fields. Electromagnetic radiation useful for the methods of the present invention includes, but is not limited to, gamma rays, X-rays, ultraviolet light, visible light, infrared light, microwaves, radio waves or any combination of these.

The terms "intensity" and "intensities" refers to the square of the amplitude of an electromagnetic wave or plurality of electromagnetic waves. The term amplitude in this context refers to the magnitude of an oscillation of an electromagnetic wave. Alternatively, the terms "intensity" and "intensities" may refer to the time average energy flux of a beam of electromagnetic radiation or plurality of electromagnetic radiation, for example the number of photons per square centimeter per unit time of a beam of electromagnetic radiation or plurality of beams of electromagnetic radiation.

"Actuator" refers to a device, device component or element capable of providing a force and/or moving and/or controlling something. Exemplary actuators of the present invention are capable of generating a force, such as a force that is used to bring a patterning device into contact, such as conformal contact, with a substrate surface.

"Layer" refers to an element of a composite patterning device of the present invention. Exemplary layers have physical dimensions and mechanical properties which provide composite patterning devices capable of fabricating patterns on substrate surfaces having excellent fidelity and good placement accuracy. Layers of the present invention may be a continuous or unitary body or may be a collection of discontinuous bodies, such as a collection of relief features. Layers of the present invention may have a homogenous composition or an inhomogeneous composition. An embodiment of the present invention provides a composite patterning device comprising a plurality of layers, such as polymer layers. Layers in the present invention may be characterized in terms of their thickness along a layer alignment axis which extends through a patterning device, such as a layer alignment axis which is positioned orthogonal to a plane containing one or more contact surfaces.

"Thermally stable" refers to the characteristic of a device or device component to withstand a change in temperature without a loss of characteristic properties, such as the physical dimensions and spatial distribution of relief features of a relief pattern.

"Substantially symmetrical distribution of the coefficients of thermal expansion about the center of a patterning device" refers to a device configuration wherein the mechanical and thermal properties of one or more layers comprising a patterning device are selected such that there is a substantially symmetrical distribution about the center of the patterning device along a layer alignment axis, for example a layer alignment axis which is oriented perpendicular to a plane containing one or more contact surfaces. In one embodiment, the coefficients of thermal expansion are characterized by a symmetrical distribution about the center of the patterning device with deviations from an absolutely symmetric distribution less than about 10%. In another embodiment, the coefficients of thermal expansion are characterized by a symmetrical distribution about the center of the patterning device with deviations from an absolutely symmetric distribution less than about 5%.

"Operationally coupled" refers to a configuration of layers and/or device components of composite patterning devices of the present invention. Operationally coupled layers or device components, such as first, second, third and/or fourth polymer layers, refers to an arrangement wherein a force applied to a layer or device component is transmitted to another layer or device component. Operationally coupled layers or device components may be in contact, such as layers having internal and/or external surfaces in physical contact. Alternatively, operationally coupled layers or device components may be connected by one or more connecting layers, such as thin metal layers, positioned between the internal and/or external surfaces of two layers or device components.

In the following description, numerous specific details of the devices, device components and methods of the present invention are set forth in order to provide a thorough explanation of the precise nature of the invention. It will be apparent, however, to those of skill in the art that the invention can be practiced without these specific details.

This invention provides methods, devices and device components for fabricating patterns on substrate surfaces, such as patterns comprising microsized structures and/or nanosized structures. The present invention provides composite patterning devices, such as stamps, molds and photomasks, exhibit enhanced thermal stability and resistance to curing induced pattern distortions. The methods, devices and device components of the present invention are capable of generating high resolution patterns exhibiting good fidelity and excellent placement accuracy.

FIG. 1A is a schematic showing a cross sectional view of a composite patterning device of the present invention comprising two polymer layers. The illustrated composite patterning device 100 comprises a first polymer layer 110 having a low Young's modulus and a second polymer layer 120 having a high Young's modulus. First polymer layer 110 comprises a three-dimensional relief pattern 125 having a plurality of relief features 133 separated by a plurality of recessed regions 134. First polymer layer 110 also has a plurality of contact surfaces 130 positioned opposite to an internal surface 135. The present invention includes embodiments wherein contact surfaces 130 occupy a common plane and embodiments wherein contact surfaces 130 occupy more than one plane. Second polymer layer 120 has an internal surface 140 and an external surface 150. In the embodiment shown in FIG. 1A, the internal surface 135 of first polymer layer 110 is positioned in contact with internal surface 140 of second polymer layer 120. Optionally, second polymer layer 120 is operationally connected to actuator 155 which is capable of directing a force (schematically shown as arrows 156) onto external surface 150.

First polymer layer 110 and second polymer layer 120 may be coupled in any manner allowing a force exerted on external surface 150 to be transmitted effectively to contact surfaces 130. In exemplary embodiments, first polymer layer 110 and second polymer layer 120 are coupled via covalent bonding between the polymers comprising each layer. Alternatively, first polymer layer 110 and second polymer layer 120 may be coupled by attractive intermolecular forces between each layer, such as Van der Waals forces, dipole-dipole forces, hydrogen bonding and London forces. Alternatively, first polymer layer 110 and second polymer layer 120 may be coupled by an external layer alignment system, such as clamping, fastening and/or bolting systems. Alternatively, first polymer layer 110 and second polymer layer 120 may be coupled using one or more connecting layers (not shown in FIG. 1A), such as thin metal layers, positioned between internal surface 135 and internal surface 140. Coupling of first polymer layer 110 and second polymer layer 120 via strong covalent bonding and/or attractive intermolecular forces is preferred for some applications because is provides good mechanical rigidity to relief features 133 and recessed areas 134, and also provides an effective means of evenly distributing forces applied to external surface 150 to contact surfaces 130.

In the exemplary embodiment shown in FIG. 1A, the composition, Young's modului and/or thicknesses along a layer alignment axis 160 positioned orthogonal to a plane including contact surfaces 130 of first polymer layer 110 are selected to provide mechanical properties of patterning device 100 that allow fabrication of high resolution patterns of microsized and/or nanosized structures which exhibit reduced pattern distortions. In addition, the Young's modului and/or thicknesses of first polymer layer 110 and second polymer layer 120 may also be selected to provide easy integration of the patterning device 100 into commercial printing and molding systems. In an exemplary embodiment, first polymer layer 110 comprises a PDMS layer having a thickness along the layer alignment axis 160 selected from the range of about 5 microns to about 10 microns. The thickness of first polymer layer 110 may alternatively be defined in terms of the shortest distance between contact surfaces 130 and internal surface 140 of second polymer layer 120. In an exemplary embodiment, second polymer layer 120 comprises a polyimide layer having a thickness along the layer alignment axis equal to about 25 microns. The thickness of second polymer layer 120 may alternatively be defined in terms of the shortest distance between the internal surface 140 and external surface 150 of second polymer layer 120.

To fabricate patterns comprising one or more structures, the composite patterning device 100 and surface 185 of substrate 180 are brought into contact with each other, preferably contact establishing conformal contact between at least a portion of contact surfaces 130 and substrate surface 185. Conformal contact between these surfaces may be achieved by application of an external force (schematically represented by arrows 156) onto external surface 150 in a manner moving patterning device 100 into contact with substrate 180. Alternatively, an external force (schematically represented by arrows 190) may be applied to substrate 180 in a manner moving substrate 180 into contact with the patterning device 100. The present invention also includes embodiments wherein conformal contact is established by a combination of these forces (156 and 190) and motions of substrate 180 and patterning device 100.

FIG. 1B is a schematic showing a cross sectional view of another composite patterning device of the present invention exhibiting high thermal stability comprising two polymer layers. As shown in FIG. 1B, the composite patterning device 200 comprises a discontinuous first polymer layer 210 having a low Young's modulus operationally connected to second polymer layer 120 having a high Young's modulus. In this embodiment, discontinuous first polymer layer 210 comprises a three dimensional relief pattern 225 comprising a plurality of discrete relief features 233 separated by a plurality of recessed regions 234. As shown in FIG. 1B, discrete relief features 233 do not contact each other but are each operationally coupled to the second polymer layer 120. Incorporation of a first polymer layer comprising a plurality of discrete relief features into composite patterning devices of the present invention is beneficial because it decreases the extent of the mismatch between thermal expansion properties of the first and second polymer layers 210 and 120, and also decreases the net amount of material in the first polymer layer 210, which may comprise a material having a high coefficient of thermal expansion, such as PDMS FIG. 1C is a schematic showing a cross sectional view of another composite patterning device of the present invention exhibiting high thermal stability comprising three polymer layers. The illustrated composite patterning device 300 further comprises third polymer layer 310 having an internal surface 315 and an external surface 320. In the embodiment illustrated in FIG. 1C, the internal surface 315 of third polymer layer 310 is in contact with the external surface 150 of second polymer layer 120. Optionally, third polymer layer 310 is operationally coupled to actuator 155 which is capable of directing a force (schematically shown as arrows 156) onto external surface 320.

In the embodiment shown in FIG. 1C, the thickness 330 of third polymer layer 310 along layer alignment axis 160 is approximately equal to the thickness 340 of first polymer layer 110 along layer alignment axis 160, preferably within 10% for some applications. In this embodiment, selection of third polymer layer 310 and first polymer layer 110 having the same or similar (e.g. within 10%) coefficients of thermal expansion, such as both layers comprising PDMS layers, provides for high thermal stability and resistance to pattern distortions induced by changes in temperature. Particularly, this arrangement provides a substantially symmetrical distribution of the coefficients of thermal expansion about the center (indicated by center line axis 350) of patterning device 300 along layer alignment axis 160. A symmetrical distribution of the coefficients of thermal expansion provides for generation of opposing forces upon a change in temperature which minimizes the extent of stretching, bowing, buckling, expansion and compression of relief pattern 125, relief features 133 and contact surfaces 130.

FIG. 1D is a schematic showing a cross sectional view of a four layer composite patterning device of the present invention exhibiting good resistance to pattern deformations caused by polymerization and/or curing during fabrication. The illustrated composite patterning device 400 further comprises fourth polymer layer 410 having an internal surface 415 and an external surface 420. In the embodiment, illustrated in FIG. 1D, the internal surface 415 of fourth polymer layer 410 is in contact with the external surface 320 of third polymer layer 310. Optionally, fourth polymer layer 410 is operationally connected to actuator 155 which is capable of directing a force (schematically shown as arrows 156) onto external surface 420.

In the embodiment shown in FIG. 1D, the thickness 330 of third polymer layer 310 along layer alignment axis 160 is approximately equal to the thickness 340 of first polymer layer 110 along layer alignment axis 160, preferably within 10% for some applications, and the thickness 430 of fourth polymer layer 410 along layer alignment axis 160 is approximately equal to the thickness 440 of second polymer layer 120 along layer alignment axis 160, preferably within 10% for some applications. In this embodiment, selection of third polymer layer 310 and first polymer layer 110 having the same coefficients of thermal expansion and Young's modulus, such as both layers comprising PDMS layers, and selection of fourth polymer layer 410 and second polymer layer 120 having the same coefficients of thermal expansion and Young's modulus, such as both layers comprising polyimide layers, provides for good resistance to pattern distortions caused by polymerization and/or curing during fabrication. Particularly, this arrangement minimizes the extent of stretching, bowing, buckling, expansion and compression of relief pattern 125 and contact surfaces 130 during polymerization and/or curing.

Surfaces of polymer layers including first, second third and fourth layers in the present invention may possess specific relief patterns, such as alignment channels and/or grooves, useful for providing proper alignment between layers. Alternatively, surfaces of polymer layers in the present invention may possess specific relief patterns, such as alignment channels and/or grooves, useful for providing proper alignment between a composite patterning device and an actuator such as a printing device, molding device or contact photolithography apparatus having complimentary (i.e. mating) channels and/or grooves. Alternatively, surfaces of polymer layers in the present invention may possess specific relief patterns, such as alignment channels and/or grooves, useful for providing proper alignment between a composite patterning device and substrate surface having complimentary (i.e. mating) channels and/or grooves. As will be understood by a person of ordinary skill in the art, use of such "lock and key" alignment mechanisms, channels, grooves and systems are well known in the art of microfabrication, and may easily be integrated into the patterning devices of the present invention.

Selection of the composition, physical dimensions and mechanical properties of polymer layers in composite patterning devices of the present invention depends largely on the material transfer method to be employed (e.g. printing, molding etc.) and the physical dimensions of the structures/patterns to be fabricated. In this sense, the composite patterning device specifications of the present invention may be regarded as selectably adjustable for a particular functional task or pattern/structure dimensions to be accomplished. For example, a two layer patterning device of the present invention useful for printing nanosized structures via soft lithographic methods may comprise an elastomeric first polymer layer having a thickness selected from the range of about 1 micron to about 5 microns, and a second polymer layer comprising a polyimide layer having a thickness less than or equal to about 25 microns. In contrast, a two layer patterning device of the present invention useful for micro-molding structures having dimensions ranging from about 10 microns to about 50 microns may comprise an elastomeric first polymer layer having a thickness selected from the range of about 20 microns to about 60 microns, and a second polymer layer comprising a polyimide layer having a thickness selected over the range of about 25 microns to about 100 microns.

Composite patterning devices of the present invention, such as stamps, molds and photomasks, may be made by any means known in the art of material science, soft lithography and photolithography. An exemplary patterning device of the present invention is prepared by fabricating a first polymer layer comprising an elastomer by casting and curing polydimethylsiloxane (PDMS) prepolymer (Dow Corning Sylgard 184) against a master relief pattern consisting of patterned features of photoresist (Shipley 1805) prepared by conventional photolithographic means. Master relief patterns useful in the present invention may be fabricated using conventional contact mode photolithography for features larger than about 2 microns or using electron beam lithography for features smaller than about 2 microns. In an exemplary method, PDMS (Sylgard 184 from Dow Corning) or h-PDMS (VDT-731, Gelest Corp) are mixed and degassed, poured over the masters and cured in an oven at about 80 degrees Celsius. Alternatively, curing of 184

PDMS may be performed at room temperature using extra amounts of curing agent. First polymer layers comprising PDMS or h-PDMS are preferably cured in the presence of the second high modulus layer, such as a polyimide layer, to reduce shrinkage induced by curing and/or polymerization. In one embodiment, the internal surface of the polyimide layer is roughened prior to being brought into contact with the PDMS prepolymer to enhance the strength of the binding of the PDMS first layer to the polyimide second layer upon curing of the PDMS prepolymer. Surface roughening of the polyimide layer may be achieved by any means known in the art including exposing the internal surface of the polyimide layer to a plasma.

Fabrication and curing of the additional layers in composite patterning devices, for example high modulus second polymer layers, is preferably done simultaneously with preparation of the elastomeric first layer to minimize the extent of curing and/or polymerization induced shrinkage of the relief pattern and contact surfaces of the elastomeric first layer. Alternatively, a high modulus second polymer layer, for example polyimide layer, may be attached to the first polymer layer using an adhesive or connecting layer, such as a thin metal layer.

Figure 2B:
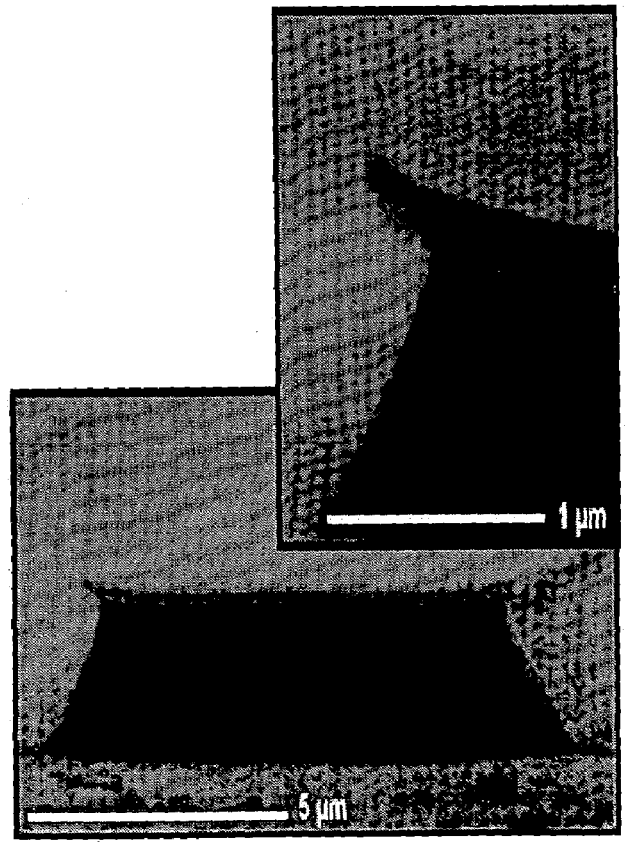
FIG. 2B shows a scanning electron microscopy image of the relief structure of an exemplary patterning device comprising a composite stamp made using the methods of the present invention.

An exemplary master relief pattern was fabricated using a positive photoresist (S1818, Shipley) and lift off resist (LOR1A; micron Chem.). In this exemplary method, test grade approximately 450 micron thick silicon wafers (Montco Silicon Technologies) were cleaned with acetone, iso-propanol and deionized water and then dried on a hotplate at 150 degrees Celsius for 10 minutes. LOR 1A resin was spin-coated at 3000 rpm for 30 seconds and then pre-baked on a hot plate at 130 degrees C. for five minutes. Next, the S1818 resin was spin coated at 3000 rpm for 30 seconds and backed on a hot plate for 110 degrees Celsius for five minutes. The resulting bilayer (approximately 1.7 microns thick) was exposed ($\square$=365 nm, 16.5 mW/cm$^2$) for 7 seconds with an optical contact aligner (Suss Microtech MJB3) using a chromium ion glass mask, and then developed (MF-319; Shipley) for 75 seconds. The development removed all the S1818 resist that was photoexposed. It also removed, in a roughly isotropic manner, the LOR 1A in both the exposed and unexposed regions. The result of this process is a pattern of S1818 on LOR 1A with regions of bare substrate in the exposed areas and slight undercuts at the edges of the patterns. Composite patterning devices comprising stamps were prepared from this master relief pattern using standard soft lithographic procedures of casting and curing PDMS against the master relief pattern. FIG. 2A is a schematic showing an exemplary master relief pattern 461 and an exemplary patterning device 463 fabricated from this master relief pattern. FIG. 2B shows a scanning electron microscopy image of the relief structure of an exemplary patterning device comprising a composite stamp made using the methods of the present invention.

FIG. 3A is a schematic diagram illustrating a method for making a composite patterning device of the present invention. As shown in processing step A of FIG. 3A, the patterning device may be prepared by spin coating a prepolymer of PDMS on a master relief pattern comprising resin relief features on silicon. Optionally, the master relief pattern may be treated with a self assembled monolayer of material to minimize adhesion of the PDMS first layer to the master. As shown in processing step B of FIG. 3A, the PDMS first layer may be fabricated by curing for a few hours using a hot plate and a curing temperature between about 60 and about 80 degrees Celsius. After curing, a thin film of titanium, gold or a combination of both may be deposed on the internal surface of the PDMS first layer via electron beam evaporation methods, as shown in processing step C of FIG. 3A. A thin film of titanium, gold or mixture of both may also be deposed on the internal surface of the high modulus second polymer layer (see step C of FIG. 3A). First and second layers are operationally coupled via cold welding the coated internal surfaces of the first and second layers, and the composite patterning device may be separated from the master relief pattern, as shown in processing step D and E of FIG. 3A, respectively.

FIG. 3B shows an alternative method of fabricating a composite multilayer patterning device of the present invention. As shown in processing step A of FIG. 3B, the internal surface of a high modulus second layer is coated with titanium, silicon oxide or a combination of both. The coated internal side of the high modulus second layer is brought into contact with a master relief spin coated with a PDMS prepolymer and pressure is applied to the external surface of the high modulus second layer, as shown in processing step B of FIG. 3B. This configuration allows the thickness of the layer of PDMS prepolymer to be selectably adjusted by spinning the master relief pattern and/or applying pressure to the external surface of the high modulus second layer with a flat or rocker based press. Upon achieving a desired thickness, the PDMS prepolymer is cured for a few hours in an oven using curing temperature ranging from about 60 to 80 degrees Celsius, thereby forming the PDMS first layer, as shown in processing step C of FIG. 3B. Finally, the composite patterning device is separated from the master relief pattern. Optionally, this method includes the step of treating the master relief pattern with a self assembled monolayer of material to minimize adhesion of the PDMS first layer to the master.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. Methods and devices useful for the present methods can include a large number of optional device elements and components including, additional polymer layers, glass layers, ceramic layers, metal layers, microfluidic channels and elements, actuators such as rolled printers and flexographic printers, handle elements, fiber optic elements, birefringent elements such as quarter and half wave plates, optical filters such as FP etalons, high pass cutoff filters and low pass cutoff filters, optical amplifiers, collimation elements, collimating lens, reflectors, diffraction gratings, focusing elements such as focusing lens and reflectors, reflectors, polarizers, fiber optic couplers and transmitters, temperature controllers, temperature sensors, broad band optical sources and narrow band optical sources.

All references cited in this application are hereby incorporated in their entireties by reference herein to the extent that they are not inconsistent with the disclosure in this application. It will be apparent to one of ordinary skill in the art that methods, devices, device elements, materials, procedures and techniques other than those specifically described herein can be applied to the practice of the invention as broadly disclosed herein without resort to undue experimentation. All art-known functional equivalents of methods, devices, device elements, materials, procedures and techniques specifically described herein are intended to be encompassed by this invention.

EXAMPLE 1

Composite Stamps for Nanotransfer Printing

The ability of the patterning devices of the present invention to provide composite stamps for nanotransfer printing applications was verified by experimental studies. Specifically, it is a goal of the present invention to provide composite stamps capable of patterning large areas of a substrate surface with structures having selected lengths on the order of microns and 10's of nanometers. Further, it is a goal of the present invention to provide composite stamps for contact printing high resolution patterns exhibiting good fidelity and placement accuracy.

To achieve the aforementioned goals, composite stamps were fabricated using the methods of the present invention and used to generate patterns comprising monolayers of gold on substrates via nanotransfer printing (nTP). Specifically, large area composites stamps were generated and tested, comprising a thin (5–10 micron) PDMS layer in contact with a 25 micron thick polyimide (Kapton®, DuPont) backing layer. In addition, large area composites stamps were generated and tested, comprising additional PDMS and/or polyimide layers. In one embodiment, a second PDMS layer having thickness of about 10 millimeters was attached to the polyimide layer. In another embodiment, a second polyimide layer was provided that was separated from the first polyimide layer by a thin (approximately 4 micron) PDMS layer. Use of additional PDMS and/or polyimide layers facilitated handling of the composite stamps and avoided curling after separation from the master relief pattern due shrinkage of the PDMS layer and/or mismatch of the coefficients of thermal expansion of the PDMS and polyimide layers.

Figure 4A:
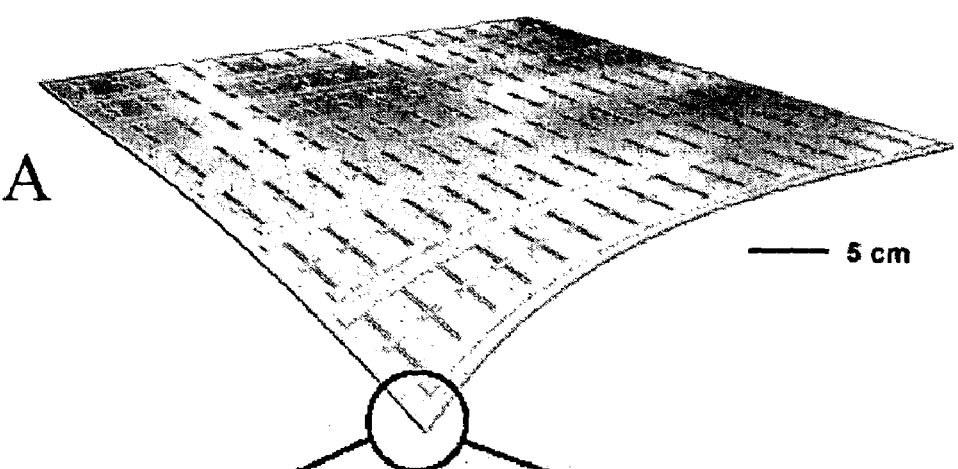
FIG. 4A shows a schematic illustration of an exemplary patterning device of the present invention comprising a composite stamp.
Figure 4B:
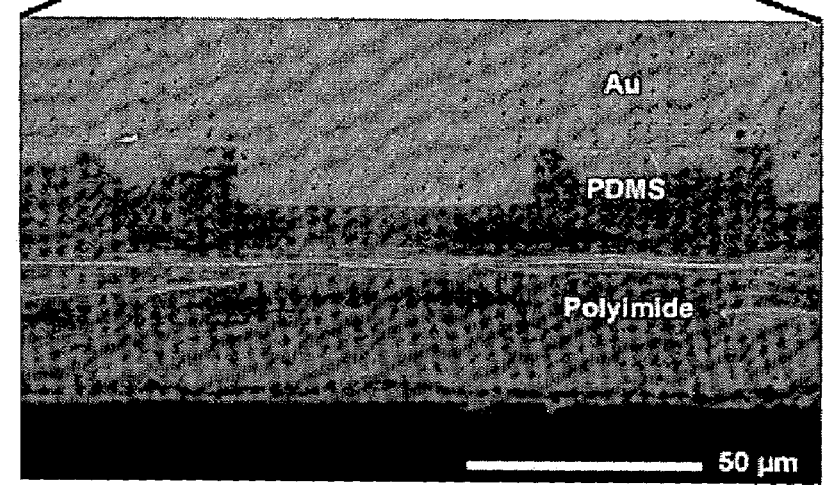
FIG. 4B shows a cross section scanning electron microscopy image of an exemplary composite stamp of the present invention

FIG. 4A shows a schematic illustration of an exemplary composite stamp used in this study and FIG. 4B shows a corresponding cross section scanning electron microscopy image. As shown in FIG. 4B, the relief pattern of the composite stamp is coated with a thin layer of gold. The relief pattern of this composite stamp corresponds to the source/drain level of an active matrix circuit for electronic paper displays consisting of 256 interconnected transistors arranged in a square array of over an area of 16 cm by 16 cm.

Figure 5A:
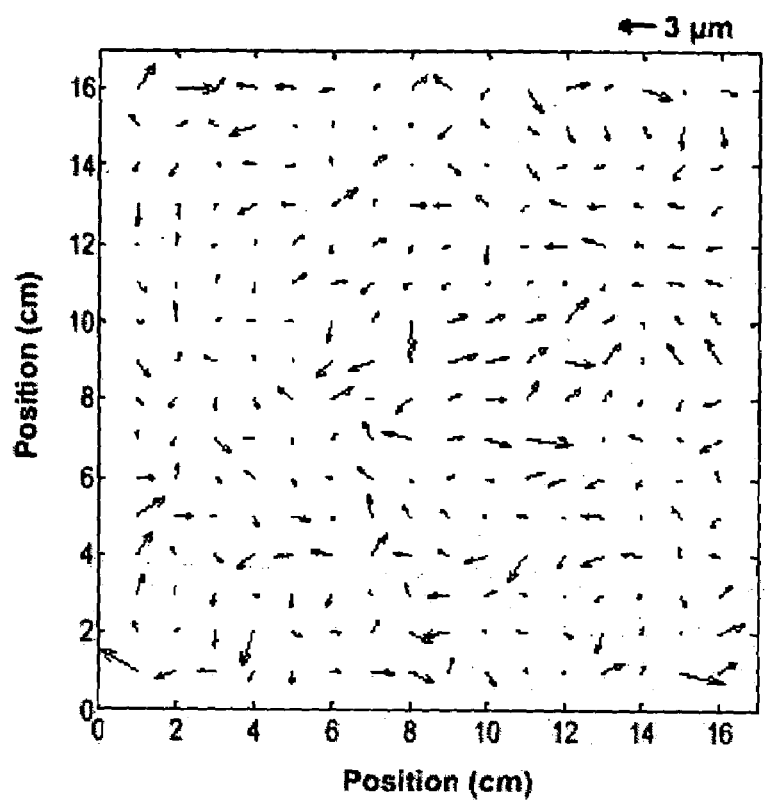
FIGS. 5A and 5B shows distortions that correspond to measurements of positions of features on an exemplary composite stamp compared to those on its master.
Figure 5B:
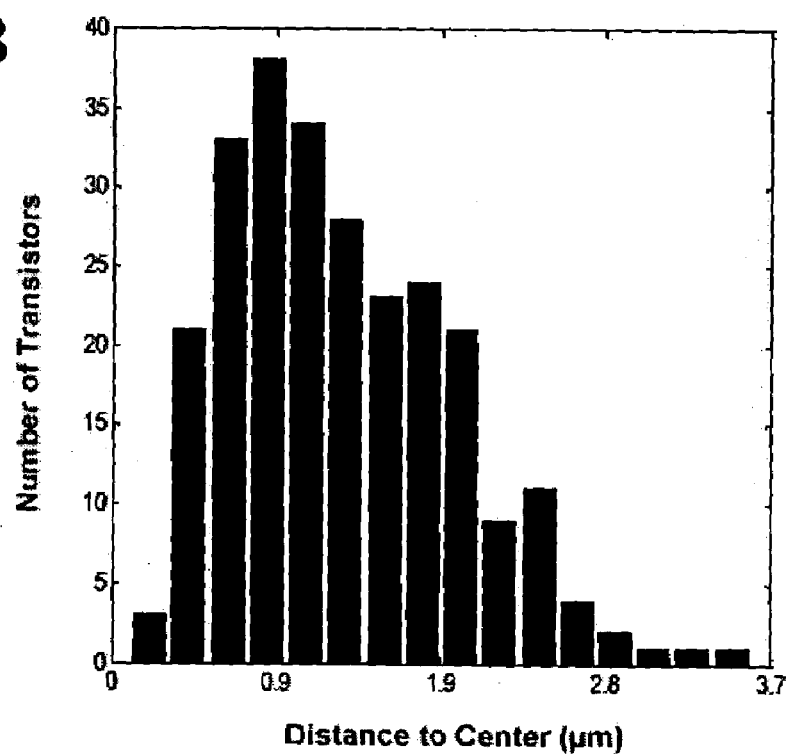

Distortions in composite stamps of the present invention were quantified by measuring with a microscope the misalignment at each transistor location between two successive prints, between one print and the stamp and the stamp used to print and between a stamp and its master relief pattern. FIGS. 5A and 5B show distortions that correspond to measurements of positions of features on a composite stamp compared to those on its master relief pattern. These results include corrections for overall translation and rotational misalignment and isotropic shrinkage (about 228 ppm for stamps cured at 80 degrees Celsius and about 60 ppm for those cured at room temperature). The residual distortions are close to the estimated accuracy (approximately 1 micron) of the measurement method. These distortions include cumulative effects of (i) fabricating and releasing the stamp from its master relief pattern and (ii) printing (wetting the stamp) on an uneven substrate (the master has some relief features approximately 9 microns thick).

Figure 6A:
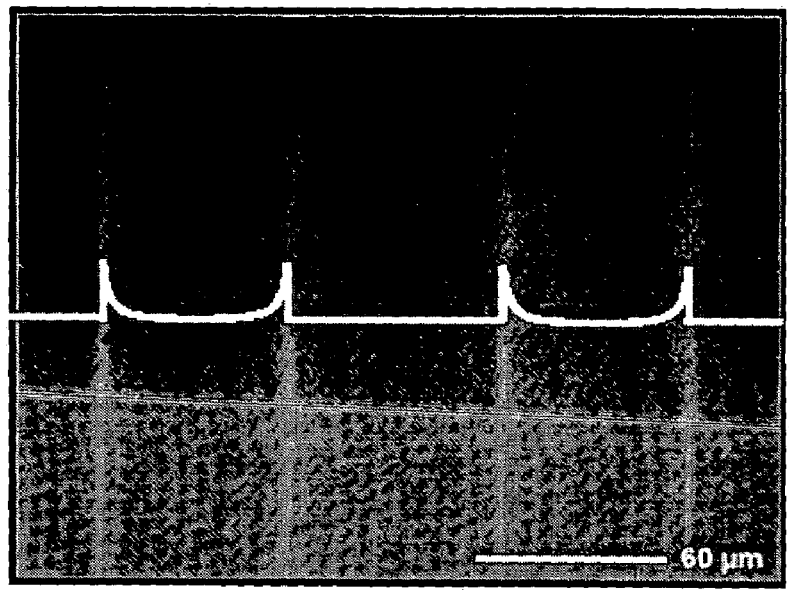
FIGS. 6A and 6B show top view optical micrographs that illustrate the reduced tendency for sagging of recessed areas in a composite stamp of the present invention.
Figure 6B:
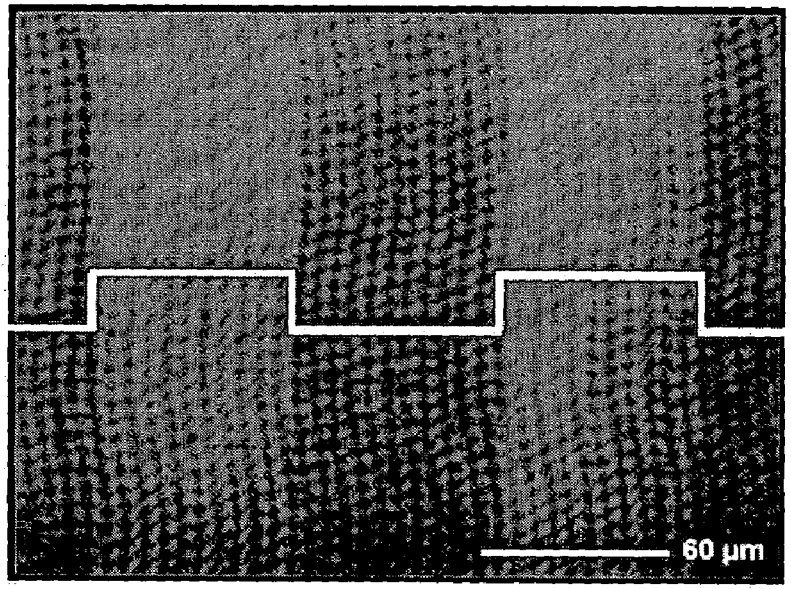

Another benefit of the composite stamp design of this example is its reduced tendency to sag mechanically in the recessed regions of the relief pattern, which can cause unwanted stamp-substrate contact that distorts a pattern transferred to a substrate surface. As an example, in the case of 60 micron wide lines separated by 60 microns (500 nanometer relief height), recessed areas of a regular single element PDMS stamp sag completely. In contrast, no sagging is observed for the same relief geometry on a composite stamp comprising four polymer layers: (1) 25 micron PDMS first layer, (2) 25 micron polyimide second layer, (3) 60 micron PDMS third layer, and (4) 25 micron polyimide fourth layer. FIGS. 6A and 6B show top view optical micrographs that illustrate the reduced tendency for sagging of recessed areas in a composite stamp of the present invention. FIG. 6A corresponds to a conventional single layer PDMS stamp and FIG. 6B corresponds to a composite stamp of the present invention. The color uniformity in the recessed areas of the composite stamp (FIG. 6B) suggests that the bowing is almost zero. Finite element modeling of the multilayer structure of the composite stamp indicates that the polyimide layer efficiently reduces the tendency of the stamp for sagging when the residual PDMS layer is thin.

Figure 7:
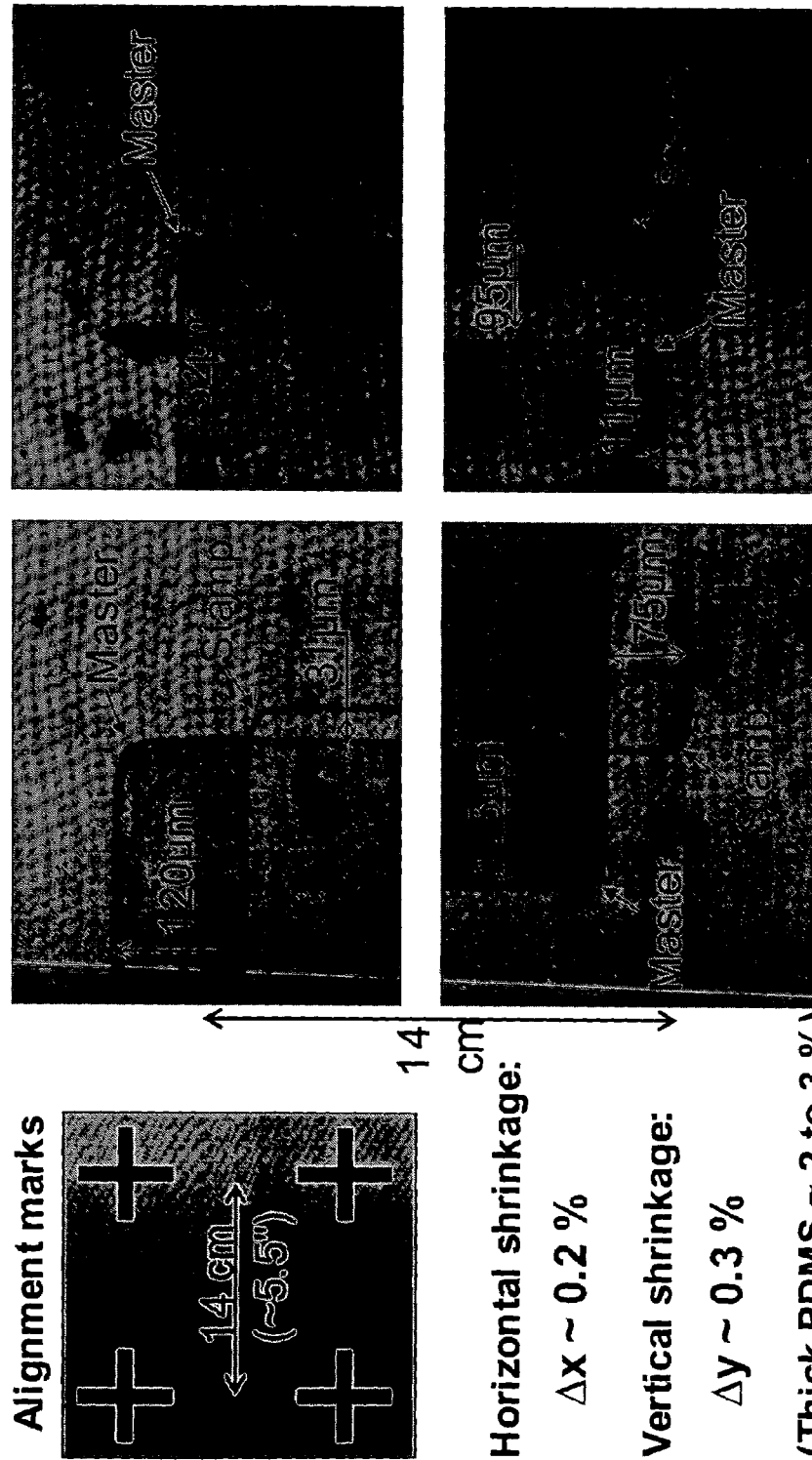
FIG. 7 shows the extent of shrinkage observed after curing a four layer composite stamp of the present invention comprising a first PDMS layer, a second polyimide layer, a third PDMS layer and a fourth polyimide layer.

FIG. 7 shows the extent of shrinkage observed after curing a two layer stamp of the present invention comprising a thin PDMS layer in contact with a polyimide layer. As shown in FIG. 7, composite stamps of the present invention undergo horizontal shrinkage equal to 0.2% or less and vertical shrinkage of 0.3% or less. The resistance to curing induced shrinkage provided by the composite stamp designs of the present invention minimizes distortions of the three-dimensional relief pattern and contact surfaces and provides high resolution patterns exhibiting good fidelity with respect to the master relief pattern.

Figure 8:
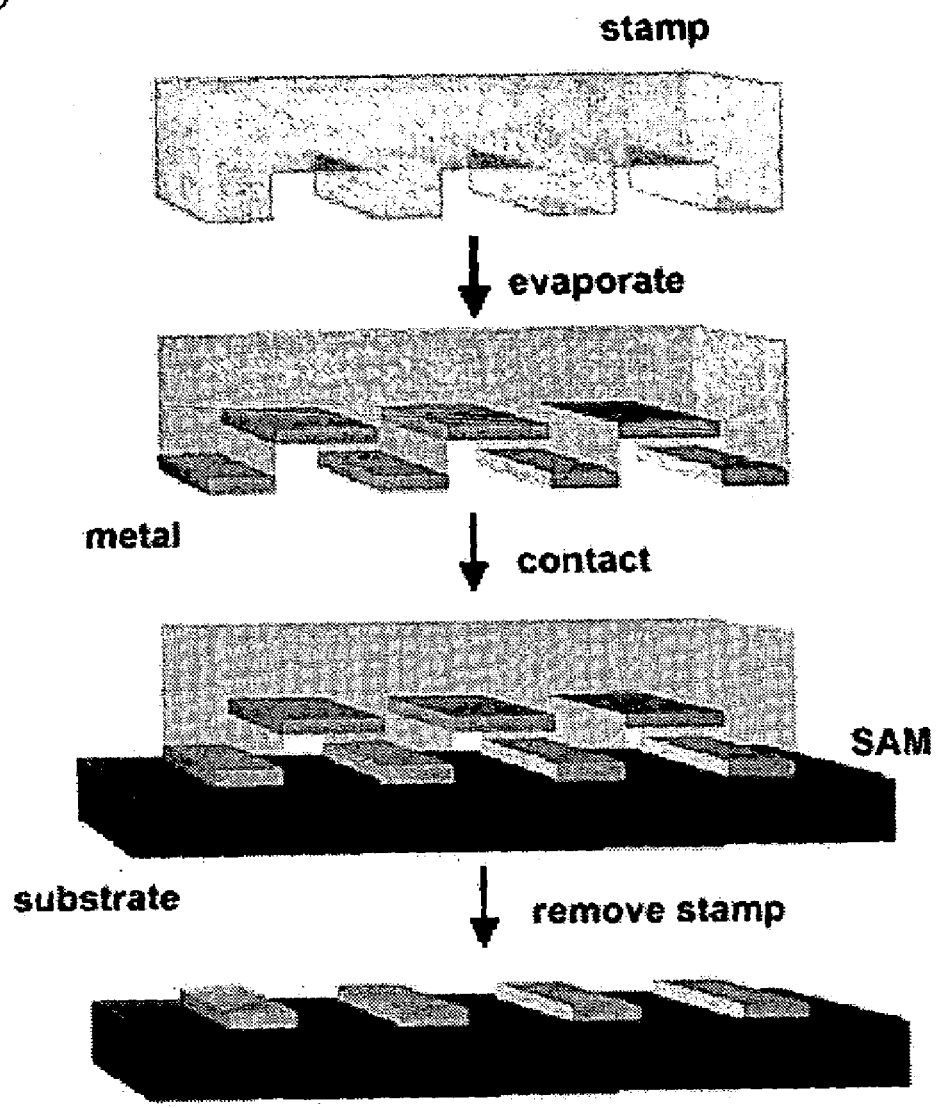
FIG. 8 is a schematic illustration of an exemplary nanotransfer printing processes using a composite stamp of the present invention.
Figure 9C:
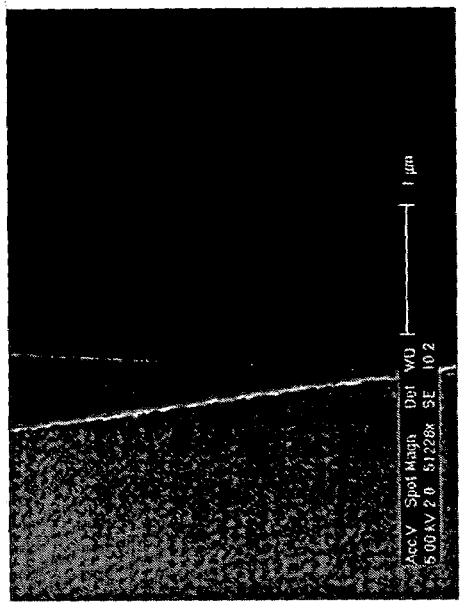
FIGS. 9A–D show scanning electron micrographs of patterns of Ti/Au (2 nm/20 nm) generated using composite stamps of the present invention.
Figure 9D:
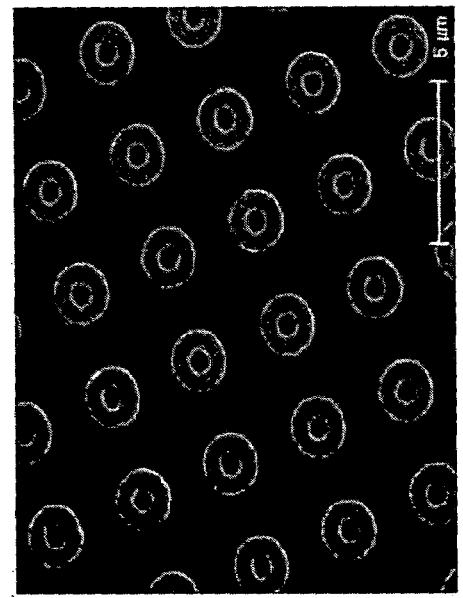
Figure 9A:
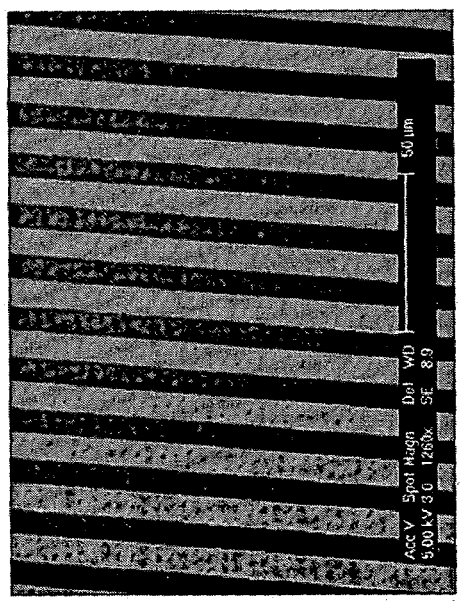
Figure 9B:

FIG. 8 is a schematic illustration of a nanotransfer printing processes using a composite stamp of the present invention. As shown in FIG. 8, the process begins with deposition of a gold coating on the surface of the composite stamp, thereby forming a discontinuous gold coating on the raised and recessed regions of the elastomeric first layer. Contacting the stamp to a substrate that supports a self assembled monolayer (SAM) designed to bond to the gold (e.g. a thiol terminated SAM) leads to strong adhesion between the gold and the substrate. Removing the stamp, to which gold only weakly adheres, transfers the gold on the raised regions of the stamp to the substrate.

Metal evaporation was performed with a Temescal electron beam system (BJD 1800) and deposition rates of 1 nm/s were employed. Pressures during evaporation were typically about $1 \times 10^{-6}$ Torr or less. A deposition rate monitor was installed in position such that the rates could be established and stabilized before exposing the stamps or substrates to the flux of metal. The printing was performed in open air shortly after deposition. The stamps typically come into intimate contact with the substrates without applied pressure other than the force of gravity. In some cases small pressure applied by hand was used to initiate contact along an edge, which then proceeded naturally across the stamp-substrate interface. After a few seconds, the stamp was removed from contact with substrate to complete the printing.

FIGS. 9A–D show scanning electron micrographs of patterns of Ti/Au (2 nm/20 nm) generated using composite stamps of the present invention. As illustrated in these figures, the methods and devices of the present invention are capable of generating a wide variety of patterns comprising structures having a range of physical dimensions. As shown in FIGS. 9A–D, the transferred Ti/Au patterns are largely free of cracks and other surface defects. Use of composite stamps of the present invention having a thickness less than 100 μm are preferred for some applications because the stress developed at the surface of the composite stamp when bent (during handling or initiation of contact) is small relative to conventional PDMS stamps which are often substantially thicker (e.g. approximately 1 cm in thickness).

EXAMPLE 2

Computer modeling of the Thermal Characteristics and Mechanical Properties of Composite Patterning Devices The susceptibility of multilayer patterning devices of the present invention to distortions induced by polymerization during fabrication and mechanical stresses was evaluated by computation simulations. Specifically, the extent of deformation induced by polymerization during fabrication and the weight driven deformation of recessed regions was calculated for a four layer composite patterning device. These studies verified that composite patterning devices of the present invention exhibit enhanced stability with respect to polymerization induced shrinkage and weight driven sagging.

The extent of polymerization induced distortion was calculated and compared for two different composite pattern designs. First, a four layer composite patterning device 600, shown schematically in FIG. 10, was evaluated comprising a first 5 micron thick PDMS polymer layer 610, a second 25 micron polyimide (Kapton®) polymer layer 620, a third 5 micron thick PDMS polymer layer 630 and a fourth 25 micron polyimide (Kapton®) polymer layer 640. Second, a two layer composite patterning device 700 shown schematically in FIG. 11A was evaluated comprising a first 5 micron thick PDMS polymer layer 710, a second 25 micron polyimide (Kapton®) polymer layer 720. A temperature change from 20 degrees Celsius to 80 degrees Celsius was used in both calculations. The Young's modulus and coefficient of thermal expansion of PDMS were assumed to be independent of temperature and equal to 3 MPa and 260 ppm, respectively. The Young's modulus and coefficient of thermal expansion of polyimide were assumed to be independent of temperature and equal to 5.34 GPa and 14.5 ppm, respectively.

Figure 10:
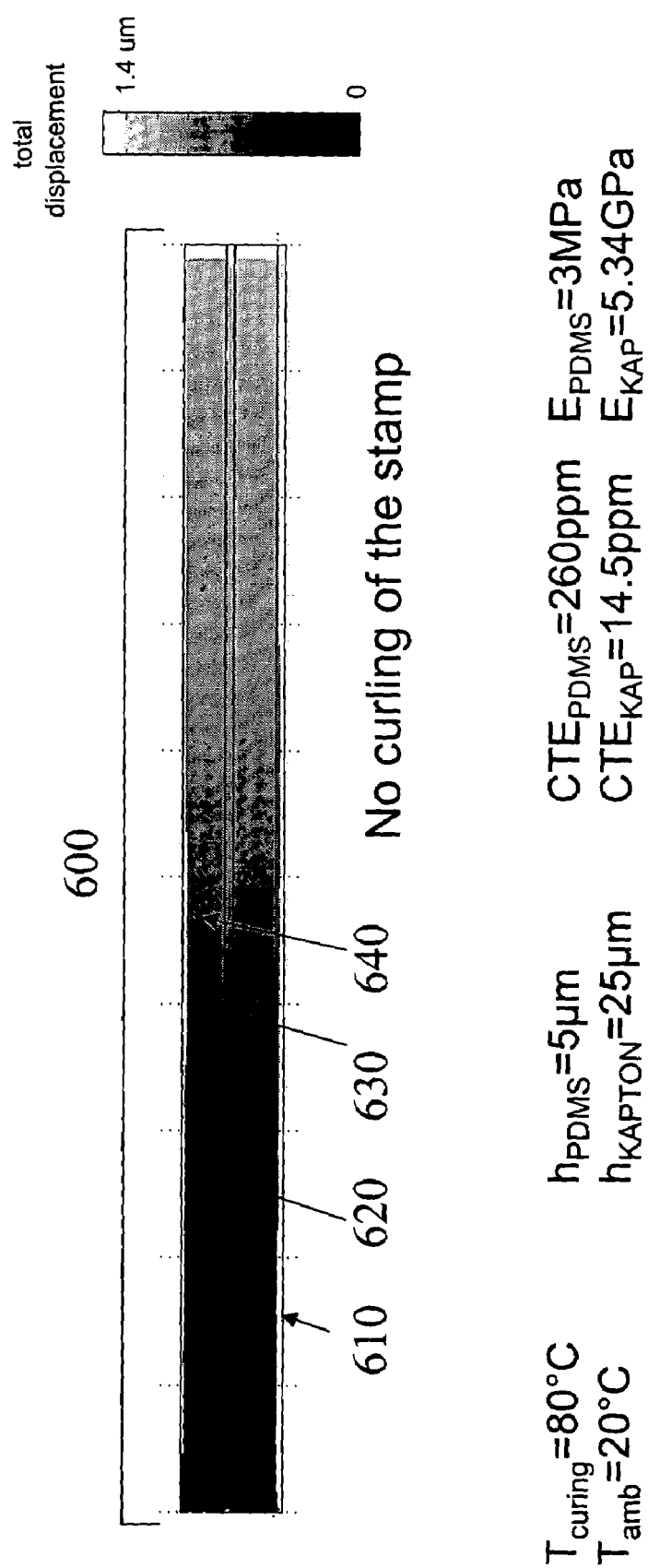
FIG. 10 shows the extent of distortion during thermal induced polymerization calculated for a four layer composite patterning device of the present invention.
Figure 11A:
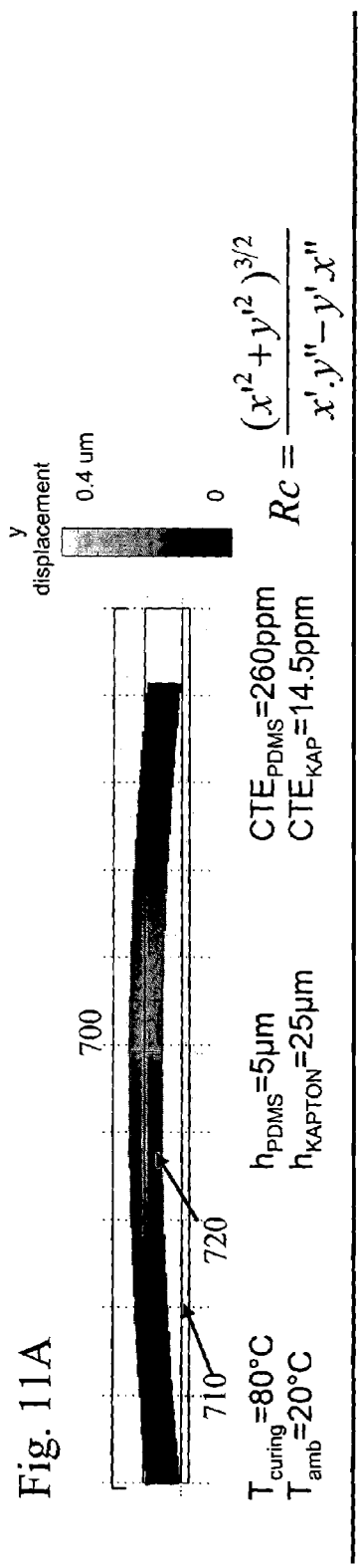
FIG. 11A shows the extent of distortion during thermal induced polymerization calculated for a two layer composite patterning device.
Figure 11C:
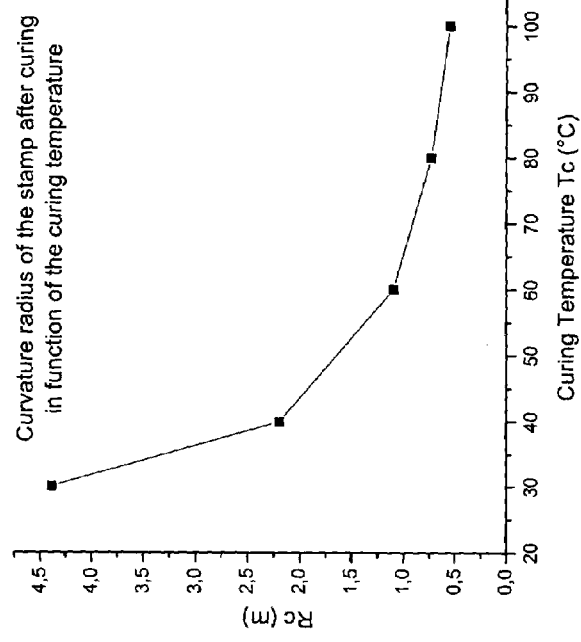
FIG. 11C is a plot of the radius of curvature after polymerization as a function of the curing temperature for the two layer pattering device.
Figure 11B:
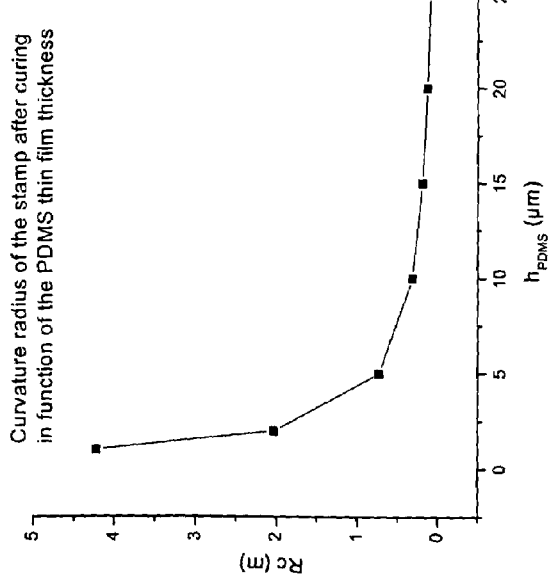
FIG. 11B is a plot of the radius of curvature after polymerization as a function of the thickness of the PDMS layer for the two layer patterning device.

FIG. 10 shows the extent of distortion predicted during thermal induced polymerization calculated for the four layer composite patterning device 600. As shown in FIG. 10, no curling of the four layer pattern device is observed upon polymerization. FIG. 11A shows the extent of distortion during thermal induced polymerization calculated for the two layer composite patterning device 700. In contrast to the results for the four layer patterning device, polymerization induced curling is observed for the two layer pattering device. FIGS. 11B and 11C provide plots of the radius of curvature after polymerization as a function of the thickness of the PDMS layer and the curing temperature, respectively, for the two layer pattering device.

Figure 12A:
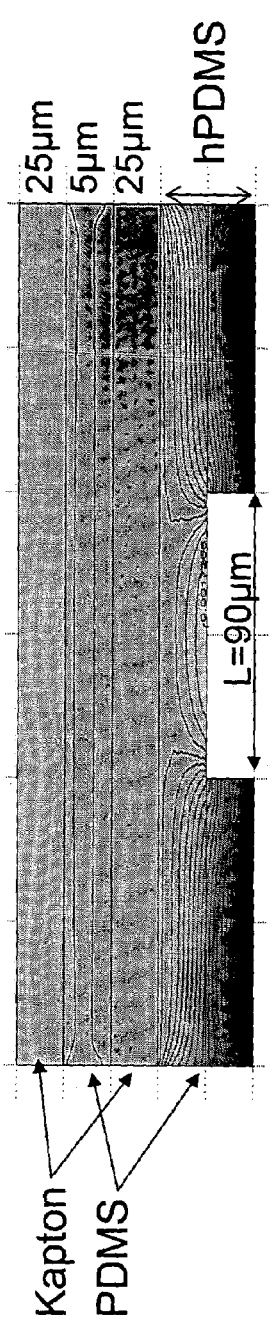
FIG. 12A is a schematic diagram of a composite four layer patterning device comprising two h-PDMS layers and two polyimide (Kapton®) layers.
Figure 12B:
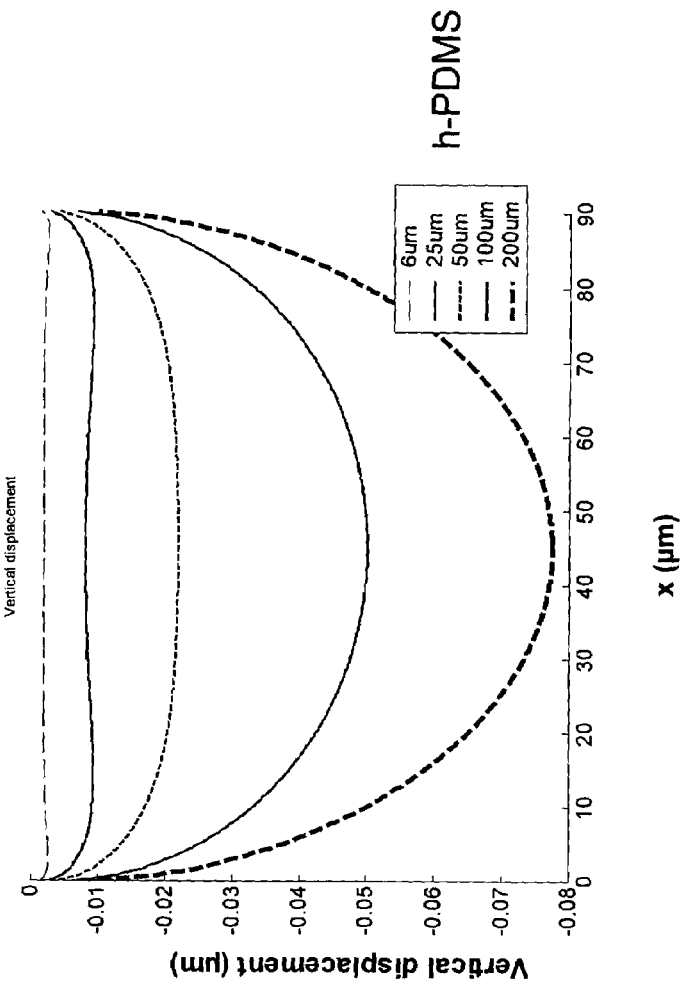
FIG. 12B shows a plot of the predicted vertical displacement of a composite four layer patterning device in units of microns as a function of position along a recessed region about 90 microns in length.

The extent of vertical displacement of recessed regions of a four layer patterning device of the present invention was also examined via computer simulations. As shown in FIG. 12A, the composite patterning device evaluated comprised two h-PDMS layers and two polyimide layers (Kapton®). The thickness of the first h-PDMS layer was varied over the range of about 6 microns to about 200 microns. The thickness of the polyimide second layer was held constant at 25 microns, the thickness of the h-PDMS third layer was held constant at 5 microns, and the thickness of the polyimide fourth layer was held constant at 25 microns. FIG. 12B shows a plot of the predicted vertical displacement in units of microns as a function of position along a recessed region about 90 microns in length. As shown in FIG. 12B, distortions due to sagging less than about 0.2 microns is observed are observed for PDMS first layers having thicknesses equal to or less than 50 microns. In addition the extent of sagging observed for all embodiments examined was always less than about 0.1% of each the thickness evaluated. The results of these simulations suggest that four layer composite patterning devices of the present invention are unlikely to exhibit undesirable contact between recessed regions of the first layer and the substrate surface due to sagging of recessed regions of a relief pattern.

Figure 13A:
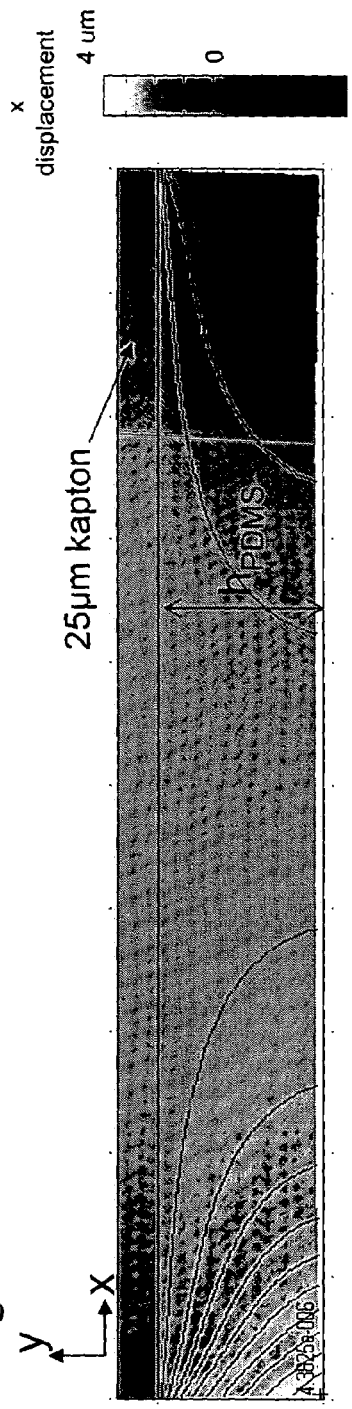
FIGS. 13A–C shows the results of a computational study of horizontal distortion due to thermal/chemical shrinkage during polymerization for a two layer composite stamp of the present invention.
Figure 13C:
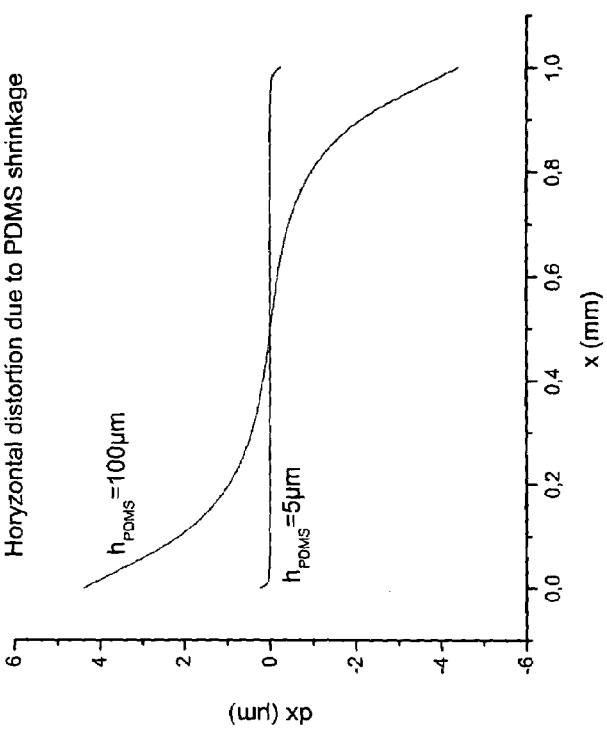
Figure 13B:
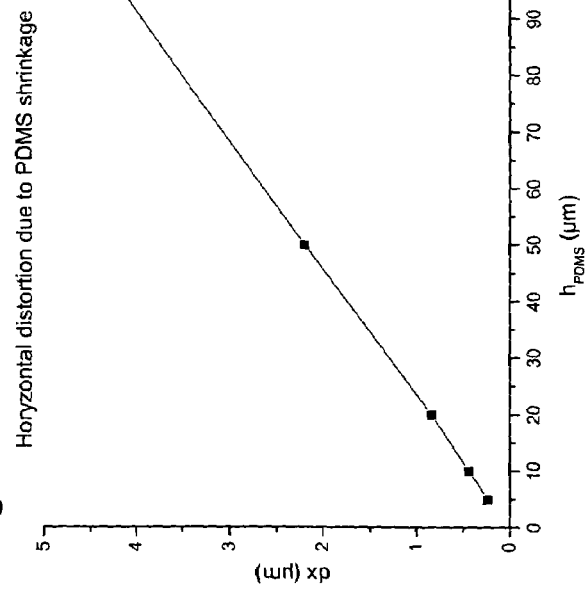

FIGS. 13A–C shows the results of a computational study of horizontal distortion due to thermal/chemical shrinkage during polymerization for a two layer composite stamp of the present invention. FIG. 13A is a schematic illustrating a two layer composite stamp comprising a PDMS layer of variable thickness operationally coupled to a 25 micron Kapton layer. FIG. 13B is a plot of the predicted horizontal distortion as a function of the thickness of the PDMS first layer in microns. FIG. 13C is a plot of the predicted horizontal distortion as a function of the distance along the external surface of the PDMS first layer in millimeters. The modeling results suggest that the magnitude of distortions in planes parallel to the contact surfaces on the external surface of the PDMS first layer due to polymerization is directly proportional to the PDMS first layer thickness. In addition, the modeling results show that distortions in planes parallel to the contact surfaces on the external surface of the PDMS first layer due to polymerization are largely confined to the edges of the stamp when the thickness of the PDMS first layer is decreased.

EXAMPLE 3

Fiber Reinforced Composite Patterning Devices

The present invention includes composite pattering devices comprising one or more composite polymer layers, including polymer layers having fiber materials providing beneficial mechanical, structural and/or thermal properties. Composite patterning devices of this aspect of the present invention include designs wherein fibers are integrated into and/or between polymer layers in geometries selected to provide a net flexural rigidity that minimizes distortion of the relief features of a relief pattern and which provide patterning devices capable of generating patterns exhibiting good fidelity and placement accuracy on substrate surfaces. Furthermore, composite patterning devices of this aspect of the present invention include designs wherein fibers are integrated into and/or between polymer layers in geometries selected to minimize expansion or contraction of polymer layers due changes in temperature and/or to facilitate physical manipulation of patterning devices of the present invention, for example by adding to the thickness of these devices.

Figure 14B:
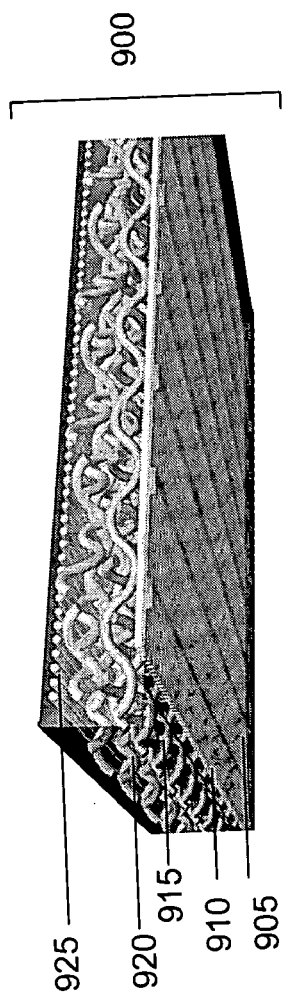

To evaluate verify the utility of integrated fiber materials in composite patterning devices of the present invention, a patterning device comprising a plurality of glass fiber reinforced polymer layers was designed. FIGS. 14A and 14B provide schematic diagrams illustrating a fiber reinforced composite stamp of the present invention. FIG. 14A provides a cross sectional view and FIG. 14B provides a perspective view. As shown in FIGS. 14A and 14B the fiber reinforced composite stamp 900 comprises a first layer 905 comprising PDMS and having a relief pattern with relief features of selected physical dimensions, a second layer 910 comprising a composite polymer having an array of fine glass fibers in a first selected orientation, a third layer 915 comprising a composite polymer having a mesh of larger glass fibers in a second selected orientation, a fourth layer 920 comprising a composite polymer having a mesh of large glass fibers in a third selected orientation and a fifth layer 925 comprising a composite polymer having an array of fine glass fibers in a fourth selected orientation. First layer 905 has a low Young's modulus and is capable of establishing conformal contact between its contact surface(s) and a range of surfaces including contoured, curved and rough surfaces. Second layer 910 is a composite polymer layer wherein the addition of an array of fine glass fibers in a selected orientation provides mechanical support to the roof of the relief features of first layer 905, thereby minimizing distortion of the relief pattern on first layer 905 upon formation of conformal contact with a substrate surface. Third and fourth layers 915 and 920 provide an overall thickness of the fiber reinforced composite stamp 900 such that it can be easily manipulated, cleaned and/or integrated into a stamping device. Incorporation of glass fibers into second, third, fourth and/or fifth layers 910, 915, 920 and 925 also provide a means of selecting the net flexural rigidity of the fiber reinforced composite stamp and provides a means of selecting the Young's modulus of individual layers in patterning devices of the present invention. For example, selection of the composition, orientation, size and density of fibers in second, third, fourth and/or fifth layers 910, 915, 920 and 925 may provide a net flexural rigidity useful for generating patterns exhibiting good fidelity and placement accuracy on substrate surfaces. Second, third, fourth and fifth layers 910, 915, 920 and 925 may comprise fiber reinforced composite layers of a polymer having a low Young's modus or polymer having a high Young's modus. Optionally, fiber reinforced composite stamp 900 may further comprise one or more additional high or low Young's modulus polymer layers, include additional composite polymer layers having fiber materials.

Figure 14C:
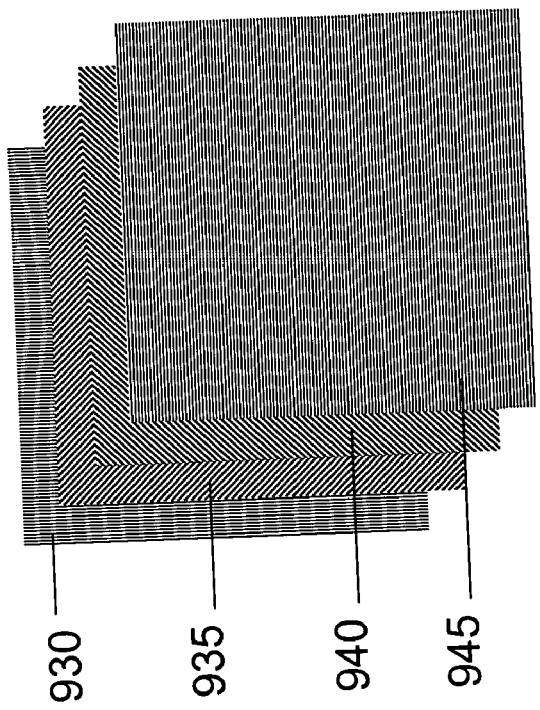
FIG. 14C provides a schematic diagram illustrating first, second, third and fourth selected orientations corresponding to second, third, fourth and fifth layers, respectively, of fiber reinforced composite stamp.

FIG. 14C provides a schematic diagram illustrating first 930, second 935, third 940 and fourth 945 selected orientations corresponding to second, third, fourth and fifth layers 910, 915, 920 and 925, respectively, of fiber reinforced composite stamp 900. As shown in FIG. 14C, first selected orientation 930 provides an array of longitudinally aligned fine glass fibers in the second layer 910 arranged along axes that are orthogonal to the longitudinally aligned fine glass fibers in the fourth selected orientation 945 of the fifth layer 925. Second and third selected orientations provide fiber meshes wherein two sets of fibers are aligned and interwoven along orthogonal axes. Additionally, fiber meshes corresponding to second and third selected orientations 935 and 940 provide fibers orientations that are orthogonal to each other, as shown in FIG. 14C. Use of the fiber mesh orientations shown in FIG. 14C minimizes anisotropy in the in plane mechanical properties of polymer layers and patterning devices of the present invention.

Figure 15:
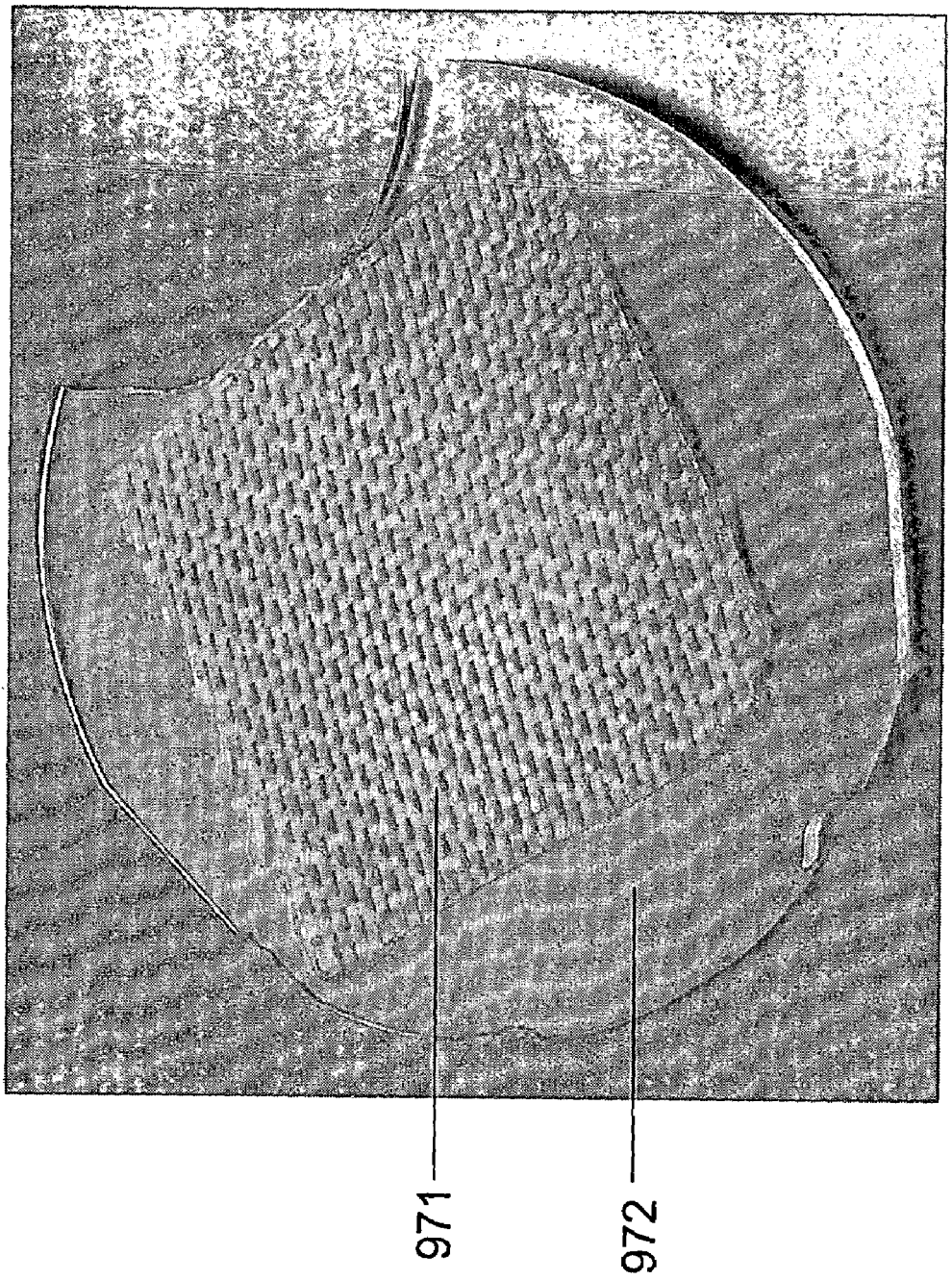
FIG. 15 provides an optical image of a composite polymer layer bonded to a PDMS layer.

FIG. 15 provides an optical image of a composite polymer layer bonded to a PDMS layer. As shown in FIG. 15, the composite polymer layer 971 comprises a glass fiber mesh and the PDMS layer 972 does not have any integrated fiber materials.

Referring again to FIG. 14A, the stamp design shown provides an arrangement of fiber reinforced layers that is symmetrical about design axis 960. Use of a second layer 910 and a fifth layer 925 having substantially the same thermal expansion coefficient and a third layer 915 and a fourth layer 920 having substantially the same thermal expansion coefficient provides a fiber reinforced composite stamp 900 having a substantially symmetrical distribution of thermal expansion coefficients about layer alignment axis 980. This is particularly true if first layer is relatively thin compared to the sum of second, third, fourth and fifth layers, for example preferably less than 10% for some applications and more preferably less than 5% for some applications. As described above, use of device configurations in the present invention providing a substantially symmetrical distribution of thermal expansion coefficients about layer alignment axis 980 orthogonal to a plane containing the contact surface(s) is useful for providing thermally stable patterning devices that exhibit minimal pattern distortions induced by changes in temperature. Further more, this symmetrical arrangement minimizes relief pattern distortions induced during curing, for example pattern distortions caused of curling of polymer layers during curing.

The use of fiber materials allows for integration of a wide range of materials having useful mechanical and thermal properties, including brittle material, into patterning devices and polymer layers of the present invention in a manner that preserves their ability of to exhibit flexibility allowing for establishment of conformal contact with rough and contoured substrate surfaces, such as surfaces having a large radius of curvature. For example, $SiO_2$ is a material that is very brittle in the bulk phase. However, use of $SiO_2$ fibers, fiber arrays and fiber meshes that are relatively thin (e.g. have diameters less than about 20 microns) allow structural reinforcement of polymer layers and enhances net flexural rigidity while maintaining their ability to be flexed, stretched and deformed. Furthermore, $SiO_2$ exhibits good adhesion to some polymers, including PDMS. Carbon fibers are another class of material that integration into polymer layers leads to substantially enhancement of flexural rigidity and Young's modulus while allowing for device flexibility useful for establishing good conformal contact with a range of surface morphologies.

Any composition of fiber material and physical dimensions of fiber materials, may be used in fiber reinforced polymer layers of the present invention that provides patterning device and polymer layers exhibiting beneficial mechanical, structural and thermal properties. Fiber materials useful in the present composite patterning devices include, but are not limited to, fibers comprising glass including oxides such as $SiO_2$, $Al_2O_2$, $B_2O_3$, CaO, MgO, ZnO, BaO, $Li_2O$, $TiO_2$, $ZrO_2$, $Fe_2O_3$, $F_2$, and $Na_3O/K_2O$, carbon, polymers such as aramid fiber and dyneema, metals and ceramics or mixtures of these materials may be incorporated into patterning devices of the present invention. Fiber materials exhibiting good adhesion to the polymer comprising the layer it is integrated into are preferred materials for some applications. Fibers having lengths ranging from about 1 to about 100 microns are useful in fiber reinforced composite patterning devices of present invention, preferably about 5 to about 50 microns for some applications. Fibers having diameters ranging from about 0.5 microns to about 50 microns are useful in fiber reinforced composite patterning devices of present invention, preferably about 5 to about 10 microns for some applications.

Composite layers in fiber reinforced patterning devices of the present invention may have any selected arrangement of fibers providing patterning devices with useful mechanical and thermal properties. Use of fiber arrangements characterized by a high fiber volume fraction, for example a fiber volume fraction greater than about 0.7, is useful in composite layers (e.g. layer 910 in FIG. 14A) providing support to relief features and recessed areas, including roof support, to in relief patterns of low modulus layers having one or more contact surfaces. Use of fiber arrangements characterized by a lower fiber volume fraction, for example a fiber volume fraction less than about 0.5, is useful in composite layers (e.g. layers 915 and 920 in FIG. 14A) providing a desirable net stamp thickness in order to maintain the flexibility of the fiber reinforced composite patterning device. As exemplified in the schematic diagrams shown in FIGS. 14A–14C, use of a plurality of composite layers having different selected fiber orientations is useful in for providing fiber reinforced composite patterning devices having isotropic mechanical properties with respect to deformation along axis that are orthogonal to a plane containing the contact surface.

In addition to their in addition to their structural and mechanical properties, fiber materials for fiber reinforced composite patterning devices of the present invention may also be selected on the basis of their optical and/or thermal properties. Use of fibers having a refractive index equal to or similar to the polymer material in which it is integrated into (i.e. matched to within 10%) is useful for providing optically transparent composite polymer layers. For example, the index of refraction of $SiO_2$ fiber can be tuned to match the index of refraction of PDMS (typically between 14. to 1.6) to make a highly transparent composite polymer layer. Matching refractive index of fiber and polymer materials in a given composite polymer layer is particularly useful for fiber reinforced composite photomasks of the present invention. In addition, selection of a fiber material having a thermal expansion coefficient equal to or similar to the polymer material in which it is integrated into (i.e. matched to within 10%) is useful for providing thermal stable fiber reinforced composite patterning devices.

EXAMPLE 4

Composite Soft Conformal Photomask

The present invention includes composite patterning devices comprising photomasks capable of establishing and maintaining conformal contact with the surface of a substrate undergoing processing with electromagnetic radiation. An advantage of composite conformal photomasks of the present invention is that they are able to conform to a wide range of substrate surface morphologies without significantly changing the optical properties, such as two dimensional transmission and absorption properties, of the photomask. This property of the present invention provides photomasks capable of transmitting electromagnetic radiation having well defined two dimensional spatial distributions of intensities, polarization states and/or wavelengths of electromagnetic radiation on selected areas of a substrate surface, thereby allowing fabrication of patterns on substrate exhibiting good fidelity and placement accuracy.

Figure 16:
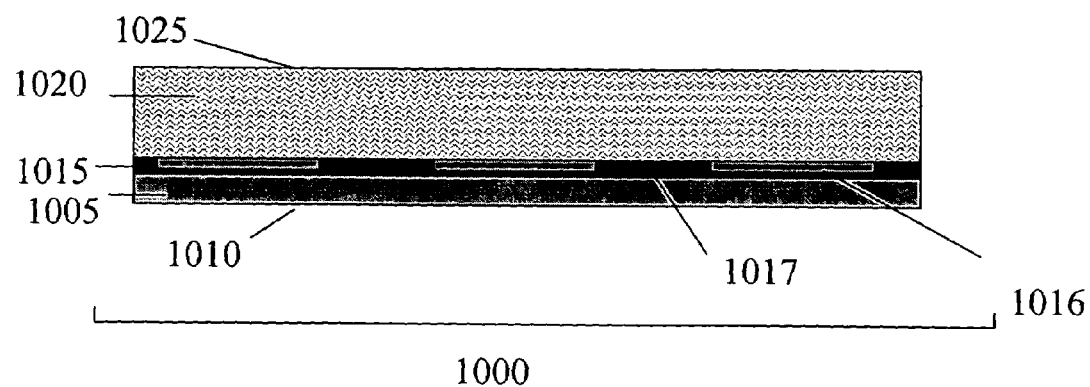
FIG. 16 provides a schematic diagram of a composite soft photo mask of the present invention.

FIG. 16 provides a schematic diagram of a composite soft conformal photomask of the present invention. As shown in FIG. 16, the composite soft conformal photomask 1000 comprises a first polymer layer 1005 having a low Young's modulus and having a contact surface 1010, a patterned layer photomasking layer 1015 comprising a plurality of optically transmissive 1017 and nontransmissive regions 1016, and a second polymer layer 1020 having high Young's modulus and an external surface 1025. In a useful embodiment, the first polymer layer comprises PDMS and the second polymer layer comprises polyimide. Transmissive regions 1017 at least partially transmit electromagnetic radiation exposed to external surface 1025 and nontransmissive regions 1016 at least partially attenuate the intensities of electromagnetic radiation exposed to external surface 1025, for example by reflecting, absorbing or scattering the electromagnetic radiation. In the embodiment shown in FIG. 16, nontransmissive regions 1016 are reflective thin aluminum films in contact with a substantially transparent $Ti/SiO_2$ layer. In this arrangement, substantially transparent regions between reflective thin aluminum films are transmissive regions.

To provide patterning on a substrate surface, the composite soft conformal photomask 1000 is brought into contact with a substrate surface such that the contact surface 1010 of first polymer layer 1005 establishes conformal contact with the substrate surface. Electromagnetic radiation having first two dimensional distributions of intensities, polarization states and/or wavelengths is directed onto external surface 1025 of second polymer layer 1020 of composite soft conformal photomask 1000. Reflection, absorption and/or scattering by nontransmissive regions 1016 generates transmitted electromagnetic radiation characterized by different two dimensional distributions of intensities, polarization states and/or wavelengths. This transmitted electromagnetic radiation interacts with the substrate surface and generates physically and/or chemically modified regions of the substrate surface. Patterns are fabricated either by removing at least a portion of the chemically and/or physically modified regions of the substrate or by removing at least a portion of the substrate that is not chemically and/or physically modified.

Figure 17A:
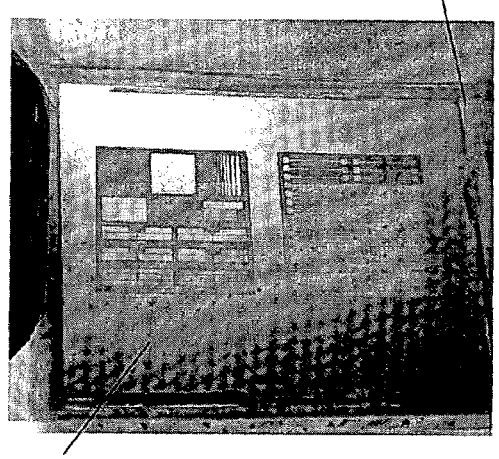
FIG. 17A shows an optical image of a composite soft conformal photomask of the present invention and FIG. 17B shows an optical image of exposed and developed photoresist patterns on a silicon substrate.
Figure 17B:
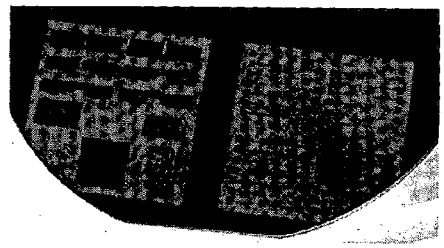

FIG. 17A shows an optical image of a composite soft conformal photomask of the present invention and FIG. 17B shows an optical image of exposed and developed photoresist patterns on a silicon substrate. As shown in FIG. 17A, the composite soft conformal photomask 1100 has a 5 millimeter thick handle 1105 providing a border which allows easy manipulation, cleaning and integration of the photomask with other processing instrumentation. A comparison of FIGS. 17A and 17B demonstrate that patterns having high fidelity are generated using the composite soft conformal photomask.

FIG. 18 provides a process flow diagram illustrating a method of making a composite soft conformal photomask of the present invention. As shown in process step A of FIG. 18, a thin aluminum layer is deposited onto the internal surface of a high Young's modulus polymer via electron beam evaporation. As shown in process step B of FIG. 18, a layer of photoresist is deposited on the aluminum layer, for example by spin coating, and is patterned, for example using conventional photolithography. This patterning step generates a patterned photomasking layer comprising thin aluminum films having selected physical dimensions and positions. As shown in process step C of FIG. 18, a thin film of $Ti/SiO_2$ is deposited on the aluminum patterned photomasking layer and exposed regions of the internal surface of the high Young's modulus polymer layer. Use of a $Ti/SiO_2$ layer is useful for promoting adhesion to a PDMS layer in subsequent processing steps. As shown in process step D of FIG. 18, a substantially flat silicon substrate is treated with a nonstick self assembled monolayer and a thin layer of PDMS is spin coated on top of the self assembled monolayer. Use of the self assembled monolayer in this aspect of the invention is important for preventing irreversible bonding of the PDMS layer to the silicon surface and to avoid damage of the PDMS layer upon separation from the silicon substrate. As shown in process step E of FIG. 18, the Ti/SiO$_2$ layer of the composite structure comprising high Young's modulus layer and the pattern photomasking layer is brought into contact with the PDMS-coated silicon substrate. A force is applied to the external surface of the high Young's modulus layer and the PDMS layer is cured at a temperature between 60–80 degrees Celsius for a few hours. Finally, the PDMS layer is separated from the silicon substrate thereby forming the composite soft conformal photomask.

EXAMPLE 4

Lock and Key Registration System Using Patterning Agent

The present invention provides methods and patterning devices and/or substrate surfaces having specific relief patterns, such as alignment channels, troughs and/or grooves, useful for providing proper registration and alignment of patterning devices and substrate surfaces. Particularly, use of "lock and key" alignment systems comprising complimentary (i.e. mating) relief features and recessed regions is useful in the present invention because engagement of complementary features constrains the possible relative orientations of the contact surface of a patterning device and a substrate surface. The ability to constrain the relative orientation of these elements is particularly useful for fabricating devices and device arrays with good placement accuracy over large substrate areas.

In one aspect, the present invention includes alignment systems using a patterning agent for establishing and maintaining a selected spatial alignment between the contact surface of a patterning device, such as the contact surface of a composite patterning device or the contact surface of a single layer patterning device, and a selected region of the substrate surface. In the context of this description, the term "patterning agent" refers to one or more materials that are provided between at least a portion of the contact surface of a patterning devices and a substrate surface undergoing processing. In this aspect of the present invention, the patterning agent functions to facilitate proper alignment and engagement of complementary relief features and recessed regions in a manner resulting good registration of these elements. Patterning agents of the present invention may provide functionality other than or in addition to facilitating proper alignment of a patterning device and a substrate surface. In one embodiment, patterning agents of the present invention comprise an optical filtering medium for a photomask of the present invention. In another embodiment, patterning agents comprise a transfer material that is molded onto a substrate surface, for example a prepolymer material that is molded into a pattern embossed on the substrate surface upon exposure to electromagnetic radiation or upon increasing temperature. Patterning agents of the present invention may also provide a multifunctional character such as a combination of facilitating alignment of a contact surface of a patterning device and a substrate surface undergoing processing and providing optical filtering and/or a transfer material for patterning a substrate surface.

In one embodiment, patterning agents of the present invention act as lubricants by reducing friction generated between a mating contact surface and substrate surface pair of an alignment system, such as a lock and key registration system. By reducing friction, the patterning agent allows the patterning device and the substrate to establish conformal contact and move relative to each other, thereby sampling a range of possible relative orientations. In this aspect of the present invention, additional mobility provided by the patterning agent allows the patterning device and substrate surface to realize a stable, selected relative orientation characterized by effective coupling between complementary relief features and recessed regions on the mating surfaces. Effective patterning agents facilitate establishing correct registration without interfering with establishment of conformal contact. Useful patterning agents include fluids, such as liquids and colloids, thin films and particulate materials. Exemplary patterning agents include Optical Brightener, Benetex OB-EP from Mayzo, Parker ink, Water soluble black wooden dye Powerder from Constantines Wood Center.

Patterning devices of this aspect of the present invention have a contact surface having a plurality of recessed regions or relief features having shapes and physical dimensions that are complementary to recessed regions or relief features on a substrate surface undergoing processing. Patterning devices of this aspect of the present invention also have a means for introducing the patterning agent into a least a part of the region between the contact surface and the substrate surface. Means for introducing the patterning agent can be a fluidic channel, groove or may involve wetting the contact surface or substrate surface prior to establishing conformal contact, for example using a dipping system. To achieve registration, the patterning device and substrate surface are gradually brought into contact by establishing an appropriate force, for example a force directed orthogonal to a plane containing at least a portion of the contact surface. Optionally, alignment may involve movement of the mating surface of the patterning device and the substrate surface in other directions, for example by lateral movement of the surfaces.

In another aspect, the patterning agent acts as the optical filtering medium for a conformable photomask. In this aspect of the invention, the composition of the patterning agent is selected such it that it absorbs, scatters, reflects or otherwise modulates some property of electromagnetic radiation directed onto the photomask, thereby selectively adjusting the intensities, wavelengths and polarization states of light transmitted onto a substrate surface undergoing patterning. In one embodiment, for example, the patterning agent is provided between a conformable photomask having a relief pattern and the external surface of a substrate. Conformal contact between the photomask and the external surface of the substrate generates a series of spaces occupied by the patterning agent that are defined by the relief features and recessed regions of the relief pattern. These spaces may comprise a series of channels, chambers, apertures, grooves, slits and/or passages positioned between the photomask and the external surface of the substrate. The shapes and physical dimensions of the relief features and recessed regions of the photomask determine optical thicknesses of the patterning agent present in the spaces between the photomask and the substrate surface. Selection of the relief pattern geometry and composition of the patterning agent, therefore, provides a means of modulating transmitted electromagnetic radiation to achieve selected two dimensional spatial distributions of the intensities, wavelengths and/or polarization states of light transmitted onto the substrate surface. This aspect of the invention is particularly useful for patterning substrate surfaces having a layer of photosensitive material deposited on their external surfaces.

Advantages of this patterning approach of the present invention include (i) it is compatible with the types of composite patterning devices described throughout this application, (ii) the patterning agent can have low viscosity, which enables it to flow rapidly and effectively as the patterning device is brought into contact with the patterning agent (which helps to push most of the patterning agent out of the regions that correspond to raised areas on the patterning device), (iii) it lubricates the interface between the contact surface (or coated contact surface) and the substrate surface (or coated substrate surface), (iv) it does not alter the stretchability of the patterning device, which is an important characteristic, especially if the patterning device has to stretch to match the lock and key features (due to slight deformations in the substrate, for example) and (v) it can pattern conventional photoresists whose processing conditions and uses are well established for many important electronic and photonic applications.

FIGS. 19A and 19B provide schematic diagrams showing alignment systems using a patterning agent for aligning a photomask and substrate. Referring to FIGS. 19A and 19B, the alignment system 1300 of the present invention comprises a conformable photomask 1305 having a contact surface 1306, a substrate 1310 with an external surface 1313 undergoing processing and a patterning agent 1315 disposed between the contact surface 1306 and external surface 1313. In the embodiment shown in FIGS. 19A and 19B, external surface 1313 undergoing processing is coated with a photosensitive layer 1314, such as a photoresist layer. In the design shown in FIG. 19A, conformable photomask 1300 comprises a first polymer layer, for example a PDMS layer, having a plurality of recessed regions 1320 having shapes and physical dimensions that are complementary to relief features 1325 present on external surface 1313 undergoing processing. In the design shown in FIG. 19B, conformable photomask 1300 comprises a first polymer layer, for example a PDMS layer, having a plurality of relief features 1340 having shapes and physical dimensions that are complementary to recessed regions 1345 present on external surface 1313 undergoing processing. Relief features and recessed regions of this aspect of the present invention may have any pair of complementary shapes including, but not limited to, having shapes selected from the group consisting of pyramidal, cylindrical, polygonal, rectangular, square, conical, trapezoidal, triangular, spherical and any combination of these shapes.

Optionally, conformable photomask 1305 may further comprise additional relief features 1308 and recessed regions 1307 having selected shapes and physical dimensions. As shown in FIGS. 19A and 19B, conformal contact of photomask 1305 and external surface 1313, generates a plurality of spaces occupied by patterning agent 1315, because substrate 1310 is not provided with relief features and recessed regions complementary to additional relief features 1308 and recessed regions 1307. In one embodiment, patterning agent 1315 is a material that absorbs, reflects or scatters electromagnetic radiation directed onto photomask 1305 and, therefore, the shapes and physical dimensions of relief features 1308 and recessed regions 1307 establishes two dimensional spatial distributions of intensities, wavelengths and/or polarization states of electromagnetic radiation transmitted to photosensitive layer 1314 on external surface 1313. In this manner, selected regions of photosensitive layer 1314 may be illuminated with selected intensities of electromagnetic radiation having selected wavelengths and polarization states, and selected regions of photosensitive layer 1314 may be shielded from exposure to electromagnetic radiation having selected wavelengths and polarization states. This aspect of the present invention is useful for patterning photosensitive layer 1314 by exposure to electromagnetic radiation characterized by a selected two dimensional spatial distribution of intensities capable of generating chemically and/or physically modified regions of photosensitive layer 1314 corresponding to a desired pattern. In one embodiment, the photomask 1305 is a phase only photomask which is substantially transparent. In this embodiment, it only forms an amplitude photomask when the patterning agent is present between contact surface 1306 and external surface 1313

In another embodiment, patterning agent 1315 is a transfer material for molding patterns onto the substrate surface. In this embodiment, therefore, the shapes and physical dimensions of relief features 1308 and recessed regions 1307 establishes features of a pattern that is embossed onto photosensitive layer 1314 on external surface 1313. Embodiments of this aspect of the present invention, are also useful for patterning a substrate surface via molding patterns on external surface 1313 directly (i.e. without photosensitive layer 1314 present).

Optionally, conformable photomask 1305 is a composite photomask further comprising additional polymer layers, such as high Young's modulus layers, composite polymer layers and low Young's modulus layers (not shown in FIGS. 19A and 19B). As discussed throughout the present application, patterning device of the present invention having one or more additional polymer layers provides beneficial mechanical and/or thermal properties. Patterning devices of this Example of the present invention, however, do not have to be composite patterning devices.

To generate a pattern on the surface of substrate 1310, patterning agent 1315 is provided between the contact surface 1306 of conformable photomask 1305 and external surface 1313, and the contact surface 1306 and external surface 1313 are brought into conformal contact. Patterning agent 1315 lubricates the interface between the first polymer layer of conformable photomask 1305 and the photosensitive layer 1314 on external surface 1313. The decrease in friction caused by the presence of the patterning agent 1315 enables the contact surface 1306 to align with the external surface 1313 such that the relief features (1325 or 1340) to optimally engage with recessed regions (1320 or 1345). Optimal alignment is achieved by providing a gradual force that brings the mating surface together, such as a force directed along an axis orthogonal to the contact surface (schematically represented by arrows 1380). Optionally, contact surface 1306 and external surface 1313 may be moved laterally (along an axis parallel to axis 1390) to enhance establishing of optimal engagement of recessed regions (1320 or 1345) and relief features (1325 or 1340).

The conformable photomask 1305 is illuminated with electromagnetic radiation, and transmits electromagnetic radiation having a selected two dimensional spatial distribution of intensities, wavelengths and/or polarization states to photosensitive layer 1314. For example, patterning agent 1315 present in the region between relief features 1308 and recessed regions 1307 and external surface 1313 may absorb, scatter or reflect incident electromagnetic radiation, thereby providing spatially resolved optical filtering functionality. For example, in one embodiment patterning agent 1315 absorbs UV electromagnetic radiation, thus creating contrast for patterning the photosensitive layer 1314 with ultraviolet light. The transmitted electromagnetic radiation interacts with portions of photosensitive layer 1314 thereby generating patterns of chemically and/or physically modified regions. After exposure to sufficient electromagnetic radiation for a given application, conformable photomask 1305 and substrate 1310 are separated, and photosensitive layer 1314 is developed by either removing at least a portion of chemically and/or physically modified regions of photosensitive layer 1314 or by removing at least a portion of photosensitive layer 1314 that is not chemically and/or physically modified.

Figure 20:
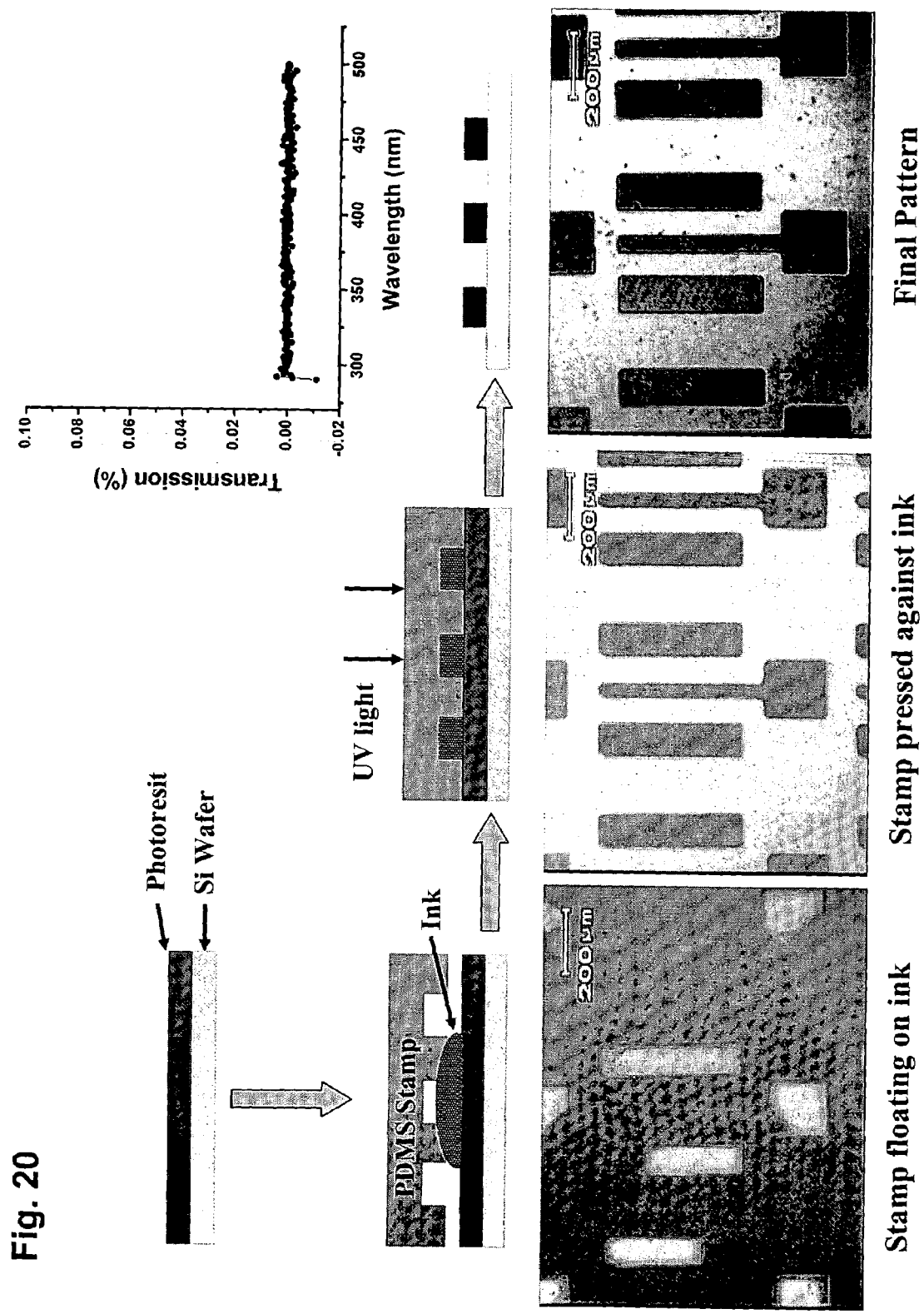
FIG. 20 provides a schematic diagram illustrating an exemplary patterning method of the present invention using a patterning agent that comprises an optical medium (or ink) of conformable photomask.

FIG. 20 provides a schematic diagram illustrating an exemplary patterning method of the present invention using a patterning agent that comprises an optical medium (or ink) of conformable photomask. As shown in FIG. 20, a substrate having a photoresist layer on its external surface is provided. The photoresist layer is contacted with a patterning agent comprising an ink and a conformable photomask is brought into conformal contact with the substrate. As shown in FIG. 20, the pattern agent is present in spaces defined by the relief pattern of the conformable photomask. The conformable photomask is illuminated with electromagnetic radiation, and the pattern agent modulates the intensity of the electromagnetic radiation transmitted to the photoresist layer. As illustrated in FIG. 20, the conformable photomask is them removed and the photoresist layer is developed, thereby generating a pattern on the substrate surface defined by the optical thicknesses of pattern agent present between the photomask and substrate.

We claim:

1. A composite patterning device for generating a pattern on a substrate surface, said device comprising:
    a first polymer layer comprising a three-dimensional relief pattern having at least one contact surface disposed thereon, said first polymer layer having a low Young's modulus and having an internal surface opposite said contact surface; and
    a second polymer layer having an internal surface and an external surface; said second polymer layer having a high Young's modulus; wherein said first polymer layer and said second polymer layer are arranged such that a force applied to the external surface of said second polymer layer is transmitted to said first polymer layer;
wherein said composite patterning device is capable of establishing conformal contact between at least a portion of said contact surface of said first polymer layer and said substrate surface.

2. The device of claim 1 wherein said internal surface of said first polymer layer is in contact with said internal surface of said second polymer layer.

3. The device of claim 1 wherein said first polymer layer and said second polymer layer are connected by a connecting layer positioned between said internal surface of said first polymer layer and said internal surface of said second polymer layer.

4. The device of claim 1 wherein said connecting layer comprises a thin metal layer.

5. The device of claim 1 wherein said first polymer layer and said second polymer layer are arranged such that a force applied to the external surface of said second polymer layer is transmitted to at least a portion of the contact surface of said first polymer layer.

6. The device of claim 1 wherein said three-dimensional relief pattern has a plurality of contact surfaces.

7. The device of claim 6 wherein said contact surfaces are in substantially the same plane.

8. The device of claim 6 wherein at least a portion of said contact surfaces are in different planes.

9. The device of claim 1 wherein the thickness of said first polymer layer is selected from the range of about 1 micron to about 100 microns.

10. The device of claim 1 wherein the thickness of said first polymer layer is about 5 microns.

11. The device of claim 1 wherein the thickness of said second polymer layer is selected from the range of about 10 microns to about 100 microns.

12. The device of claim 1 wherein the thickness of said second polymer layer is about 25 microns.

13. The device of claim 1 wherein the ratio of the thickness of the first polymer layer and the thickness of the second polymer layer is selected from the range of about 1 to about 10.

14. The device of claim 1 wherein said second polymer layer has a Young's modulus selected from the range of about 1 GPa to about 10 GPa.

15. The device of claim 1 wherein said first polymer layer has a Young's modulus selected from the range of about 1 MPa to about 10 MPa.

16. The device of claim 1 wherein said first polymer layer has a Young's modulus of about 3 MPa.

17. The device of claim 1 wherein said first polymer layer, second layer or both further comprising a fiber material.

18. The device of claim 17 wherein said fiber material is selected from the group consisting of glass fiber, carbon fiber, metal fiber, a ceramic fiber and polymer fiber.

19. The device of claim 1 wherein said second polymer layer is selected from the group consisting of a thermoset layer, a polyimide, a thermoplastic layer and a composite polymer layer.

20. The device of claim 1 wherein said second polymer layer comprises a polymer having a coefficient of thermal expansion less than or equal to about 14.5 ppm.

21. The device of claim 1 wherein said first polymer layer is an elastomer layer.

22. The device of claim 1 wherein said first polymer layer comprises poly(dimethylsiloxane) or h-poly(dimethylsiloxane).

23. The device of claim 1 wherein said first polymer layer is a composite polymer layer.

24. The device of claim 1 further comprising a third polymer layer position between said first and second polymer layers, wherein said third polymer is a composite polymer layer comprising a fiber material.

25. The device of claim 1 wherein said composite patterning device has a flexural rigidity selected from the range of about $1 \times 10^{-7}$ Nm to about $1 \times 10^{-5}$ Nm.

26. The device of claim 1 wherein said relief pattern occupies an area selected from the range of about 10 $cm^2$ to about 260 $cm^2$.

27. The device of claim 1 wherein said relief pattern comprises a plurality of relief features exhibiting dimensions selected over the range of about 10,000 nanometers to about 50 nanometers.

28. The device of claim 1 wherein said relief pattern comprises a plurality of relief features exhibiting dimensions selected over the range of about 1000 nanometers to about 50 nanometers.

29. The device of claim 1 wherein said first polymer layer is a continuous, unitary layer.

30. The device of claim 1 wherein said first polymer layer is a discontinuous layer.

31. The device of claim 30 wherein said three-dimensional relief pattern comprises a plurality of independent relief features, wherein said independent relief features are in contact with said second polymer layer.

32. The device of claim 1 further comprising a third polymer layer having an internal surface and an external surface, wherein said first, second and third polymer layers are arranged such that a force applied to said external surface of said third polymer layer is transmitted to said first polymer layer.

33. The device of claim 32 wherein said internal surface of said third polymer layer is in contact with said external surface of said second polymer layer.

34. The device of claim 32 wherein said second polymer layer and said third polymer layer are connected by a connecting layer positioned between said external surface of said second polymer layer and said internal surface of said third polymer layer.

35. The device of claim 32 wherein said third polymer layer has a low Young's modulus.

36. The device of claim 32 wherein said third polymer layer has a Young's modulus selected from the range of about 1 MPa to about 10 MPa.

37. The device of claim 32 wherein the thickness of said third polymer layer is selected from the range of about 1 micron to about 100 microns.

38. The device of claim 32 wherein the thickness of the third polymer layer is within about 10% of the thickness of the first polymer layer.

39. The device of claim 32 wherein the thermal expansion coefficient of said first polymer layer is within about 10% of the thermal expansion coefficient of said third polymer layer.

40. The device of claim 32 wherein said third polymer layer is an elastomeric layer.

41. The device of claim 32 wherein said third polymer layer comprises poly(dimethylsiloxane) or h-poly(dimethylsiloxane).

42. The device of claim 32 wherein said third polymer layer comprises a means of evenly distributing an applied pressure to said contact surface.

43. The device of claim 32 further comprising a fourth layer having an internal surface and an external surface, wherein said first, second, third and fourth polymer layers are arranged such that a force applied to said external surface of said fourth polymer layer is transmitted to said first polymer layer.

44. The device of claim 43 wherein said internal surface of said fourth polymer layer is in contact with said external surface of said third polymer layer.

45. The device of claim 43 wherein said third polymer layer and said fourth polymer layer are connected by a connecting layer positioned between said external surface of said third polymer layer and said internal surface of said fourth polymer layer.

46. The device of claim 43 wherein said fourth polymer layer has a high Young's modulus.

47. The device of claim 43 wherein said fourth polymer layer has a Young's modulus selected from the range of about 1 GPa to about 10 GPa.

48. The device of claim 43 wherein thickness of said fourth polymer layer is selected from the range of about 10 microns to about 100 microns.

49. The device of claim 43 wherein the thickness of said fourth polymer layer is within about 10% of the thickness of said second polymer layer.

50. The device of claim 43 wherein the thermal expansion coefficient of said fourth polymer layer is within about 10% of the thermal expansion coefficient of said second polymer layer.

51. The device of claim 43 wherein said fourth layer comprises a material selected from the group consisting of:
a polymer;
a glass;
a ceramic; and
a metal.

52. The device of claim 1 further comprising an actuator connected to said external surface of said second polymer layer, wherein said actuator is capable of providing a force to said external surface of said second polymer layer.

53. The device of claim 32 further comprising an actuator connected to said external surface of said third polymer layer, wherein said actuator is capable of providing a force to said external surface of said third polymer layer.

54. The device of claim 43 further comprising an actuator connected to said external surface of said fourth polymer layer, wherein said actuator is capable of providing a force to said external surface of said fourth polymer layer.

55. The device of claim 1 comprising a stamp, a mold or a photomask.

56. The device of claim 1 wherein said composite patterning device transmits electromagnetic radiation in the ultraviolet region of the electromagnetic spectrum, the visible region of the electromagnetic spectrum or both the ultraviolet region and visible region of the electromagnetic spectrum.

57. The device of claim 1 wherein said composite patterning device transmits a pattern of electromagnetic radiation having a selected two dimensional spatial distribution of intensities.

58. The device of claim 1 wherein the composite patterning device has a net thermal expansion coefficient that is within 10% of the thermal expansion coefficient of said substrate.

59. A composite patterning device for generating a pattern on a substrate surface, said device comprising:
a first layer comprising a three-dimensional relief pattern having at least one contact surface disposed thereon, said first layer having a low Young's modulus and having an internal surface opposite said contact surface;
a second layer having an internal surface and an external surface; said second layer having a high Young's modulus; and
a third layer having an internal surface and an external surface;
wherein said first, second and third polymer layers are arranged such that a force applied to the external surface of said third polymer layer is transmitted to said first polymer layer; and
wherein the thicknesses and thermal expansion coefficients of said first and third layers are selected to provide a substantially symmetrical distribution of the coefficients of thermal expansion about the center of said patterning device along a layer alignment axis extending through said patterning device, and wherein said composite patterning device is capable of establishing conformal contact between at least a portion of said contact surface of said first layer and said substrate surface.

60. The device of claim 59 wherein said internal surface of said first layer is in contact with said internal surface of said second layer and wherein said external surface of said second layer is in contact with said internal surface of said third layer.

61. The device of claim 59 wherein said first polymer layer and said second polymer layer are connected by a connecting layer positioned between said internal surface of said first polymer layer and said internal surface of said second polymer layer and wherein said third polymer layer and said fourth polymer layer are connected by a connecting layer positioned between said external surface of said third polymer layer and said internal surface of said fourth polymer layer.

62. The device of claim 59 wherein said layer alignment axis is oriented orthogonal to a plane containing at least one contact surface.

63. A patterning device for generating a pattern on a substrate surface, said device comprising:
   an polymer layer comprising a three-dimensional relief pattern and a base, wherein said three-dimensional relief pattern has at least one contact surface disposed thereon, wherein said base has an external surface positioned opposite to said contact surface, wherein said contact surface is orthogonal to a layer alignment axis extending through said layer, and wherein the Young's modulus of said polymer layer varies continuously along said layer alignment axis from a said contact surface to said external surface.
wherein said patterning device is capable of establishing conformal contact between at least a portion of said contact surface and said substrate surface.

64. The device of claim 63 wherein the Young's modulus of said polymer layer varies continuously along said layer alignment axis from a low modulus value at said contact surface to a high modulus value at a mid point along said layer alignment axis between said contact surface and said external surface.

65. The device of claim 63 wherein the Young's modulus of said polymer layer varies continuously from said high modulus value at a mid point along said layer alignment axis to a low modulus value at said external surface.

66. The device of claim 63 wherein said polymer layer has a substantially symmetrical distribution of the coefficients of thermal expansion about the center of said patterning device along said layer alignment axis.

67. A method of generating a pattern on a substrate surface, said method comprising the steps of:
   providing a composite patterning device comprising:
      a first polymer layer comprising a three-dimensional relief pattern having at least one contact surface disposed thereon, said first polymer layer having a low Young's modulus and having a internal surface opposite said contact surface; and
      a second polymer layer having an internal surface and an external surface; said second polymer layer having a high Young's modulus; wherein said first polymer layer and said second polymer layer are arranged such that a force applied to the external surface of said second polymer layer is transmitted to said first polymer layer;
   depositing a transfer material onto said contact surface of said first polymer layer, thereby generating a layer of transfer material on the contact surface;
   contacting said composite patterning device and said substrate surface in a manner establishing conformal contact between at least a portion of said contact surface and said substrate surface, wherein said layer of transfer material is exposed to said substrate surface; and
   separating said composite patterning device and said substrate surface, thereby transferring at least a portion of said transfer material to said substrate surface and generating said pattern on said substrate surface.

68. The method of claim 67 wherein said depositing step comprises depositing said transfer material onto said contact surface via vapor deposition.

69. The method of claim 67 wherein said depositing step comprises depositing said transfer material onto said contact surface via sputtering deposition.

70. The method of claim 67 wherein said depositing step comprises depositing said transfer material onto said contact surface via bringing said contact surface into contact with a reservoir of said transfer material.

71. A method of generating a pattern on a substrate surface, said method comprising the steps of:
   providing a composite patterning device comprising:
      a first polymer layer comprising a three-dimensional relief pattern having at least one contact surface disposed thereon, said first polymer layer having a low Young's modulus and having a internal surface opposite said contact surface; and
      a second polymer layer having an internal surface and an external surface; said second polymer layer having a high Young's modulus; wherein said first polymer layer and said second polymer layer are arranged such that a force applied to the external surface of said second polymer layer is transmitted to said first polymer layer;
   contacting said composite patterning device and said substrate surface in a manner establishing conformal contact between at least a portion of said contact surface and said substrate surface, thereby generating a mold comprising the space separating said three-dimensional relief pattern and said substrate surface;
   introducing a transfer material into said mold; and
   separating said composite patterning device and said substrate surface, thereby generating said pattern on said substrate surface.

72. A method of generating a pattern on the surface of a substrate comprising a photosensitive material, said method comprising the steps of:
   providing a composite patterning device comprising:
      a first polymer layer comprising a three-dimensional relief pattern having at least one contact surface disposed thereon, said first polymer layer having a low Young's modulus and having a internal surface opposite said contact surface; and
      a second polymer layer having an internal surface and an external surface; said second polymer layer having a high Young's modulus; wherein said first polymer layer and said second polymer layer are arranged such that a force applied to the external surface of said second polymer layer is transmitted to said first polymer layer;
   contacting said composite patterning device and said surface of said substrate in a manner establishing conformal contact between at least a portion of said contact surface and said surface of said substrate; and
   directing electromagnetic radiation through said composite patterning device and onto said surface of said substrate, thereby generating a pattern of electromagnetic radiation having a selected two-dimensional distribution of intensities on said substrate surface; wherein interaction of said electromagnetic radiation and said radiation sensitive material generates chemically modified regions of said radiation sensitive material, thereby generating said pattern on said substrate surface.

73. The method of claim 72 further comprising the step of removing at least a portion of said chemically modified regions of said substrate.

74. The method of claim 72 further comprising the step of removing at least a portion of said substrate that is not chemically modified.

75. A method of making a composite patterning device, said method comprising the steps of:
providing a master relief pattern having a selected three-dimensional relief pattern;
contacting said master relief pattern with a prepolymer of a low modulus polymer;
contacting said prepolymer material with an high modulus polymer layer;
polymerizing said prepolymer, thereby generating a low modulus polymer layer in contact with said high modulus polymer layer and in contact with said master relief pattern; said low modulus polymer layer having a three-dimensional relief pattern; and
separating said low modulus polymer layer from said master relief pattern, thereby making said composite patterning device.

76. A fiber reinforced composite patterning device for generating a pattern on a substrate surface, said device comprising:
a first polymer layer comprising a three-dimensional relief pattern having at least one contact surface disposed thereon, said first polymer layer having a low Young's modulus and having an internal surface opposite said contact surface; and
a second polymer layer having an internal surface and an external surface; said second polymer layer comprising an array of fibers in a polymer, wherein said internal surface of said second polymer layer is in contact with said external surface of said first polymer layer;
a third polymer layer having an internal surface and an external surface; said third polymer layer comprising an mesh of fibers in a polymer, wherein said internal surface of said third polymer layer is in contact with said external surface of said second polymer layer;
a fourth polymer layer having an internal surface and an external surface; said fourth polymer layer comprising an mesh of fibers in a polymer, wherein said internal surface of said fourth polymer layer is in contact with said external surface of said third polymer layer;
a fifth polymer layer having an internal surface and an external surface; said fifth polymer layer comprising an array of fibers in a polymer, wherein said internal surface of said fifth polymer layer is in contact with said external surface of said fourth polymer layer;
wherein said composite patterning device is capable of establishing conformal contact between at least a portion of said contact surface of said first polymer layer and said substrate surface.

77. An alignment system for aligning a conformable patterning device and a substrate, said system comprising:
said conformable patterning device comprising a first polymer layer having a contact surface with a first alignment element, said first polymer layer having a low Young's modulus, said first alignment element comprising either a recessed region or a relief feature;
said substrate having an external surface; wherein said external surface comprises a second alignment element comprising either a recessed region or a relief feature that is complementary to said first alignment element;
a patterning agent present between said contact surface of said conformable patterning device and said external surface of said substrate;
wherein said contact surface is capable of establishing conformal contact with said external surface such that said first and second alignment features engage.

78. The system of claim 77 wherein said conformable patterning device further comprises additional relief features, recessed regions or both relief features and recessed regions, wherein conformal contact of said contact surface and said external surface generates spaces occupied by said patterning agent.

79. The system of claim 78 wherein said patterning agent absorbs, scatters or reflects electromagnetic radiation directed onto said conformable patterning device, thereby generating electromagnetic radiation having a selected two dimensional spatial distribution of intensities that is transmitted to said external surface.

80. The system of claim 77 wherein said patterning agent is a lubricant capable of lowering the friction between said contact surface and said external surface of said substrate.

81. The system of claim 77 wherein said first and second alignment elements are relief features or recessed regions having shapes selected from the group consisting of pyramidal, cylindrical, polygonal, triangular, rectangular, square, conical, trapezoidal and spherical.

82. The system of claim 77 wherein the conformable patterning device is a composite patterning device further comprising one or more additional polymer layers connected to said first polymer layer.

83. A method of aligning a conformable patterning device and a substrate, said method comprising:
providing said conformable patterning device comprising a first polymer layer having a contact surface with a first alignment element, said first polymer layer having a low Young's modulus, said first alignment element comprising either a recessed region or a relief feature;
providing said substrate having an external surface; wherein said external surface comprises a second alignment element comprising either a recessed region or a relief feature that is complementary to said first alignment element;
providing a patterning agent between said contact surface of said conformable patterning device and said external surface of said substrate; and
establishing conformal contact between said contact surface and said external surface such that said first and second alignment features engage.

84. The method of claim 83 wherein said patterning agent is a lubricant capable of lowering the friction between said contact surface and said external surface of said substrate.

* * * * *